(12) United States Patent
Ito

(10) Patent No.: US 7,598,802 B2
(45) Date of Patent: Oct. 6, 2009

(54) SEMICONDUCTOR INTEGRATED CIRCUIT APPARATUS AND ELECTRONIC APPARATUS

(75) Inventor: Minoru Ito, Shiga (JP)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 11/627,654

(22) Filed: Jan. 26, 2007

(65) Prior Publication Data
US 2007/0176673 A1 Aug. 2, 2007

(30) Foreign Application Priority Data
Feb. 1, 2006 (JP) ............................. 2006-025124

(51) Int. Cl.
G05F 3/08 (2006.01)
H03K 19/094 (2006.01)
H03K 19/0185 (2006.01)

(52) U.S. Cl. ....................... 327/581; 327/543; 327/546; 326/122

(58) Field of Classification Search ........................ None
See application file for complete search history.

(56) References Cited

U.S. PATENT DOCUMENTS

| | | | | |
|---|---|---|---|---|
| 5,274,601 | A | 12/1993 | Kawahara et al. | 365/230.06 |
| 5,486,774 | A | 1/1996 | Douseki et al. | 326/33 |
| 5,821,769 | A * | 10/1998 | Douseki | 326/34 |
| 5,929,687 | A * | 7/1999 | Yamauchi | 327/333 |
| 5,973,552 | A * | 10/1999 | Allan | 327/544 |
| 6,034,563 | A * | 3/2000 | Mashiko | 327/544 |
| 6,215,159 | B1 | 4/2001 | Fujita et al. | 257/369 |
| 6,329,874 | B1 * | 12/2001 | Ye et al. | 327/544 |
| 6,759,873 | B2 * | 7/2004 | Kang et al. | 326/81 |
| 6,850,094 | B2 * | 2/2005 | Yamaguchi | 326/121 |
| 6,864,708 | B2 * | 3/2005 | Takahashi et al. | 326/33 |
| 6,946,901 | B2 * | 9/2005 | Kang et al. | 327/544 |
| 6,985,026 | B2 * | 1/2006 | Toyoyama | 327/540 |

(Continued)

FOREIGN PATENT DOCUMENTS

JP 5-210976 8/1993

(Continued)

OTHER PUBLICATIONS

English Language Abstract of JP 6-029834.

(Continued)

Primary Examiner—Lincoln Donovan
Assistant Examiner—Terry L Englund
(74) Attorney, Agent, or Firm—Greenblum & Bernstein, P.L.C.

(57) ABSTRACT

A semiconductor integrated circuit apparatus and an electronic apparatus having a power control function configured from power control MOS transistors such that leakage current and on-resistance at the time of cut-off is sufficiently small in actual use. The semiconductor integrated circuit apparatus includes a CMOS logic circuit, a first pseudo power supply line connected to a high potential side power supply terminal of the CMOS logic circuit, a second pseudo power supply line connected to a low potential side power supply terminal of the CMOS logic circuit, and a power control NchMOS transistor connected across the second pseudo power supply line and a low potential side power supply line, with the substrate and gate of the power control NchMOS transistor being electrically connected. The gate and the substrate may also be connected via a current limiter utilizing a source follower of a depletion type NchMOS transistor.

15 Claims, 27 Drawing Sheets

U.S. PATENT DOCUMENTS

| | | | |
|---|---|---|---|
| 7,012,460 B2 * | 3/2006 | Fujimori | 327/530 |
| 2006/0186472 A1 | 8/2006 | Ito | 257/347 |
| 2007/0045744 A1 | 3/2007 | Ito | 257/355 |
| 2007/0063763 A1 * | 3/2007 | Yoo et al. | 327/544 |

FOREIGN PATENT DOCUMENTS

| | | |
|---|---|---|
| JP | 6-029834 | 2/1994 |
| JP | 8-321763 | 12/1996 |
| JP | 10-270993 | 10/1998 |

OTHER PUBLICATIONS

English Language Abstract of JP 5-210976.
English Language Abstract of JP 8-321763.
English Language Abstract of JP 10-270993.
U.S. Appl. No. 11/549,209 (Ito), filed Oct. 13, 2006.
U.S. Appl. No. 11/553,145 (Ito), filed Oct. 26, 2006.

* cited by examiner

SEMICONDUCTOR INTEGRATED CIRCUIT APPARATUS AND ELECTRONIC APPARATUS

BACKGROUND OF THE INVENTION

1. Field of the Invention

The present invention relates to a semiconductor integrated circuit apparatus and an electronic apparatus having a power control function for improving current supply performance of a power control transistor at the time of operation and reducing leakage current at the time of standby.

2. Description of Related Art

Conventionally, methods for employing an MT-CMOS circuit (Multi Threshold-CMOS circuit) are well known as methods for implementing low power consumption of a semiconductor integrated circuit.

FIG. 1 shows a circuit configuration for an MT-CMOS circuit of the related art. An MT-CMOS circuit of the related art is configured from a CMOS logic circuit, and one or both of a power control PchMOS transistor connected across a pseudo power supply line connected to a power supply terminal of the CMOS logic circuit and a high potential side power supply line ($V_{DD}$), and a power control NchMOS transistor connected across a further pseudo power supply line connected to a power supply terminal of the CMOS logic circuit and a low potential power supply line ($V_{SS}$).

Further, at the CMOS logic circuit, absolute values of threshold voltages for a PchMOS transistor and an NchMOS transistor for carrying out high-speed operation is set to be small. However, the low threshold voltage MOS transistor has a problem that a large leakage current occurs in a standby state. As a result, a method is disclosed (see, Document 1: Japanese Patent Application Laid-Open No. HEI 6-29834 and Document 2: Japanese Patent Application Laid-Open No. HEI 5-210976) where the absolute values of the threshold voltages of a power control PchMOS transistor and a power control NchMOS transistor are set to be high so that leakage current at the time of standby can be reduced.

Further, to lower on resistance of the power control PchMOS transistor or the power control NchMOS transistor shown in FIG. 1, as shown in FIG. 2, a method is disclosed where a gate voltage lower than $V_{SS}$ is applied to a high threshold voltage PchMOS transistor. Similarly, it is also possible to lower on resistance by applying a gate voltage higher than $V_{DD}$ to a high threshold voltage NchMOS transistor (see, Document 3: Japanese Patent Application Laid-Open No. HEI 8-321763 and Document 4: Japanese Patent Application Laid-Open No. HEI 10-270993).

Moreover, as shown in FIG. 3, rather than using a high threshold voltage PchMOS transistor, it is also possible to use a power control PchMOS transistor with the same threshold voltage as the internal logic circuit, namely use a power control PchMOS transistor having a low threshold voltage. Namely, a method is disclosed where leakage current is reduced by applying a positive voltage across a gate and source. (see the above Document 3 and Document 4).

In FIG. 4, in addition to FIG. 3, on resistance is made further smaller by applying a voltage lower than $V_{SS}$ to the gate (see Document 3).

Further, recently, as shown in FIG. 5, technology is disclosed where it is ensured that excessive voltages are not applied across the gate and drain of the power control MOS transistor (see the above Document 4).

However, with conventional semiconductor integrated circuit apparatus, there are following problems.

With the apparatus disclosed in the above Document 1 and Document 2, a high threshold voltage power control MOS transistor so that it is difficult to set on resistance of a power control MOS transistor to be low. For example, when channel width of a MOS transistor is made large, the on resistance falls, but transistor size becomes large, and chip size of the integrated circuit also becomes large.

It has been proposed to lower on resistance using a method of applying a voltage exceeding the power supply voltage across the gate and source as shown in FIG. 2, using a method of employing a power control MOS transistor having the same threshold voltage as the internal circuit as shown in FIG. 3, or by combinations of these methods. However, it is extremely desirable for on resistance of a power control MOS transistor to be lowered in accompaniment with integrated circuit scale increasing more and more.

Further, with a circuit suppressing the voltage applied across the gate and drain shown in FIG. 5, two power control MOS transistors are connected in series, which results in a problem that the on resistance is two times that of the case of one power control MOS transistor.

Namely, how to keep low leakage current at the time of cut-off of a power control MOS transistor and lower on resistance is lowered is a substantial problem.

SUMMARY OF THE INVENTION

It is therefore an object of the present invention to provide a semiconductor integrated circuit apparatus and an electronic apparatus having a power control function configured from power control MOS transistors in such a manner that leakage current and on resistance at the time of cut-off is sufficiently small in actual use.

According to an aspect of the invention, a semiconductor integrated circuit apparatus comprises a logic circuit having a plurality of NchMIS transistors and a plurality of PchMIS transistors, a first pseudo power supply line connected to a high potential side power supply terminal section of the logic circuit, a second pseudo power supply line connected to a low potential side power supply terminal section of the logic circuit, and a first NchMIS transistor having a threshold voltage smaller than an absolute value of a threshold voltage of the MIS transistors of the logic circuit, or a depletion type first NchMIS transistor. The second pseudo power supply line is connected to a drain of the first NchMIS transistor, a low potential side power supply line is connected to a source, and a voltage where a low level is a lower voltage than a potential of the low potential side power supply line and where a high level is a voltage higher than the potential of the low potential side power supply line is applied to a gate.

According to a further aspect of the invention, semiconductor integrated circuit apparatus comprises a logic circuit having a plurality of NchMIS transistors and a plurality of PchMIS transistors, a first pseudo power supply line connected to a high potential side power supply terminal section of the logic circuit, a second pseudo power supply line connected to a low potential side power supply terminal section of the logic circuit, and a first NchMIS transistor. The second pseudo power supply line is connected to a drain of the first NchMIS transistor, a low potential side power supply line is connected to a source, and a gate and substrate are electrically connected.

According to a still further aspect of the invention, a semiconductor integrated circuit apparatus comprises a logic circuit having a plurality of NchMIS transistors and a plurality of PchMIS transistors, a first pseudo power supply line connected to a high potential side power supply terminal section of the logic circuit, a second pseudo power supply line connected to a low potential side power supply terminal section of the logic circuit, and a first PchMIS transistor having a threshold voltage smaller than an absolute value of a threshold voltage of the MIS transistors of the logic circuit, or a depletion type first NchMIS transistor. The first pseudo power supply line is connected to a drain of the second PchMIS transistor, a high potential side power supply line is connected to a source, and a voltage where a high level is a voltage higher than the potential of the high potential side power supply line and where a low level is a voltage lower than the potential of the high potential side power supply line is applied to the gate.

According to another aspect of the invention, an electronic apparatus comprises a semiconductor integrated circuit apparatus having a power supply apparatus and a power control function of the power supply apparatus, where the semiconductor integrated circuit apparatus is the semiconductor integrated circuit apparatus of the first aspect.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DESCRIPTION OF THE PREFERRED EMBODIMENTS

Now, embodiments of the present invention employing MOS (Metal Oxide Semiconductor) transistors that are typical examples of MIS (Metal Insulated Semiconductor) transistors will be described in detail with reference to the accompanying drawings.

Embodiment 1

Figure 1:
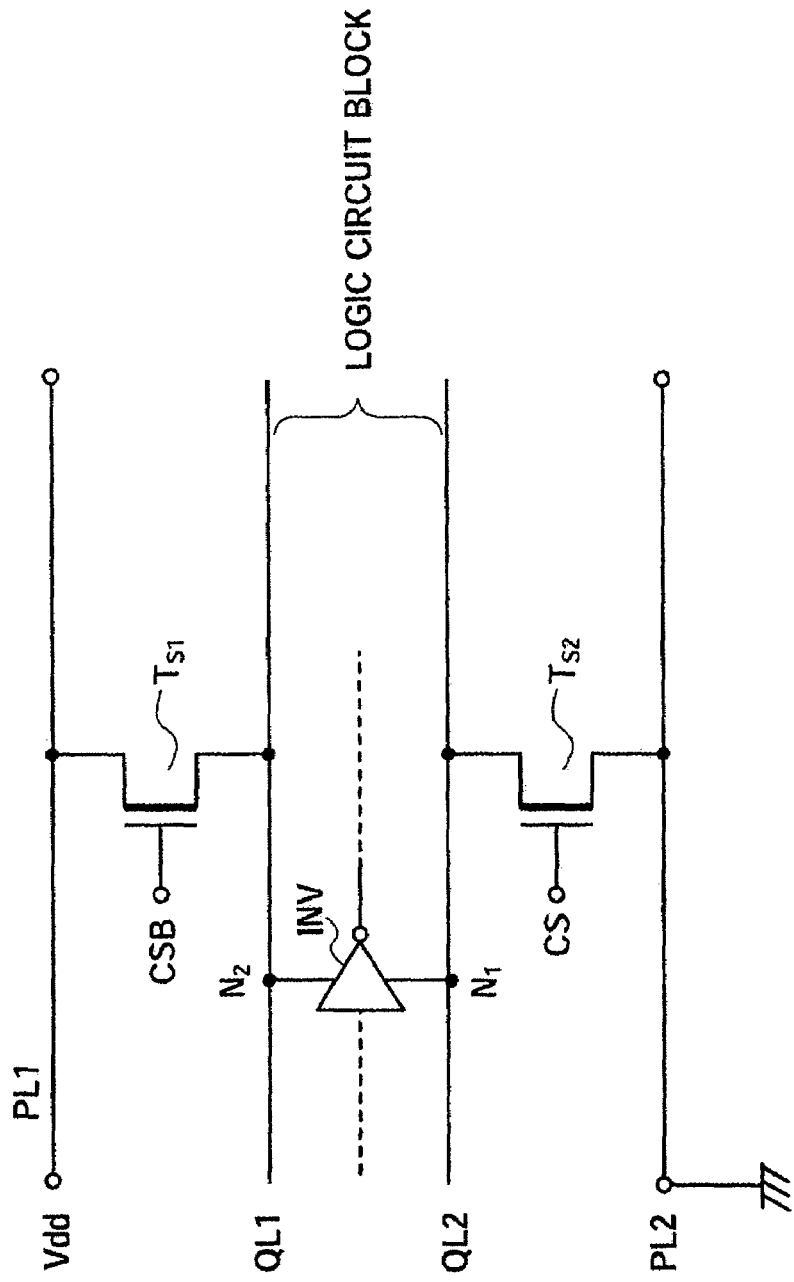
FIG. 1 shows a configuration for a semiconductor integrated circuit apparatus having a power control function of the related art.
Figure 2:
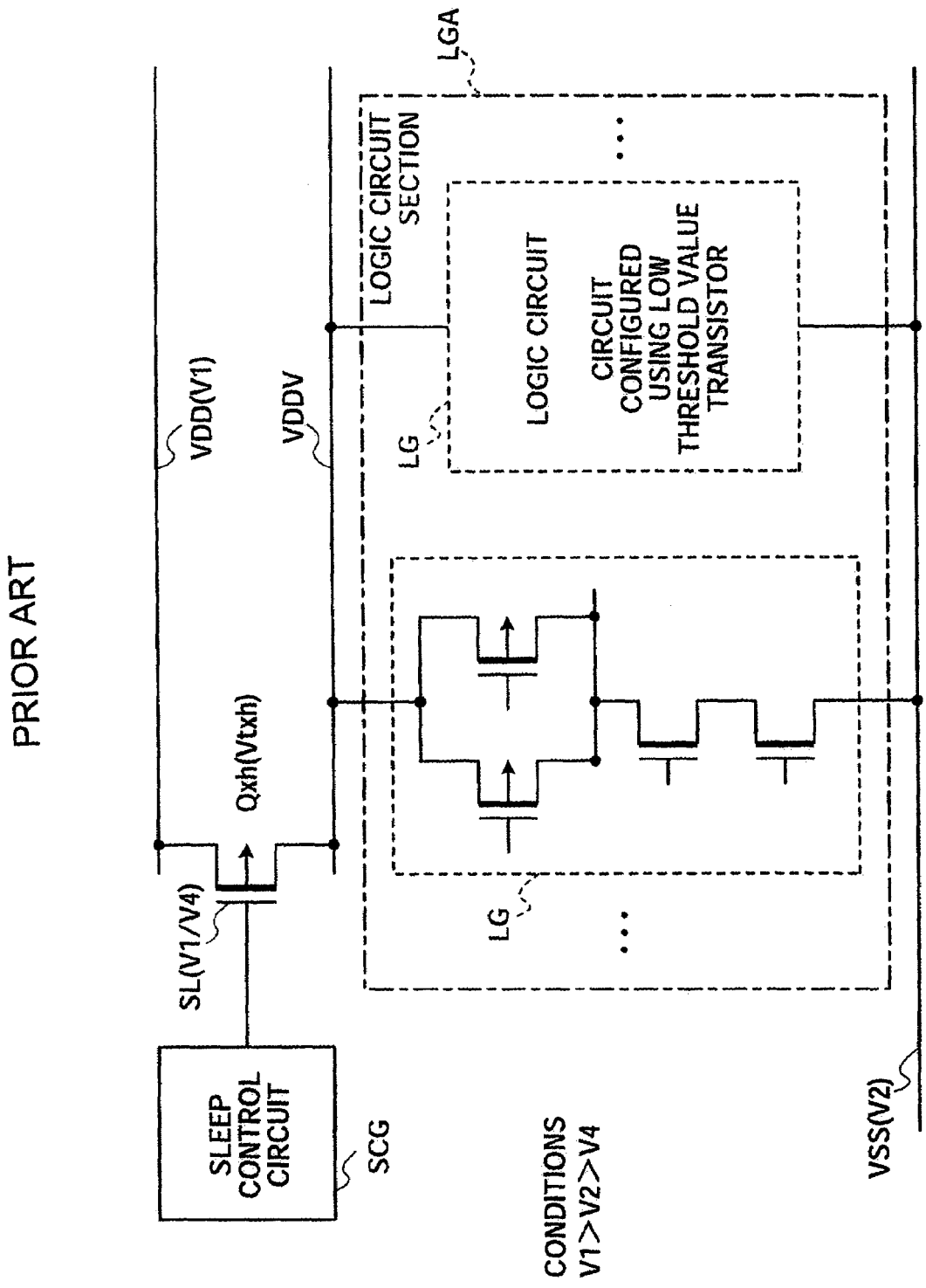
FIG. 2 shows a configuration for a semiconductor integrated circuit apparatus having a power control function of the related art.
Figure 3:
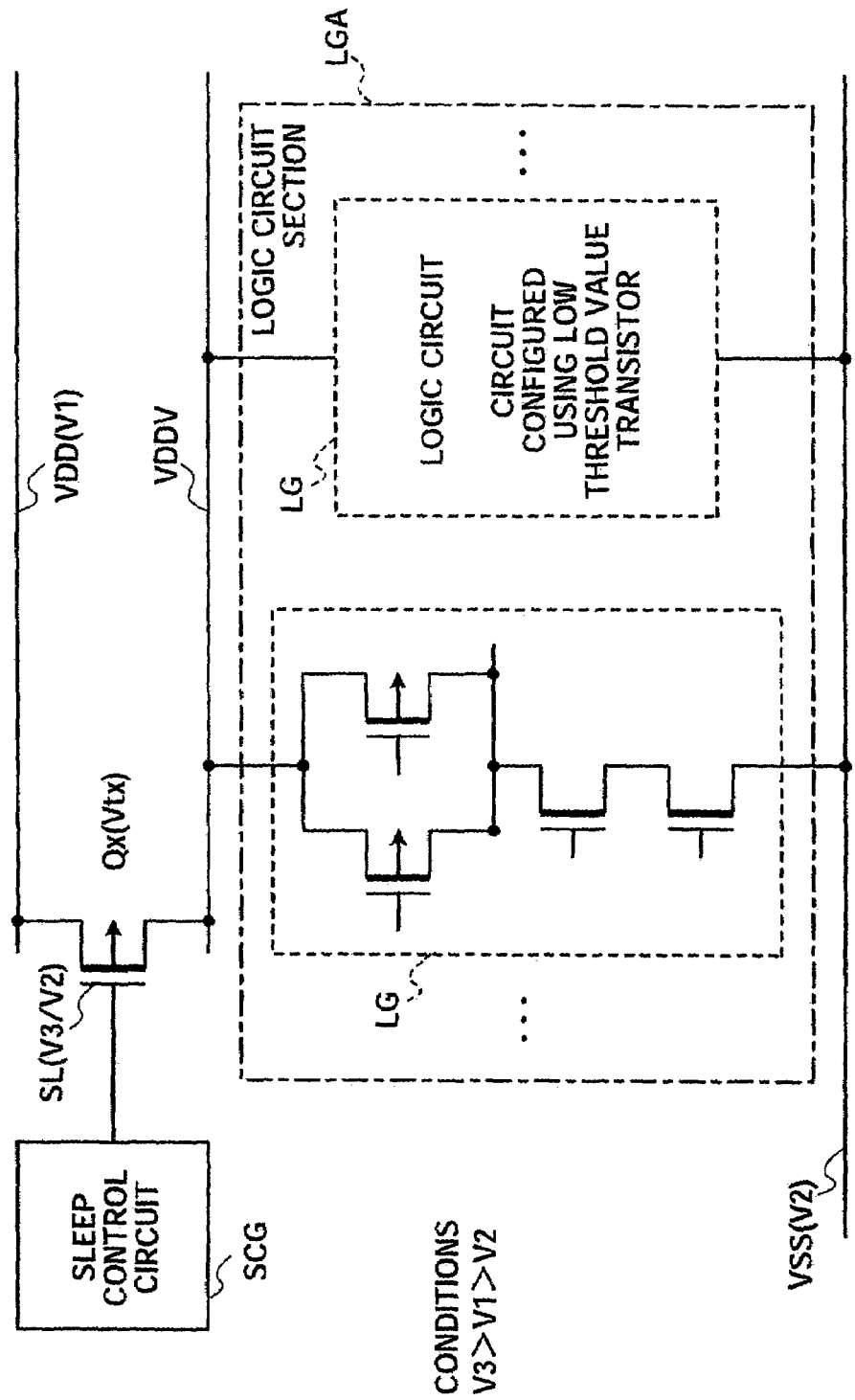
FIG. 3 shows a configuration for a semiconductor integrated circuit apparatus having a power control function of the related art.
Figure 4:
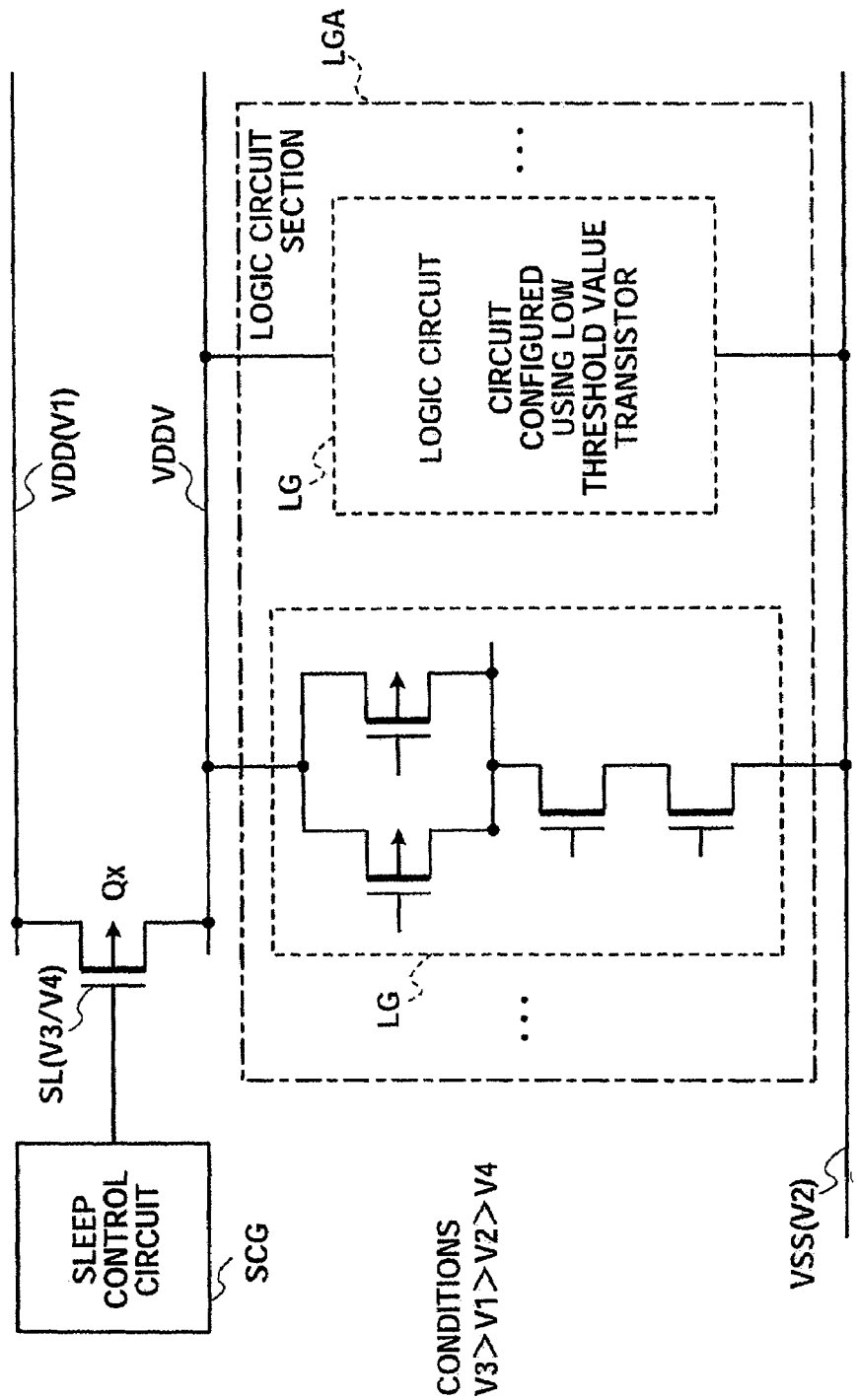
FIG. 4 shows a configuration for a semiconductor integrated circuit apparatus having a power control function of the related art.
Figure 5:
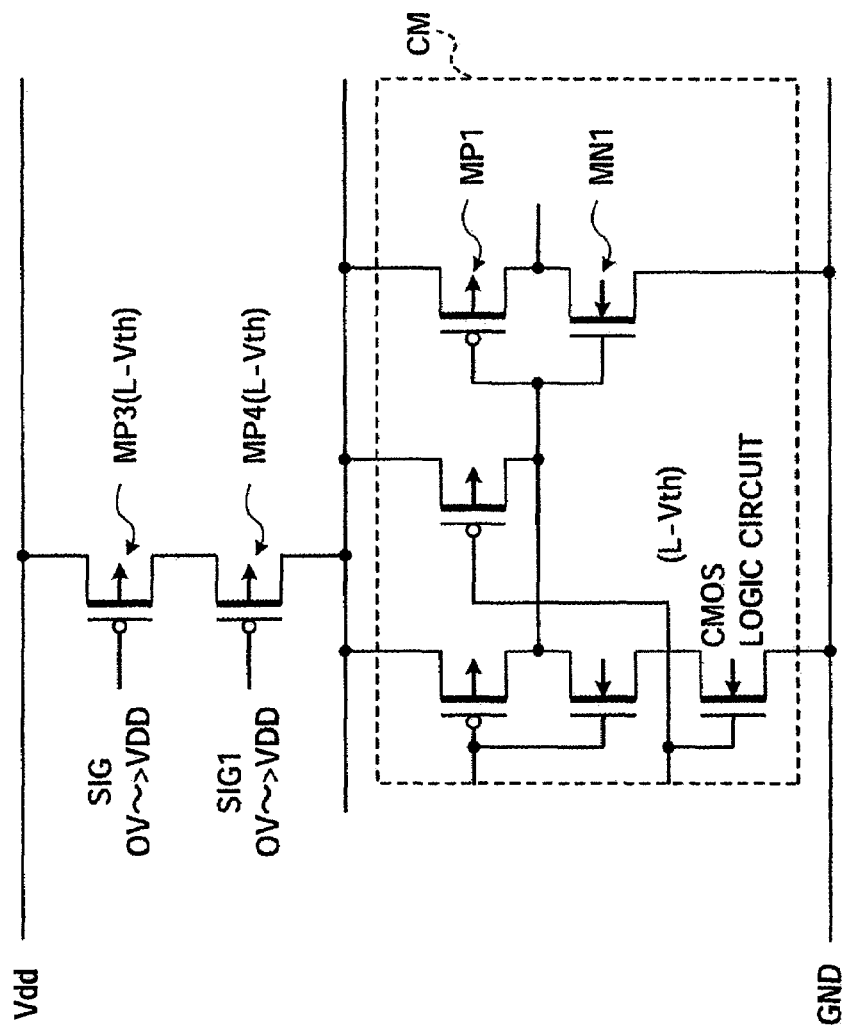
FIG. 5 shows a configuration for a semiconductor integrated circuit apparatus having a power control function of the related art.
Figure 6:
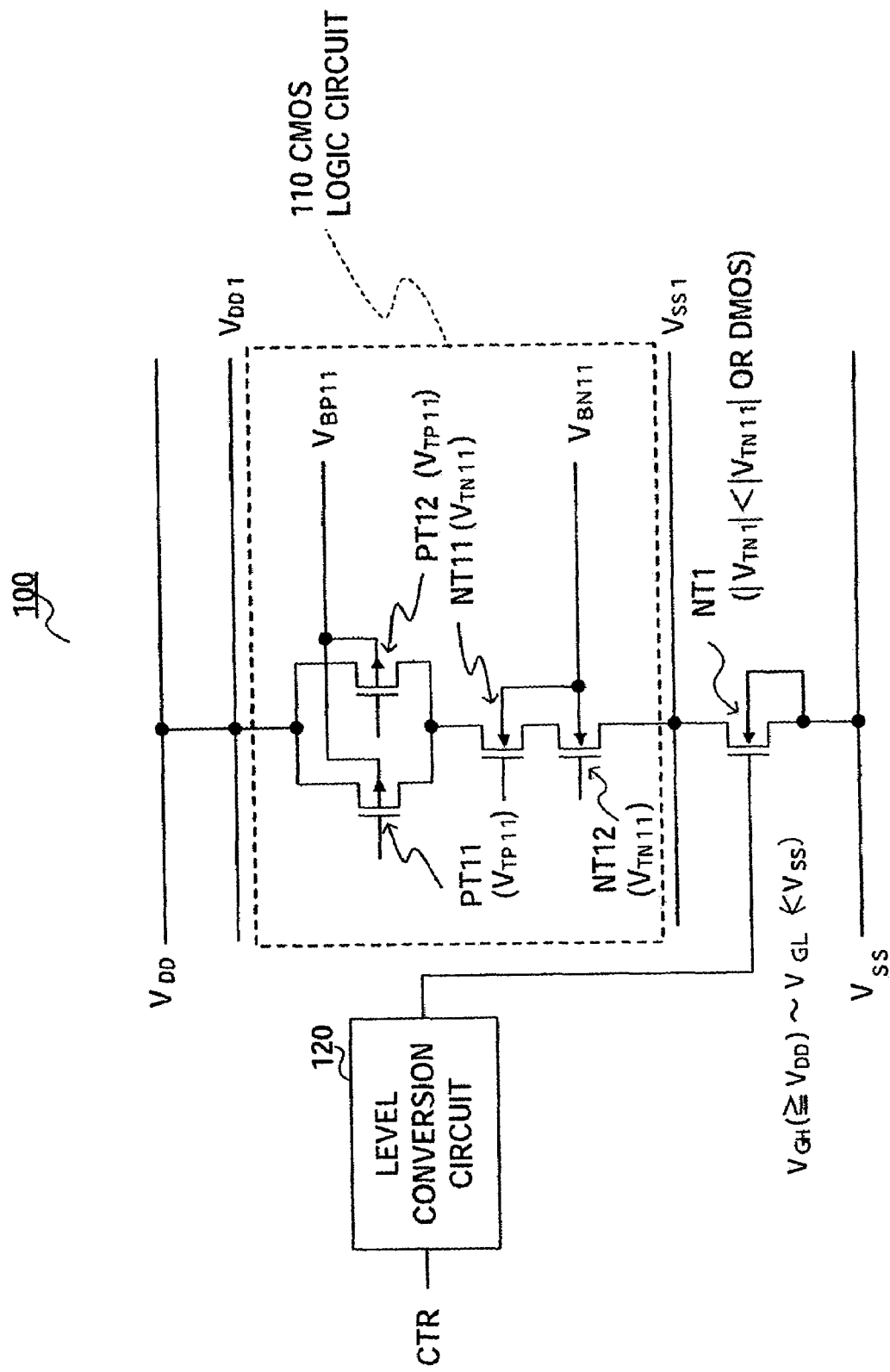
FIG. 6 is a circuit diagram showing a configuration for a semiconductor integrated circuit apparatus having a power control function according to Embodiment 1 of the present invention.

FIG. 6 is a circuit diagram showing a configuration for a semiconductor integrated circuit apparatus having a power control function according to Embodiment 1 of the present invention. This embodiment is an example applied to a semiconductor integrated circuit apparatus equipped with a CMOS logic circuit, power control NchMOS transistor, and a level conversion circuit.

In FIG. 6, semiconductor integrated circuit apparatus 100 is comprised of CMOS logic circuit 110, first pseudo power supply line $V_{DD1}$ connected to a high potential side power supply terminal section of CMOS logic circuit 110, second pseudo power supply line $V_{ss1}$ connected to a low potential side power supply terminal section of CMOS logic circuit 110, power control NchMOS transistor NT1 (first NchMIS transistor) connected across second pseudo power supply line $V_{SS1}$ and low potential side power supply line $V_{SS}$ and level conversion circuit 120 for converting a signal voltage level applied to a gate of power control NchMOS transistor NT1.

CMOS logic circuit 110 is comprised of a plurality of NchMOS transistors NT11 and NT12 having a first threshold voltage and a plurality of PchMOS transistors PT11 and PT12 having a second threshold voltage. CMOS logic circuit 110 is functionally constituted by combinations of NAND circuits, AND circuits, NOR circuits, and OR circuits etc., and the first and second threshold voltages are set to be appropriate values according to the operating frequency and the power supply voltage. Generally, absolute values of the first and second threshold voltages are set to be small values to cause high-speed operation at a low power supply voltage.

The high potential side power supply terminal section of CMOS logic circuit 110 is connected to first pseudo power supply line $V_{DD1}$, and the low potential side power supply terminal section is connected to second pseudo power supply line $V_{SS1}$.

The absolute value of the threshold voltage of power control NchMOS transistor NT1 is set to be smaller than the absolute value of the first threshold voltage of the plurality of NchMOS transistors NT11 and NT12 constituting CMOS logic circuit 110 or power control NchMOS transistor NT1 is set to be a depletion type. Namely, power control NchMOS transistor NT1 is a first NchMIS transistor having a third threshold voltage.

Power control NchMOS transistor NT1 has a drain connected to second pseudo power supply line $V_{SS1}$ and a source and substrate connected to low potential side power supply line $V_{SS}$. Further, a voltage lower than the potential of low potential side power supply line $V_{SS}$ is applied to the gate of power control NchMOS transistor NT1 as a low level, and a voltage that is the same or higher than potential of high potential side power supply line $V_{DD}$ is applied as a high level.

A high level applied to a gate of power control NchMOS transistor NT1 is decided by the threshold voltage of this NchMOS transistor NT1 and a set value for on resistance, and is by no means limited to be a voltage that is the same or higher than the potential of high potential side power supply line $V_{DD}$, and may also be a voltage lower than the potential of high potential side power supply line $V_{DD}$.

Level conversion circuit 120 receives control input signal CTR, converts a signal voltage level, and outputs a high level signal and a low level signal applied to the gate of power control NchMOS transistor NT1.

A description is now given of the operation of semiconductor integrated circuit apparatus 100 of the configuration described above.

Semiconductor integrated circuit apparatus 100 according to Embodiment 1 is such that an absolute value of the threshold voltage of power control NchMOS transistor NT1 is made to be smaller than an absolute value of a first threshold voltage of NchMOS transistors NT11 and NT12 of CMOS logic circuit 110, or power control NchMOS transistor NT1 is made a depletion type, a voltage lower than the potential of low potential side power supply line $V_{SS}$ is applied to the gate as a low level, and a voltage that is greater than or equal to the high potential side power supply line $V_{DD}$ is applied as a high level.

For example, CMOS logic circuit 110 is configured from an NchMOS transistor of a threshold voltage of 0.2V and a PchMOS transistor of a threshold voltage of –0.2V. Further, the threshold voltage of power control NchMOS transistor NT1 is taken to be –0.1V (namely, depletion type). Moreover, low potential side power supply line $V_{SS}$ is taken to be 0V, and high potential side power supply line $V_{DD}$ is taken to be 0.5V that is a minimum operating voltage of CMOS logic circuit 110. A voltage applied to a gate of power control NchMOS transistor NT1 via level conversion circuit 120 is taken to be a low level of, rather than 0V, a negative voltage of, for example, –0.5V, and a high level of 0.5V that is the same voltage as the high potential side power supply line $V_{DD}$.

Here, considering the leakage current of power control NchMOS transistor NT1 in a standby state, even if, for example, power control NchMOS transistor NT1 is a depletion type NchMOS transistor, a voltage applied across a gate and source is a sufficiently large negative voltage of –0.5V, and it is therefore possible to put power control NchMOS transistor NT1 into a cut-off state suppressing leakage current.

Next, on resistance of a power control NchMOS transistor NT1 at the time of operation is compared with a related art example.

In the related art example, threshold voltage of power control NchMOS transistor NT1 is taken to be 0.2V, a high level for gate voltage applied to power control NchMOS transistor NT1 is taken be 0.5V, and a low level is taken to be –0.2V.

On resistance of power control NchMOS transistor NT1 is inversely proportional to $(V_{GS}-V_T)$, and the relationship shown in the following equation (1) is satisfied. Here, $V_{GS}$ is gate/source voltage, and $V_T$ is threshold voltage.

On resistance of MOS Tr of Embodiment 1 and on resistance of MOS Tr of the related art example:

$$=(0.5-0.2)/(0.5-(-0.1))$$

$$=0.5 \qquad (1)$$

Namely, on resistance of power control NchMOS transistor NT1 of Embodiment 1 is half of the on resistance of power control NchMOS transistor NT1 of the related art example, and it is possible to increase the current supply performance to CMOS logic circuit 110 at the time of operation. In other words, if the on resistance is in the order of the same as the related art, it is possible to reduce the surface area of power control MOS transistor NT1 by approximately half.

As described above, according to this embodiment, semiconductor integrated circuit apparatus 100 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control NchMOS transistor NT1 connected across second pseudo power supply line $V_{SS1}$ and low potential side power supply line $V_{SS}$, and level conversion circuit 120 for converting a signal voltage level applied to a gate of power control NchMOS transistor NT1. The absolute value of the threshold voltage of power control NchMOS transistor NT1 is made to be smaller than the absolute value of the threshold voltage of NchMOS transistors NT11 and NT12 of CMOS logic circuit 110, or power control NchMOS transistor NT1 is made to be a deposition type, a voltage lower than the potential of low potential side power supply line $V_{SS}$ is applied to a gate as a low level, and a voltage greater than or equal to high potential side power supply line $V_{DD}$ is applied as a high level. It is therefore possible to reduce on resistance while suppressing leakage current.

In this way, it is possible to substantially reduce on resistance from that of the related art while suppressing leakage current at the time of cut-off of a power control MOS transistor. Therefore, not only is current supplied to CMOS logic circuit 110 in a stable manner, but also it is possible to reduce the size of power control MOS transistor NT1, and it is possible to effectively reduce power consumed by semiconductor integrated circuit 100 and reduce chip size. As a result, it is possible to implement both low power consumption and minitualization of the chip for the semiconductor integrated circuit at the same time.

Embodiment 2

Embodiment 2 is an example applied to a semiconductor integrated circuit apparatus employing a power control PchMOS transistor.

Figure 7:
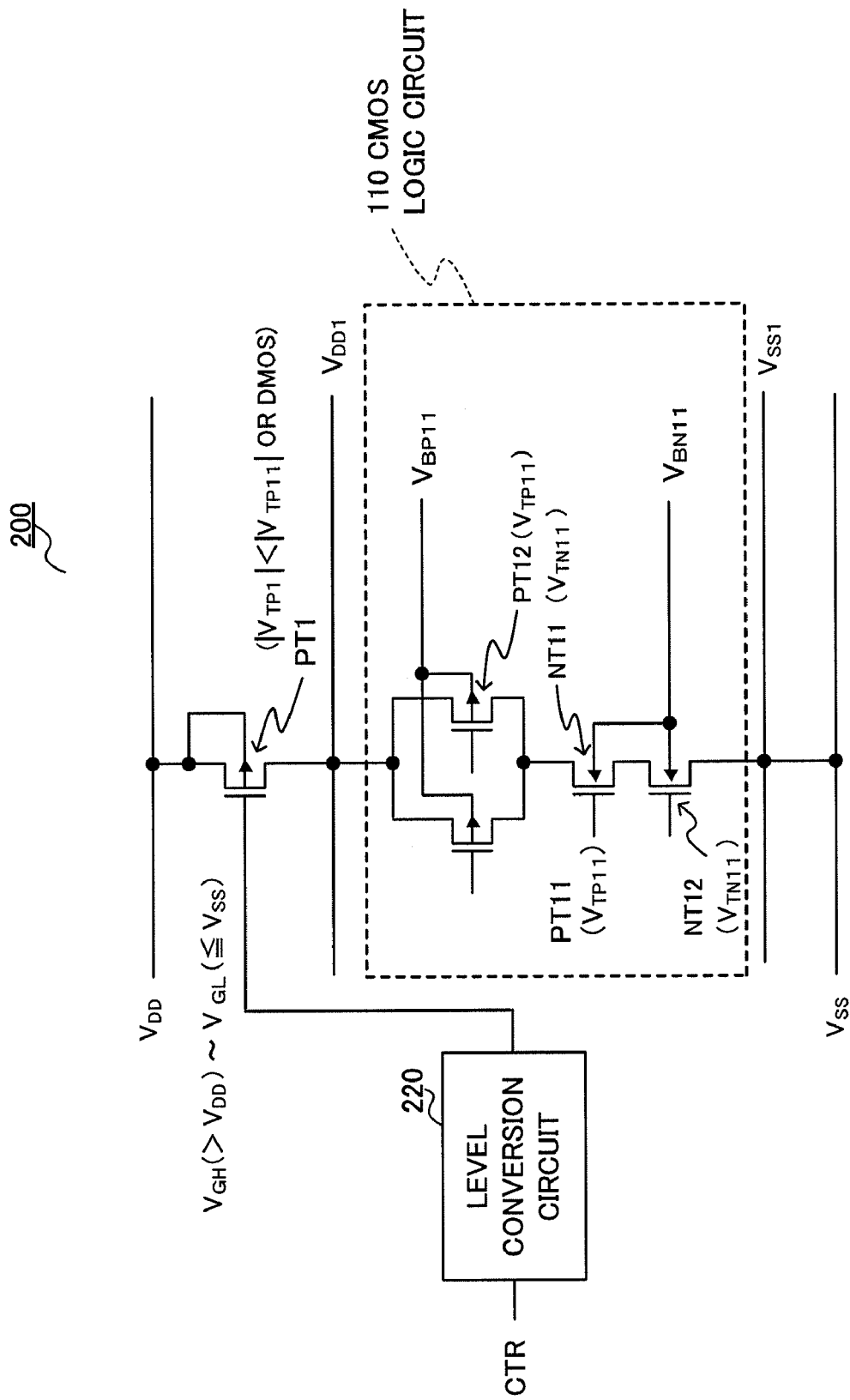
FIG. 7 is a circuit diagram showing a configuration for a semiconductor integrated circuit apparatus having a power control function according to Embodiment 2 of the present invention.

FIG. 7 is a circuit diagram showing a configuration for a semiconductor integrated circuit apparatus having a power control function according to Embodiment 2 of the present invention. This embodiment is an example applied to a semiconductor integrated circuit apparatus equipped with a CMOS logic circuit, power control PchMOS transistor, and a level conversion circuit. Portions with the same configuration as for FIG. 6 are given the same numerals and are not described.

In FIG. 7, semiconductor integrated circuit apparatus 200 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control PchMOS transistor PT1 (first PchMIS transistor) connected across high potential side power supply line $V_{DD}$ and first pseudo power supply line $V_{DD1}$, and level conversion circuit 220 for converting a signal voltage level applied to a gate of power control PchMOS transistor PT1 (first NchMIS transistor).

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage.

The high potential side power supply terminal section of CMOS logic circuit 110 is connected to first pseudo power supply line $V_{DD1}$, and the low potential side power supply terminal section is connected to second pseudo power supply line $V_{SS1}$.

The absolute value of the threshold voltage of power control PchMOS transistor PT1 is set to be smaller than the absolute value of the second threshold voltage of the plurality of PchMOS transistors PT11 and PT12 constituting CMOS logic circuit 110 or power control PchMOS transistor PT1 is set to be a depletion type.

Power control PchMOS transistor PT1 has a drain connected to first pseudo power supply line $V_{DD1}$ and a source and substrate connected to high potential side power supply line $V_{DD}$. Further, a voltage higher than the potential of high potential side power supply line $V_{DD}$ is applied to the gate of power control PchMOS transistor PT1 as a high level, and a voltage that is the same or lower than potential of low potential side power supply line $V_{SS}$ is applied as a low level.

A low level applied to a gate of power control PchMOS transistor PT1 is decided by the threshold voltage of this PchMOS transistor PT1 and a value set for on resistance, and is by no means limited to be a voltage that is the same or lower than the potential of low potential side power supply line $V_{SS}$, and may also be a voltage higher than the potential of low potential side power supply line $V_{SS}$.

Level conversion circuit 220 receives control input signal CTR, converts a signal voltage level, and outputs a high level signal and a low level signal applied to the gate of power control PchMOS transistor PT1.

A description is now given of the operation of semiconductor integrated circuit apparatus 200 of the configuration described above.

Semiconductor integrated circuit apparatus 200 according to Embodiment 2 is such that an absolute value of the threshold voltage of power control PchMOS transistor PT1 is made to be smaller than an absolute value of a second threshold voltage of PchMOS transistors PT11 and PT12 of CMOS logic circuit 110, or power control PchMOS transistor PT1 is made to be a depletion type, a voltage higher than the potential of high potential side power supply line $V_{DD}$ is applied to the gate as a high level, and a voltage that is the same or lower than the potential of low potential side power supply line $V_{SS}$ is applied as a low level.

For example, CMOS logic circuit 110 is configured from an NchMOS transistor of a threshold voltage of 0.2V and a PchMOS transistor of a threshold voltage of −0.2V. Further, the threshold voltage of power control PchMOS transistor PT1 is taken to be 0.1V (depletion type). Further, low potential side power supply line $V_{SS}$ is taken to be 0V, and $V_{DD}$ is taken to 0.5V that is a minimum operating voltage of CMOS logic circuit. A voltage applied to a gate of power control PchMOS transistor PT1 via level conversion circuit 220 is taken to be a high level of, for example, 1.0V, higher than the high potential side power supply line $V_{DD}$, and a low level of 0V that is the same voltage as low potential side power supply line $V_{SS}$.

As in Embodiment 1, leakage current of power control PchMOS transistor PT1 at the time of standby applies a sufficiently large positive voltage of 0.5V across the gate and source of power control PchMOS transistor PT1, and power control PchMOS transistor PT1 enters a cut-off state suppressing leakage current.

Further, as in Embodiment 1, in the case as in the related art where the threshold voltage of PT1 is taken to be −0.2V, a high level for gate voltage applied to PT1 is taken to be 0.7V, and a low level is taken to be 0V, the on resistance of power control PchMOS transistor PT1 at the time of operation becomes half the on resistance of the power control PchMOS transistor of the related art example. It is therefore possible to increase the current supply performance to CMOS logic circuit 110 at the time of operation. In other words, if the on resistance is in the order of the same as the related art, it is possible to reduce the surface area of power control PchMOS transistor PT1 by approximately half.

As described above, according to this embodiment, semiconductor integrated circuit apparatus 200 is such that the absolute value of the threshold voltage of power control PchMOS transistor PT1 is made to be smaller than the absolute value of the second threshold voltages of PchMOS transistors PT11 and PT12 of CMOS logic circuit 110, or power control PchMOS transistor PT1 is made to be a deposition type, a voltage higher than the potential of high potential side power supply line $V_{DD}$ is applied as a high level of a gate voltage, and a voltage that is the same or lower than the potential of low potential side power supply line $V_{SS}$ is applied as a low level. It is therefore possible to lower on resistance while suppressing leakage current, in the same way as for Embodiment 1. As a result, it is possible to implement both low power consumption and miniturization of the chip for the semiconductor integrated circuit at the same time.

The above embodiment 1 is an Nch side semiconductor integrated circuit apparatus, and this embodiment is a so-called reverse structure Pch side semiconductor integrated circuit apparatus. This is more effective in reducing on resistance of the power control MOS transistor from that of Embodiment 1 inputted to the Nch side. However, depending on the case, structures where it is also necessary to introduce this at the Pch side are also common as in this embodiment. In the following description, a semiconductor integrated circuit apparatus having a power control function for the Nch side and Pch side respectively will be described.

Embodiment 3

Embodiment 3 is an example applied to a semiconductor integrated circuit apparatus using power control NchMOS transistor NT2 electrically connected to the gate and the substrate.

Figure 8:
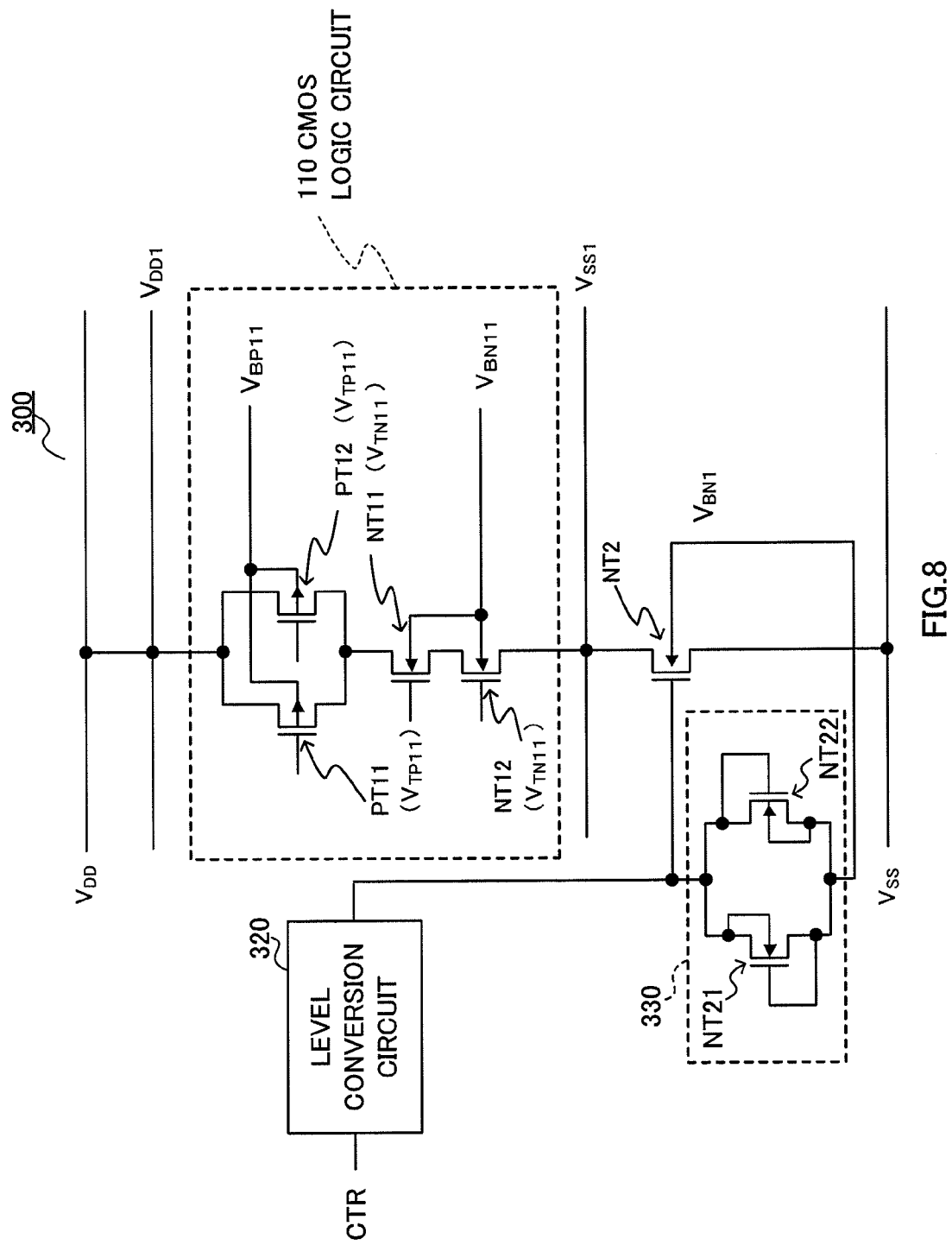
FIG. 8 is a circuit diagram showing a configuration for a semiconductor integrated circuit apparatus having a power control function according to Embodiment 3 of the present invention.

FIG. 8 is a circuit diagram showing a configuration for a semiconductor integrated circuit apparatus having a power control function according to Embodiment 3 of the present invention. This embodiment is an example applied to a semiconductor integrated circuit apparatus equipped with a CMOS logic circuit, power control NchMOS transistor NT2, and a level conversion circuit. Portions with the same configuration as for FIG. 6 are given the same numerals and are not described.

In FIG. 8, semiconductor integrated circuit apparatus 300 is comprised of CMOS logic circuit 110, first pseudo power supply line $V_{DD1}$ connected to a high potential side power supply terminal section of CMOS logic circuit 110, a second pseudo power supply line $V_{SS1}$ connected to a low potential side power supply terminal section of CMOS logic circuit 110, power control NchMOS transistor NT2 (first NchMIS transistor) connected across second pseudo power supply line $V_{SS1}$ and low potential side power supply line $V_{SS}$, level conversion circuit 320 for converting a signal voltage level applied to the gate of power control NchMOS transistor NT2, and current limiter 330 utilizing a source follower due to depletion type NchMOS transistors NT21 and NT22.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage.

The high potential side power supply terminal section of CMOS logic circuit 110 is connected to first pseudo power supply line $V_{DD1}$, and low potential side power supply terminal section is connected to second pseudo power supply line $V_{SS1}$.

Power control NchMOS transistor NT2 adopts a configuration where a drain is connected to second pseudo power supply line $V_{SS1}$, a source is connected to low potential side power supply line $V_{SS}$, and a substrate and gate are electrically connected. The gate and the substrate may also, for example, be connected via current limiter 330 utilizing, for example, a source follower of a depletion type NchMOS transistor. Power control NchMOS transistor NT1 of FIG. 6 differs from the point that the substrate and gate are electrically connected.

The absolute value of the threshold voltage of power control NchMOS transistor NT2 may be made larger than the absolute value of the first threshold voltage of the plurality of NchMOS transistors NT11 and NT12 constituting CMOS logic circuit 110, may be less than this, or may be a depletion type. Further, when the absolute value of the threshold voltage of power control NchMOS transistor NT2 is sufficiently larger than the absolute value of the first threshold voltage, the same voltage as the potential of low potential side power supply line $V_{SS}$ is applied to the gate as a low level, and the voltage that is the same or higher than the potential of high potential side power supply line $V_{DD}$ is applied as a high level. Further, when the absolute value of the threshold voltage of power control NchMOS transistor NT2 is substantially the same or smaller than the absolute value of the first threshold voltage, or when power control NchMOS transistor NT2 is a depletion type transistor, a voltage lower than the potential of low potential side power supply line $V_{SS}$ is applied to the gate as a low level, and a voltage that is the same or higher than the potential of high potential side power supply line $V_{DD}$ is applied as a high level.

A high level applied to the gate of power control NchMOS transistor NT2 is decided by the threshold voltage of power control NchMOS transistor NT2 and a value set for on resistance, and is by no means limited to be a voltage that is the same or higher than the potential of $V_{DD}$, and may also be a voltage lower than the potential of $V_{DD}$.

Level conversion circuit 320 receives control input signal CTR, converts a signal voltage level, and outputs a high level signal and a low level signal applied to the gate of power control NchMOS transistor NT2.

A description is now given of the operation of semiconductor integrated circuit apparatus 300 of the configuration described above.

When the absolute value of the threshold voltage of power control NchMOS transistor NT2 is substantially the same or smaller than the absolute value of the first threshold voltage of NchMOS transistors NT11 and NT12 of CMOS logic circuit 110, or a depletion type, semiconductor integrated circuit apparatus 300 according to Embodiment 3 applies a voltage lower than the potential of low potential side power supply line $V_{SS}$ to the gate as a low level, and applies a voltage greater than or equal to the potential of the high potential side power supply line $V_{DD}$ as a high level. Moreover, when the absolute value of the threshold voltage of power control NchMOS transistor NT2 is sufficiently larger than the absolute value of the first threshold voltage, the same voltage as the potential of low potential side power supply line $V_{SS}$ is applied to the gate as a low level, and a voltage that is the same or higher than the potential of high potential side power supply line $V_{DD}$ is applied as a high level. In addition to the above, the gate and substrate of power control NchMOS transistor NT2 are electrically connected via current limiter 330.

For example, it is taken that CMOS logic circuit 110 is configured from an NchMOS transistor of a threshold voltage of 0.2V and a PchMOS transistor of a threshold voltage of −0.2V. Further, the threshold voltage of power control NchMOS transistor NT2 is taken to be −0.1V (depletion type). Further, low potential side power supply line $V_{SS}$ is taken to be 0V, and high potential side power supply line $V_{DD}$ is taken to be 0.5V that is a minimum operating voltage of CMOS logic circuit 110. A voltage applied to a gate of power control NchMOS transistor NT2 via level conversion circuit 320 is taken to be a low level of, rather than 0V, a negative voltage of, for example, −0.4V, and a high level of 0.5V that is the same voltage as the high potential side power supply line $V_{DD}$.

Here, considering the leakage current of power control NchMOS transistor NT2 in a standby state, even if, for example, power control NchMOS transistor NT2 is a depletion type NchMOS transistor, a voltage applied across a gate and source, and across substrate and source is a sufficiently large negative voltage of −0.4V, and it is therefore possible to put power control NchMOS transistor NT2 into a cut-off state suppressing leakage current. Namely, when the threshold voltage fluctuates by approximately 0.1V so as to become 0V as a result of applying a back-bias of −0.4V to the substrate, it is possible to achieve the same operating conditions as at the time of applying −0.5V to the gate of power control NchMOS transistor NT1 of Embodiment 1 by applying −0.4V to the gate.

Next, on resistance of a power control NchMOS transistor NT2 at the time of operation is compared with Embodiment 1.

In this embodiment, at power control NchMOS transistor NT2, the gate and substrate are connected electrically, so that when 0.5V is applied across the gate and source, 0.5V is also applied across the substrate and source. A forward bias is then applied to NchMOS transistor NT2, the threshold voltage of NchMOS transistor NT2 is further lowered, and it becomes easy for current to flow.

Namely, if there is a fluctuation in threshold voltage of 0.1V with respect to the forward bias of 0.5V, the on resistance of NchMOS transistor NT2 of Embodiment 3 becomes a value that is approximately 15% smaller compared to the on resistance of NchMOS transistor NT1 of Embodiment 1.

In addition to the effect of reducing on resistance due to the application of back bias, the following results are achieved as a feature of the structure where the gate and substrate are connected.

Figure 9:
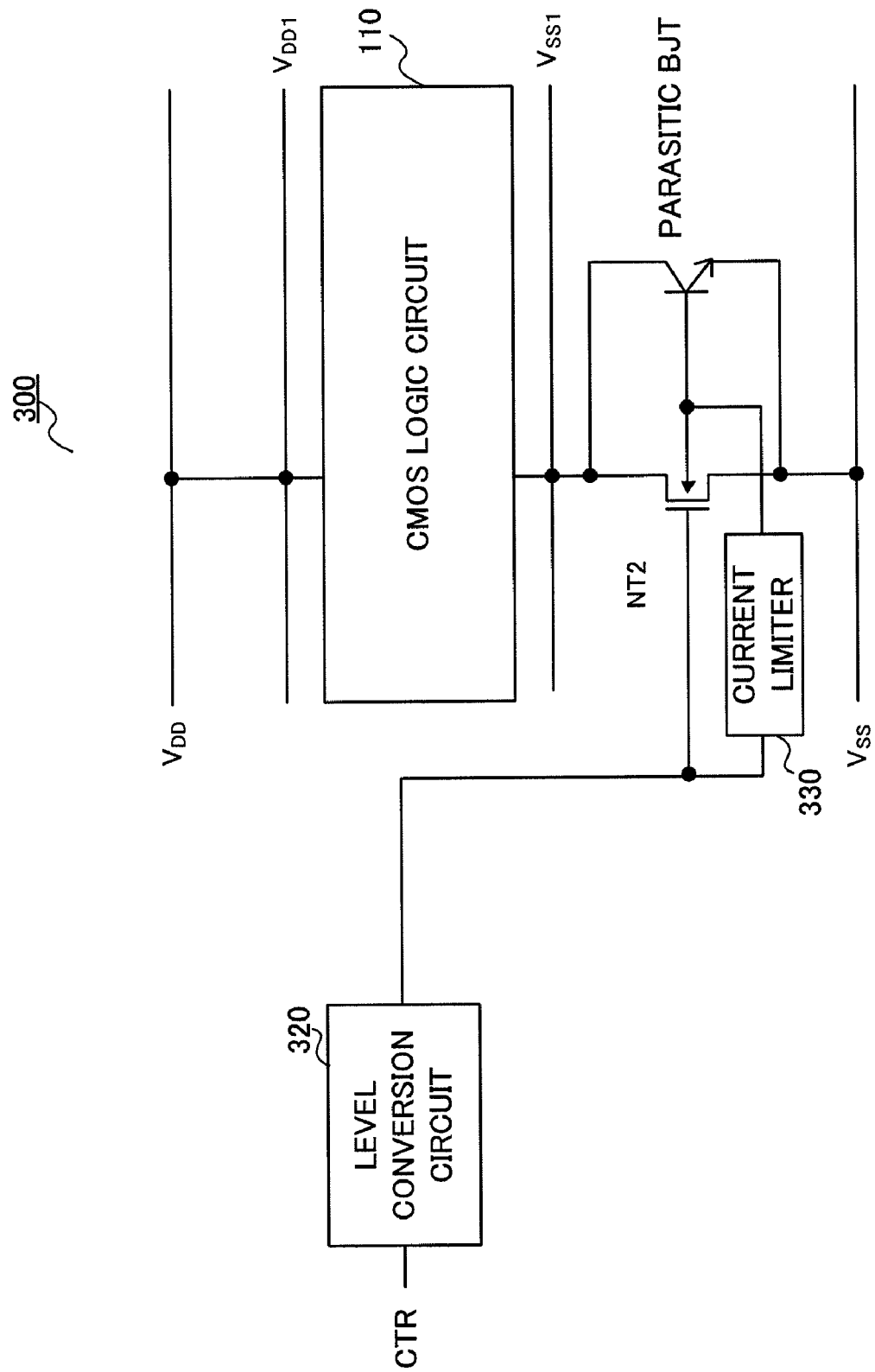
FIG. 9 shows an equivalence circuit for a power control NchMOS transistor according to Embodiment 3.

FIG. 9 shows an equivalence circuit for power control NchMOS transistor NT2.

As shown in FIG. 9, the gate of power control NchMOS transistor NT2 and the substrate are electrically connected, so that when the structure of power control NchMOS transistor NT2 is viewed in a depth direction of the device, the structure is such that a parasitic BJT (Bipolar Junction Transistor) is added in parallel with power control NchMOS transistor NT2. When the substrate voltage is, for example, approximately 0.6V or more, the on resistance due to the parasitic BJT exhibits the results, and in addition to the results of reducing the on resistance described above, on resistance due to the BJT is applied, and total on resistance of power control transistor NT2 is further lowered.

For example, in the event the high level of the gate voltage applied to power control NchMOS transistor NT2 is taken to be 1.0V that is a voltage higher than high potential side power supply line $V_{DD}$, when the on resistance of BJT is two times the on resistance of the NchMOS transistor, the total on resistance of NchMOS transistor NT2 and BJT of this embodiment becomes approximately 60% or less of the on resistance of NchMOS transistor NT1 of Embodiment 1 at the time the gate voltage is taken to be 1.0V, and it is possible to further increase the current supply performance to CMOS logic circuit 110 at the time of operation.

Further, if the on resistance is in the order of the same as the related art, it is possible to reduce the surface area of power control MOS transistor NT2 by approximately 60% or less.

Embodiment 4

Embodiment 4 is an example applied to a semiconductor integrated circuit apparatus using power control PchMOS transistor PT2 electrically connected to the gate and the substrate.

Figure 10:
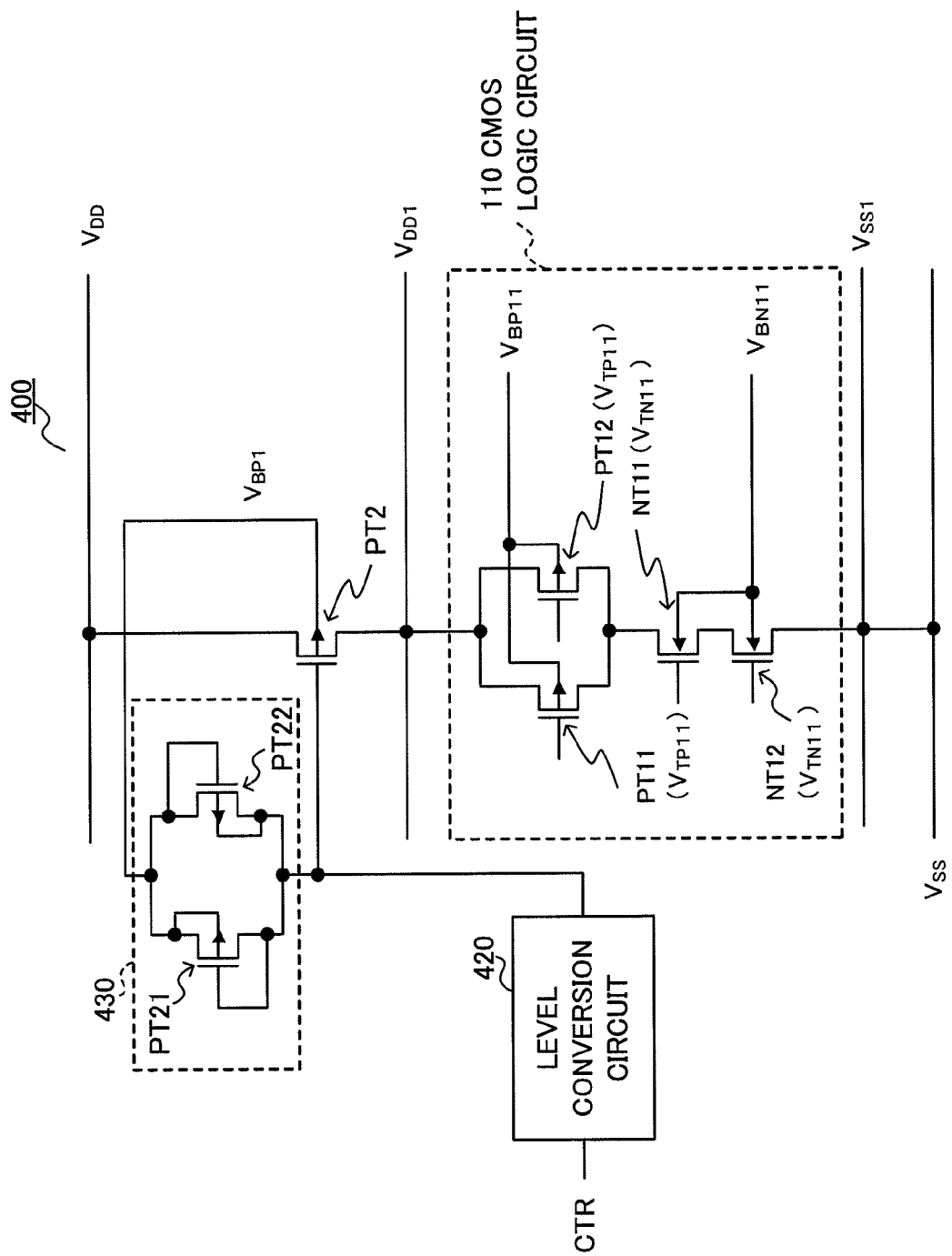
FIG. 10 is a circuit diagram showing a configuration for a semiconductor integrated circuit apparatus having a power control function according to Embodiment 4 of the present invention.

FIG. 10 is a circuit diagram showing a configuration for a semiconductor integrated circuit apparatus having a power control function according to Embodiment 4 of the present invention. This embodiment is an example applied to a semiconductor integrated circuit apparatus equipped with a CMOS logic circuit, power control PchMOS transistor PT2, and a level conversion circuit. Portions with the same configuration as for FIG. 7 are given the same numerals and are not described.

In FIG. 10, semiconductor integrated circuit apparatus 400 is comprised of CMOS logic circuit 110, first pseudo power supply line $V_{DD1}$ connected to a high potential side power supply terminal section of CMOS logic circuit 110, a second pseudo power supply line $V_{SS1}$ connected to a low potential side power supply terminal section of CMOS logic circuit 110, power control PchMOS transistor PT2 (first PchMIS transistor) connected across high potential side power supply line $V_{DD}$ and first pseudo power supply line $V_{DD1}$, level conversion circuit 420 for converting a signal voltage level applied to the gate of power control PchMOS transistor PT2, and current limiter 430 utilizing a source follower due to depletion type PchMOS transistors PT21 and PT22.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage.

The high potential side power supply terminal section of CMOS logic circuit 110 is connected to first pseudo power supply line $V_{DD1}$, and the low potential side power supply terminal section is connected to second pseudo power supply line $V_{SS1}$.

Power control PchMOS transistor PT2 adopts a configuration where a drain is connected to first pseudo power supply line $V_{DD1}$, a source is connected to high potential side power supply line $V_{DD}$, and a substrate and gate are electrically connected. The gate and the substrate may also, for example, be connected via current limiter 430 utilizing, for example, a source follower of a depletion type PchMOS transistor. Power control PchMOS transistor PT1 of FIG. 7 differs from the point that the substrate and gate are electrically connected.

The absolute value of the threshold voltage of power control PchMOS transistor PT2 may be made larger than the absolute value of the second threshold voltage of the plurality of PchMOS transistors PT11 and PT12 constituting CMOS logic circuit 110, may be less than this, or power control PchMOS transistor PT2 may be a depletion type. Further, when the absolute value of the threshold voltage of power control PchMOS transistor PT2 is sufficiently larger than the absolute value of the second threshold voltage, the same voltage as the potential of low potential side power supply line $V_{DD}$ is applied to the gate as a high level, and a voltage that is the same or lower than the potential of low potential side power supply line $V_{SS}$ is applied as a low level. Moreover, when the absolute value of the threshold voltage of power control PchMOS transistor PT2 is substantially the same or smaller than the absolute value of the second threshold voltage, or a depletion type, a voltage higher than the potential of $V_{DD}$ is applied to the gate as a high level, and a voltage that is the same or lower than the potential of low potential side power supply line $V_{SS}$ is applied as a low level.

A low level applied to a gate of power control PchMOS transistor PT2 is decided by the threshold voltage of power control PchMOS transistor PT2 and a value set for on resistance, and is by no means limited to be a voltage that is the same or lower than the potential of low potential side power supply line $V_{SS}$, and may also be a voltage higher than the potential of low potential side power supply line $V_{SS}$.

Level conversion circuit 420 receives control input signal CTR, converts a signal voltage level, and outputs a high level signal and a low level signal applied to the gate of power control PchMOS transistor PT2.

A description is now given of the operation of semiconductor integrated circuit apparatus 400 of the configuration described above.

As with the case of Embodiment 3, semiconductor integrated circuit apparatus 400 according to Embodiment 4 is such that at the power control PchMOS transistor, the gate of power control PchMOS transistor PT2 and the substrate are electrically connected via current limiter 430.

Specifically, it is taken that CMOS logic circuit 110 is configured from NchMOS transistor of a threshold voltage of 0.2V and PchMOS transistor of a threshold voltage of −0.2V. Further, the threshold voltage of power control PchMOS transistor PT2 is taken to be 0.1V (depletion type). Moreover, low potential side power supply line $V_{SS}$ is taken to be 0V, and high potential side power supply line $V_{DD}$ is taken to be 0.5V that is a minimum operating voltage of CMOS logic circuit 110. A voltage applied to a gate of power control PchMOS transistor PT2 via level conversion circuit 420 takes a high level to be a voltage higher than the high potential side power supply line $V_{DD}$ of, for example, 0.9V, and takes a low level to be a voltage of 0V that is the same voltage as low potential side power supply line $V_{SS}$.

As in Embodiment 3, leakage current of power control PchMOS transistor PT2 in a standby state is such that the voltage applied across the gate and source and across the substrate and source of power control PchMOS transistor PT2 is a sufficiently large positive voltage of 0.4V more than $V_{DD}$, and it is possible to put power control PchMOS transistor PT2 into a cut-off state suppressing leakage current.

Further, as in Embodiment 3, a forward bias is then applied to PchMOS transistor PT2, the threshold voltage of PchMOS transistor PT2 becomes further higher, and it becomes easy for current to flow. If there is then a fluctuation in threshold voltage of 0.1V with respect to the forward bias of 0.5V, the on resistance of power control PchMOS transistor PT2 at the time of operation becomes a value that is approximately 15% smaller compared to the on resistance of PchMOS transistor PT1 of Embodiment 2.

Further, as described in Embodiment 3, a configuration is adopted where a parasitic BJT (Bipolar Junction Transistor) is added in parallel with power control PchMOS transistor PT2. Therefore, in Embodiment 4, as in Embodiment 3, for example, in the event a low level of a gate voltage applied to PT2 is taken to be −0.5V that is a voltage lower than $V_{SS}$, when the on resistance of BJT becomes twice the on resistance of the PchMOS transistor, the on resistance of the PchMOS transistor PT2 and the total on resistance of the BJT becomes approximately 60% or less of the on resistance of PchMOS transistor PT1 of Embodiment 2, and it is possible to increase the current supply performance to the CMOS logic circuit at the time of operation.

Further, if the on resistance is in the order of the same as the related art, it is possible to reduce the surface area of the power control MOS transistor PT2 by approximately 60% or less.

Embodiment 5

Embodiment 5 is an example using power control PchMOS transistor NT1 of Embodiment 1 and power control PchMOS transistor PT1 of Embodiment 2.

Figure 11:
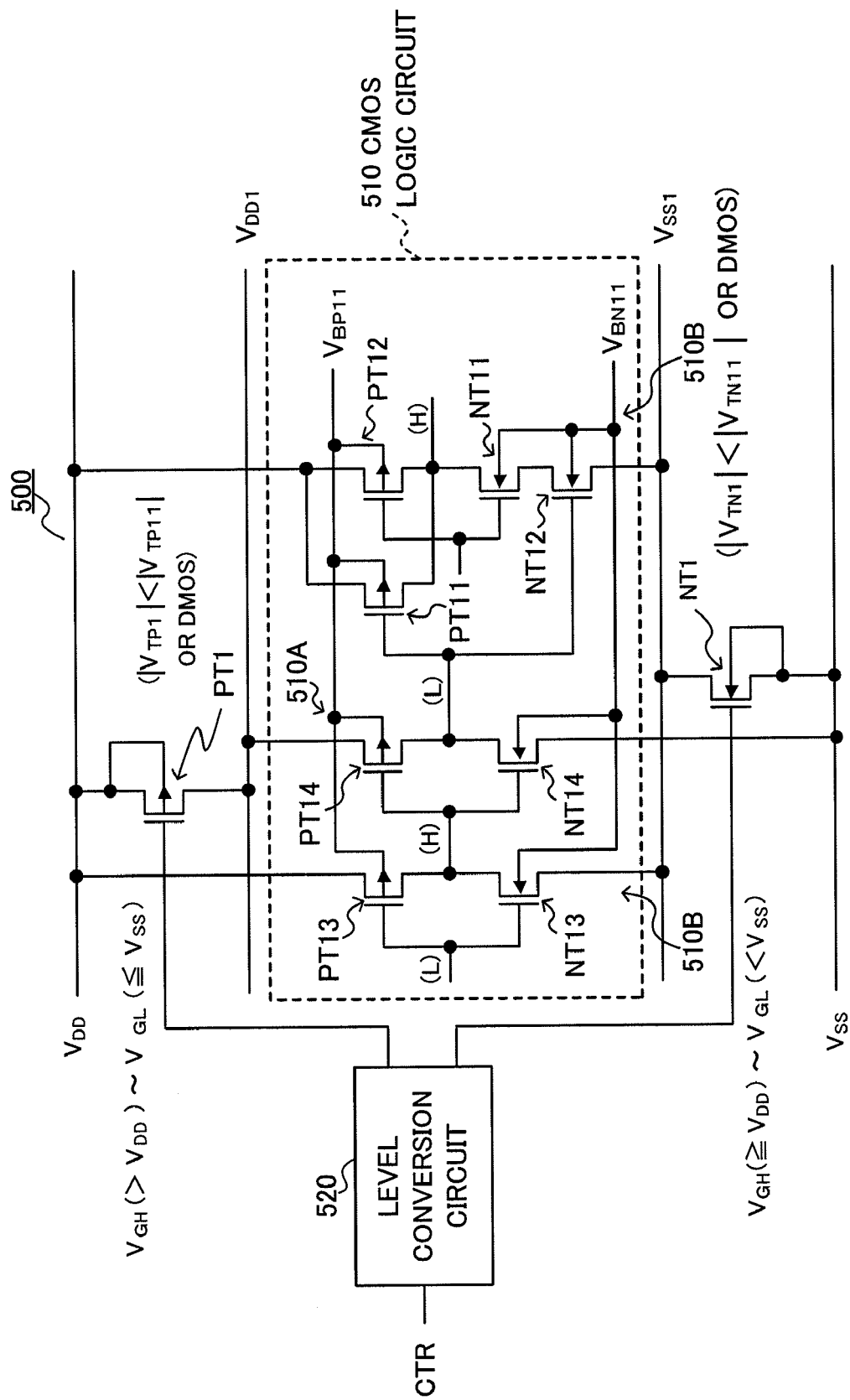
FIG. 11 is a circuit diagram showing a configuration for a semiconductor integrated circuit apparatus having a power control function according to Embodiment 5 of the present invention.

FIG. 11 is a circuit diagram showing a configuration for a semiconductor integrated circuit apparatus having a power control function according to Embodiment 5 of the present invention. This embodiment is an example applied to a semiconductor integrated circuit apparatus equipped with a CMOS logic circuit, power control NchMOS transistor NT1, power control PchMOS transistor PT1, and a level conversion circuit. Portions with the same configuration as for FIG. 6 and FIG. 7 are given the same numerals and are not described.

In FIG. 11, semiconductor integrated circuit apparatus 500 is comprised of CMOS logic circuit 510, first pseudo power supply line $V_{DD1}$ connected to a high potential side power supply terminal section of CMOS logic circuit 510, second pseudo power supply line $V_{SS1}$ connected to a low potential side power supply terminal section of CMOS logic circuit 510, power control NchMOS transistor NT1 connected across second pseudo power supply line $V_{SS1}$ and low potential side power supply line $V_{SS}$, power control PchMOS transistor PT1 connected across high potential side power supply line $V_{DD}$ and first pseudo power supply line $V_{DD1}$, and level conversion circuit 520 for converting a signal voltage level applied to the gate of power control NchMOS transistor NT1 and the gate of power control PchMOS transistor PT1.

As in Embodiment 1, CMOS logic circuit 510 is comprised of a plurality of NchMOS transistors NT11, NT12, NT13 and NT14 having a first threshold voltage and a plurality of PchMOS transistors PT11, PT12, PT13, and PT14 having a second threshold voltage. CMOS logic circuit 510 has a split configuration so as to be divided into CMOS logic circuit 510A where a logic circuit output is a low level output at the time of an initial state, and CMOS logic circuit 510B where a logic circuit output is a high level at the time of the initial state.

The high potential side power supply terminal section of CMOS logic circuit 510A is connected to first pseudo power supply line $V_{DD1}$, and the low potential side power supply terminal section of CMOS logic circuit 510A is connected to low potential side power supply line $V_{SS}$. Further, the high potential side power supply terminal section of CMOS logic circuit 510B is connected to high potential side power supply line $V_{DD}$, and the low potential side power supply terminal section of CMOS logic circuit 510B is connected to second pseudo power supply line $V_{SS1}$.

Power control NchMOS transistor NT1 has a drain connected to second pseudo power supply line $V_{SS1}$ and a source and substrate connected to low potential side power supply line $V_{SS}$. The absolute value of the threshold voltage of power control NchMOS transistor NT1 is set to be smaller than the absolute value of the first threshold voltage of the plurality of NchMOS transistors NT11, NT12, NT13 and NT14 constituting CMOS logic circuit 510 or power control NchMOS transistor NT1 is set to be a depletion type. Moreover, a voltage lower than the potential of low potential side power supply line $V_{SS}$ is applied to the gate of power control NchMOS transistor NT1 as a low level, and a voltage that is the same or higher than the potential of high potential side power supply line $V_{DD}$ is applied as a high level.

Power control PchMOS transistor PT1 has a drain connected to first pseudo power supply line $V_{DD1}$ and a source and substrate connected to high potential side power supply line $V_{DD}$. The absolute value of the threshold voltage of power control PchMOS transistor PT1 is set to be smaller than the absolute value of the second threshold voltage of the plurality of PchMOS transistors PT11, PT12, PT13 and PT14 constituting CMOS logic circuit 510 or is set to be a depletion type. Further, a voltage higher than the potential of high potential side power supply line $V_{DD}$ is applied to the gate of power control PchMOS transistor PT1 as a high level, and a voltage that is the same or lower than the potential of low potential side power supply line $V_{SS}$ is applied as a low level.

A high level applied to a gate of power control NchMOS transistor NT1 is decided by a threshold voltage of power control NchMOS transistor NT1 and a set value for on resistance, and the case of a voltage lower than the potential of high potential side power supply line $V_{DD}$ is also possible. Similarly, a low level applied to a gate of power control PchMOS transistor PT1 is decided by a threshold voltage of power control PchMOS transistor PT1 and a set value for on resistance, and the case of a voltage higher than the potential of low potential side power supply line $V_{SS}$ is also possible.

Level conversion circuit 520 receives control input signal CTR, converts a signal voltage level, and outputs a high level signal and a low level signal applied to the gate of power control NchMOS transistor NT1 and power control PchMOS transistor PT1.

A description is now given of the operation of semiconductor integrated circuit apparatus 500 of the configuration described above.

For example, it is taken that CMOS logic circuit 510 is configured from an NchMOS transistor a threshold voltage of 0.2V and a PchMOS transistor of a threshold voltage of −0.2V. Further, threshold voltage of power control NchMOS transistor NT1 is taken to be −0.1V (depletion type), and threshold voltage of power control PchMOS transistor PT1 is taken to be 0.1V (depletion type) Moreover, low potential side power supply line $V_{SS}$ is taken to be 0V, and high potential side power supply line $V_{DD}$ is taken to be 1.0V. Further, a voltage applied to the gate of power control NchMOS transistor NT1 via level conversion circuit is taken to be a low level of −0.5V and a high level of 1.0V that is the same voltage as high potential side power supply line $V_{DD}$, and a voltage applied to the gate of power control PchMOS transistor PT1 is taken to be a high level of 1.5V and a low level of 0V that is the same voltage as low potential side power supply line $V_{SS}$.

Here, considering the leakage current of power control NchMOS transistor NT1 in a standby state, even if, for example, power control NchMOS transistor NT1 is a depletion type NchMOS transistor, a voltage applied across a gate and source is a sufficiently large negative voltage of −0.5V, and it is therefore possible to put power control NchMOS transistor NT1 into a cut-off state suppressing leakage current.

Further, in a standby state, the gate voltage of NchMOS transistor NT12 of CMOS logic circuit 510B with a source connected to second pseudo power supply line $V_{SS1}$ is $V_{SS}$ potential, so that when source potential is higher than $V_{SS}$ potential, a negative voltage is applied across the gate and source, and second pseudo power supply line $V_{SS1}$, namely drain potential of power control NchMOS transistor NT1 is stable at approximately 0.2V. Therefore, in Embodiment 1, when $V_{DD}$ and a high level of gate NT1 are taken to be 1.0V, a voltage of 1.5V is applied across the gate and drain of power control NchMOS transistor NT1. However, the voltage applied across the gate and drain of power control NchMOS transistor NT1 of this embodiment is kept low at approximately 0.7V. This means that configuration is possible using transistors having the same gate and drain withstand voltage as MOS transistors constituting CMOS logic circuit 510.

As described above, in a standby state, second pseudo power supply line $V_{SS1}$ does not rise as far as the potential of high potential side power supply line $V_{DD}$, is stable at approximately 0.2V, first pseudo power supply line $V_{DD1}$ does not fall as far as potential of low potential side power supply line $V_{SS}$, and is stable at approximately 0.8V. Therefore, in addition to the effect of suppressing withstand voltage, an effect is anticipated where the state of internal logic of CMOS logic circuit 510 is rapidly stabilized at the time of switching during operation.

Further, similarly, taking into consideration leakage current of power control PchMOS transistor PT1 at the time of standby, the voltage applied across the gate and source is a sufficiently large positive voltage of 0.5V, and it is therefore possible to put power control PchMOS transistor PT1 into a cut-off state suppressing leakage current. Moreover, in a standby state, the gate voltage of PchMOS transistor PT14 of CMOS logic circuit 510A where a source is connected to first pseudo power supply line $V_{DD1}$ is $V_{DD}$ potential, so that when source potential is lower than $V_{DD}$ potential, a positive voltage is applied across the gate and source, and first pseudo power supply line $V_{DD1}$, namely drain potential of power control PchMOS transistor PT1 is stable at approximately 0.8V. Therefore, in Embodiment 2, when high potential side power supply line $V_{DD}$ is taken to be 1.0V, and a high level of the gate of power control PchMOS transistor PT1 is taken to be 1.5V, a voltage of 1.5V is applied across the gate and drain of power control PchMOS transistor PT1. However, the voltage applied across the gate and drain of power control PchMOS transistor PT1 in this embodiment is kept low at approximately 0.7V, and a configuration is possible using transistors having the same gate and drain withstand voltage as MOS transistors constituting CMOS logic circuit 510.

Further, with respect to the on resistance of power control NchMOS transistor NT1 and power control PchMOS transistor PT1 at the time of operation, as in Embodiment 1 and Embodiment 2, the on resistance becomes approximately 70% compared to the related art example, and it is possible to increase the current supply performance to CMOS logic circuit 510 at the time of operation. Further, if the on resistance is in the order of the same as the related art, it is possible to reduce the surface area of the power control MOS transistors NT1 and PT1 by approximately 70%.

Embodiment 6

Embodiment 6 is an example applied to semiconductor integrated circuit apparatus that combines Embodiment 3, Embodiment 4, and Embodiment 5.

Figure 12:
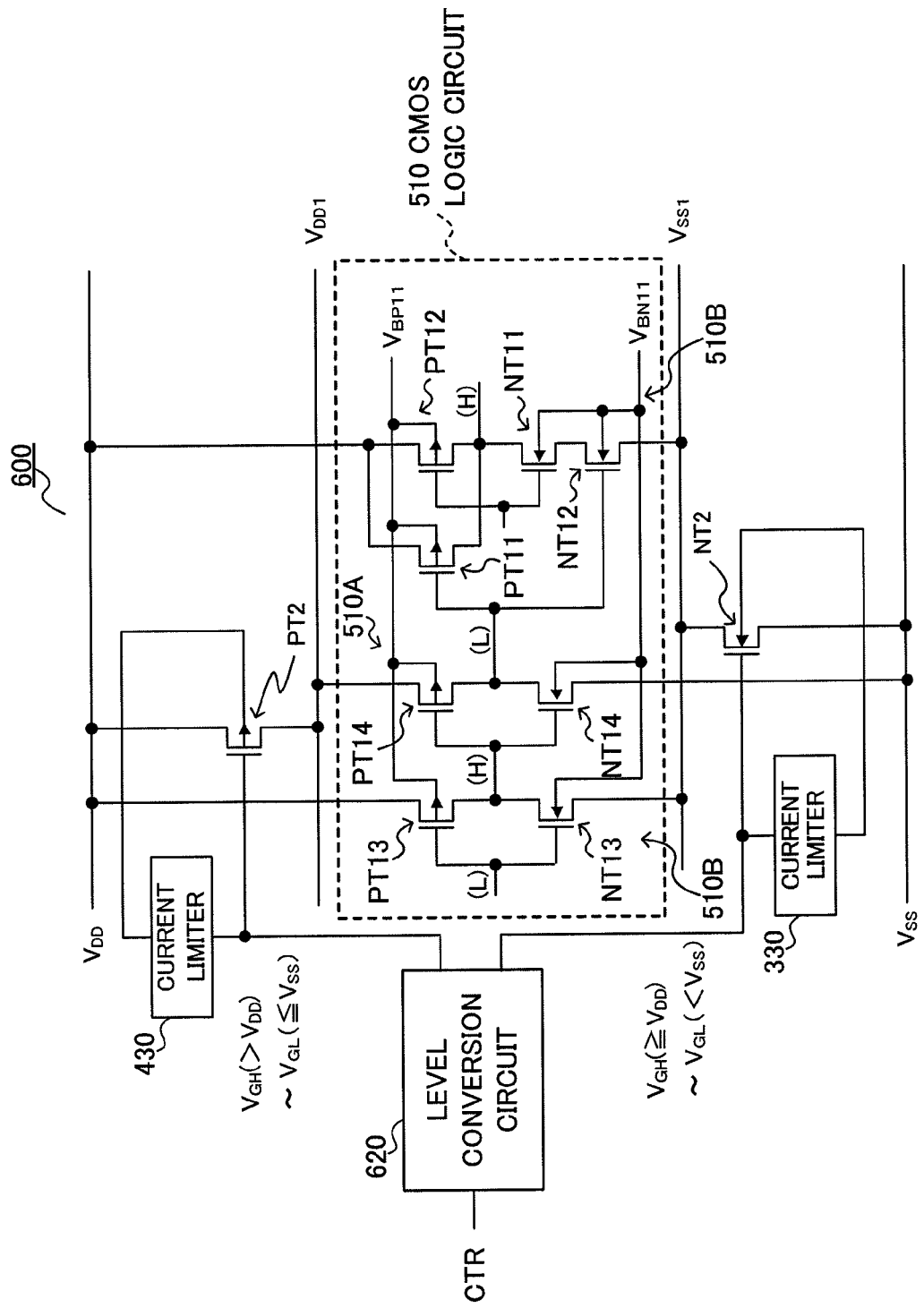
FIG. 12 is a circuit diagram showing a configuration for a semiconductor integrated circuit apparatus having a power control function according to Embodiment 6 of the present invention.

FIG. 12 is a circuit diagram showing a configuration for a semiconductor integrated circuit apparatus having a power control function according to Embodiment 6 of the present invention. This embodiment is an example applied to a semiconductor integrated circuit apparatus equipped with a CMOS logic circuit, power control NchMOS transistor NT2, power control PchMOS transistor PT2, and a level conversion circuit. Portions with the same configuration as for FIG. 8, FIG. 10 and FIG. 11 are given the same numerals and are not described.

In FIG. 12, semiconductor integrated circuit apparatus 600 is comprised of CMOS logic circuit 510, first pseudo power supply line $V_{DD1}$ connected to a high potential side power supply terminal section of CMOS logic circuit 510, second pseudo power supply line $V_{SS1}$ connected to a low potential side power supply terminal section of CMOS logic circuit 510, power control NchMOS transistor NT2 connected across second pseudo power supply line $V_{SS1}$ and low potential side power supply line $V_{SS}$, current limiter 330 arranged across a gate and substrate of power control NchMOS transistor NT2, power control PchMOS transistor PT2 connected across high potential side power supply line $V_{DD}$ and first pseudo power supply line $V_{DD1}$, current limiter 430 arranged across the gate and substrate of power control PchMOS transistor PT2, and level conversion circuit 620 for converting a signal voltage level applied to a gate of power control NchMOS transistor NT2 and a gate of power control PchMOS transistor PT2.

CMOS logic circuit 510 is comprised of a plurality of NchMOS transistors NT11, NT12, NT13 and NT14 having a first threshold voltage and a plurality of PchMOS transistors PT11, PT12, PT13, and PT14 having a second threshold voltage. CMOS logic circuit 510 has a split configuration so as to be divided into CMOS logic circuit 510A where a logic circuit output is a low level output at the time of an initial state, and CMOS logic circuit 510B where a logic circuit output is a high level at the time of the initial state.

The high potential side power supply terminal section of CMOS logic circuit 510A is connected to first pseudo power supply line $V_{DD1}$, and the low potential side power supply terminal section is connected to low potential side power supply line $V_{SS}$. Further, the high potential side power supply terminal section of CMOS logic circuit 510B is connected to high potential side power supply line $V_{DD}$, and the low potential side power supply terminal section is connected to second pseudo power supply line $V_{SS1}$.

Power control NchMOS transistor NT2 adopts a configuration where a drain is connected to second pseudo power supply line $V_{SS1}$, a source is connected to low potential side power supply line $V_{SS}$, and a substrate and gate are electrically connected. The gate and substrate may also be connected via current limiter 330. The absolute value of the threshold voltage of power control NchMOS transistor NT2 may be made larger than the absolute value of the first threshold voltage of the plurality of NchMOS transistors NT11, NT12, NT13 and NT14 constituting CMOS logic circuit 510, may be less than this, or may be a depletion type. Further, when the absolute value of the threshold voltage of power control NchMOS transistor NT2 is sufficiently larger than the absolute value of the first threshold voltage, the same voltage as the potential of low potential side power supply line $V_{SS}$ is applied to the gate as a low level, and a voltage that is the same or higher than the potential of high potential side power supply line $V_{DD}$ is applied as a high level. Further, when that the absolute value of the threshold voltage of power control NchMOS transistor NT2 is substantially the same or smaller than the absolute value of the first threshold voltage, or when power control NchMOS transistor NT2 is a depletion type, a voltage lower than the potential of low potential side power supply line $V_{SS}$ is applied to the gate as a low level, and a voltage that is the same or higher than the potential of high potential side power supply line $V_{DD}$ is applied as a high level.

Power control PchMOS transistor PT2 adopts a configuration where a drain is connected to first pseudo power supply line $V_{DD1}$, a source is connected to high potential side power supply line $V_{DD}$, and a substrate and gate are electrically connected. The gate and substrate may also be connected via a current limiter. The absolute value of the threshold voltage of power control PchMOS transistor PT2 may be made larger than the absolute value of the second threshold voltage of the plurality of PchMOS transistors PT11, PT12, PT13 and PT14 constituting CMOS logic circuit 510, may be less than this, or may be a depletion type. Further, when the absolute value of the threshold voltage of power control PchMOS transistor PT2 is sufficiently larger than the absolute value of the second threshold voltage, the same voltage as the potential of high potential side power supply line $V_{DD}$ is applied to the gate as a high level, and a voltage that is the same or lower than the potential of low potential side power supply line $V_{SS}$ is applied as a low level. Moreover, when the absolute value of the threshold voltage of power control PchMOS transistor PT2 is substantially the same or smaller than the absolute value of the second threshold voltage, or a depletion type, a voltage higher than the potential of high potential side power supply line $V_{DD}$ is applied to the gate as a high level, and a voltage that is the same or lower than the potential of low potential side power supply line $V_{SS}$ is applied as a low level.

A high level applied to a gate of power control NchMOS transistor NT2 is decided by a threshold voltage of power control NchMOS transistor NT2 and a set value for on resistance, and the case of a voltage lower than the potential of high potential side power supply line $V_{DD}$ is also possible. Similarly, a low level applied to a gate of power control PchMOS transistor PT2 is decided by a threshold voltage of power control PchMOS transistor PT2 and a set value for on resistance, and the case of a voltage higher than the potential of low potential side power supply line $V_{SS}$ is also possible.

Level conversion circuit 620 receives control input signal CTR, converts a signal voltage level, and outputs a high level signal and a low level signal applied to the gate of power control NchMOS transistor NT2 and power control PchMOS transistor PT2.

A description is now given of the operation of semiconductor integrated circuit apparatus 600 of the configuration described above.

For example, it is taken that CMOS logic circuit 510 is configured from an NchMOS transistor of a threshold value of 0.2V and a PchMOS transistor of a threshold voltage of −0.2V. Further, threshold voltage of power control NchMOS transistor NT2 is taken to be −0.1V (depletion type), and threshold voltage of power control PchMOS transistor PT2 is taken to be 0.1V (depletion type). Moreover, low potential side power supply line $V_{SS}$ is taken to be 0V, and high potential side power supply line $V_{DD}$ is taken to be 1.0V. Further, a voltage applied to the gate of power control NchMOS transistor NT2 via the level conversion circuit is taken to be a low level of −0.4V and a high level of 1.0V that is the same voltage as high potential side power supply line $V_{DD}$, an a voltage applied to the gate of power control PchMOS transistor PT2 is taken to be a high level of 1.4V and a low level of 0V that is the same voltage as low potential side power supply line $V_{SS}$.

Here, considering the leakage current of power control NchMOS transistor NT2 in a standby state, even if, for example, power control NchMOS transistor NT2 is a depletion type NchMOS transistor, a voltage applied across gate and source and across substrate and source is a sufficiently large negative voltage of −0.4V, and it is therefore possible to put power control NchMOS transistor NT2 into a cut-off state suppressing leakage current.

Further, in a standby state, the gate voltage of NchMOS transistor of CMOS logic circuit 510B with a source connected to second pseudo power supply line $V_{SS1}$ is $V_{SS}$ potential, so that when source potential is higher than $V_{SS}$ potential, a negative voltage is applied across the gate and source, and second pseudo power supply line $V_{SS1}$, namely drain potential of power control NchMOS transistor NT2 is stable at approximately 0.2V. Therefore, in Embodiment 1, when high potential side power supply line $V_{DD}$ and a high level of gate of power control NchMOS transistor NT1 are taken to be 1.0V, a voltage of 1.5V is applied across the gate and drain of power control NchMOS transistor NT1. However, the voltage applied across the gate and drain of power control NchMOS transistor NT2 of this embodiment is kept low at approximately 0.6V. This means that configuration is possible using transistors having the same gate and drain withstand voltage as MOS transistors constituting CMOS logic circuit 510.

Further, similarly, taking into consideration leakage current of power control PchMOS transistor PT2 at the time of standby, the voltage applied across the gate and source and substrate and source is a sufficiently large positive voltage of 0.4V, and it is therefore possible to put power control PchMOS transistor PT2 into a cut-off state suppressing leakage current. Moreover, in a standby state, the gate voltage of PchMOS transistor of CMOS logic circuit 510A where a source is connected to first pseudo power supply line $V_{DD1}$ is high potential side power supply line $V_{DD}$ potential, so that when source potential is lower than high potential side power supply line $V_{DD}$ potential, a positive voltage is applied across the gate and source, and first pseudo power supply line $V_{DD1}$, namely drain potential of power control PchMOS transistor PT2 is stable at approximately 0.8V. Therefore, in Embodiment 2, when high potential side power supply line $V_{DD}$ is taken to be 1.0V, and a high level of the gate of power control PchMOS transistor PT1 is taken to be 1.5V, a voltage of 1.5V is applied across the gate and drain of power control PchMOS transistor PT1. However, the voltage applied across the gate and drain of power control PchMOS transistor PT1 in this embodiment is kept low at approximately 0.6V. This means that configuration is possible using transistors having the same gate and drain withstand voltage as MOS transistors constituting CMOS logic circuit 510.

As described above, in a standby state, second pseudo power supply line $V_{SS1}$ does not rise as far as the potential of high potential side power supply line $V_{DD}$, is stable at approximately 0.2V, first pseudo power supply line $V_{DD1}$ does not fall as far as potential of low potential side power supply line $V_{SS}$, and is stable at approximately 0.8V. Therefore, in addition to the effect of suppressing withstand voltage, an effect is anticipated where the state of internal logic of CMOS logic circuit 510 is rapidly stabilized at the time of switching during operation.

Further, as in Embodiment 3 and Embodiment 4, with respect to on resistance of power control NchMOS transistor NT2 and power control PchMOS transistor PT2 at the time of operation, this falls to approximately 60% or less of the on resistance of power control NchMOS transistor NT1 and power control PchMOS transistor PT1 of Embodiment 5, and it is possible to increase the current supply performance to CMOS logic circuit 510 at the time of operation. Moreover, if the on resistance is in the order of the same as the related art, it is possible to reduce surface area of power control NchMOS transistor NT2 and power control PchMOS transistor PT2 by approximately 60% or less.

Embodiment 7

Embodiment 7 is an example applied to a semiconductor integrated circuit apparatus using serially connected power control NchMOS transistors NT3 and NT4 where the gate and the substrate are electrically connected. Namely, when the threshold voltage of the Nch side MOS transistor is made lower and the gate voltage is made negative, the voltage across the gate and drain becomes gradually higher. When the NchMOS transistor does not possess the required withstand voltage, improvement in reliability of a transistor is not possible. In this embodiment, an example is given where on resistance of the power control NchMOS transistor is lowered, and withstand voltage is suppressed.

Figure 13:
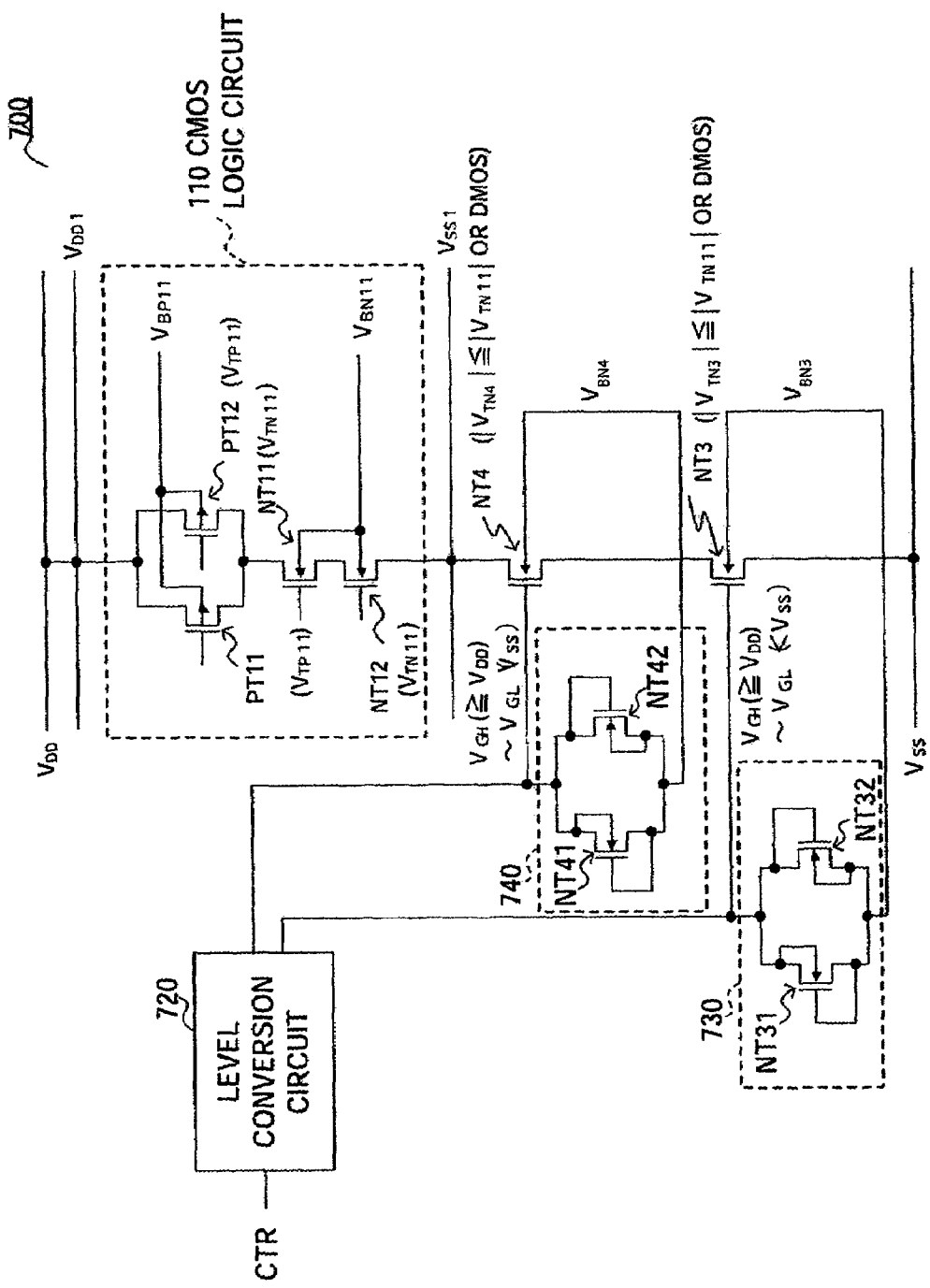
FIG. 13 is a circuit diagram showing a configuration for a semiconductor integrated circuit apparatus having a power control function according to Embodiment 7 of the present invention.

FIG. 13 is a circuit diagram showing a configuration for semiconductor integrated circuit apparatus having a power control function of Embodiment 7 of the present invention. This Embodiment 7 is an example applied to a semiconductor integrated circuit apparatus equipped with a CMOS logic circuit, power control NchMOS transistors NT3 and NT4 and a level conversion circuit. Portions with the same configuration as for FIG. 8 are given the same numerals and are not described.

In FIG. 13, semiconductor integrated circuit apparatus 700 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control NchMOS transistors NT3 and NT4 connected in series across second pseudo power supply line $V_{SS1}$ and low potential side power supply line $V_{SS}$, level conversion circuit 720 for converting a signal voltage level applied to a gate of power control NchMOS transistors NT3 and NT4, current limiter 730 arranged across a gate and substrate of power control NchMOS transistor NT3 utilizing a source follower of depletion type NchMOS transistors NT31 and NT32, and current limiter 740 arranged across the gate and substrate of power control NchMOS transistor NT4 utilizing a source follower of depletion type NchMOS transistors NT41 and NT42.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control NchMOS transistor NT3 has a drain connected to the source of power control NchMOS transistor NT4, a source connected to low potential side power supply line $V_{SS}$, and a substrate and gate that are electrically connected. Power control NchMOS transistor NT4 adopts a configuration where a drain is connected to second pseudo power supply line $V_{SS1}$, and a substrate and gate are electrically connected. The respective gates and substrates of power control NchMOS transistor NT3 and power control NchMOS transistor NT4 may also, for example, be connected via current limiters 730 and 740 utilizing a source follower of a depletion type NchMOS transistor.

The absolute value of the threshold voltage of power control NchMOS transistors NT3 and NT4 is set to be less than the absolute value of the first threshold voltage of the plurality of NchMOS transistors NT11 and NT12 constituting CMOS logic circuit 110 or power control NchMOS transistors NT3 and NT4 are set to be depletion types. Moreover, a voltage lower than the potential of low potential side power supply line $V_{SS}$ is applied to the gate of power control NchMOS transistor NT3 as a low level, and a voltage that is the same or higher than potential of high potential side power supply line $V_{DD}$ is applied as a high level. Further, a voltage that is the same as the potential of low potential side power supply line $V_{SS}$ is applied to the gate of power control NchMOS transistor NT4 as a low level, and a voltage that is the same or higher than potential of high potential side power supply line $V_{DD}$ is applied as a high level.

A high level applied to a gate of power control NchMOS transistors NT3 and NT4 is decided by the threshold voltage of power control NchMOS transistors NT3 and NT4 and a value set for on resistance, and is by no means limited to be a voltage that is the same or higher than the potential of high potential side power supply line $V_{DD}$, and may also be a voltage lower than the potential of high potential side power supply line $V_{DD}$.

Level conversion circuit 720 receives control input signal CTR, converts a signal voltage level, and outputs a high level signal and a low level signal applied to the gate of power control NchMOS transistors NT3 and NT4.

A description is now given of the operation of semiconductor integrated circuit apparatus 700 of the configuration described above.

For example, it is taken that CMOS logic circuit 110 is configured from an NchMOS transistor a threshold voltage of 0.2V and a PchMOS transistor of a threshold voltage of −0.2V. Further, the threshold voltage of power control NchMOS transistors NT3 and NT4 is made to be −0.1V (depletion type). Moreover, low potential side power supply line $V_{SS}$ is taken to be 0V, and high potential side power supply line $V_{DD}$ is taken to be 1.0V. A voltage applied to a gate of power control NchMOS transistor NT3 via level conversion circuit 720 is taken to be a low level of, for example, −0.4V, and a high level of 1.0V that is the same voltage as the high potential side power supply line. Further, a voltage applied to the gate of power control NchMOS transistor NT4 is taken to be a low level of 0V and a high level of 1.0V.

Here, considering the leakage current of power control NchMOS transistor NT3 in a standby state, even if, for example, power control NchMOS transistor NT3 is a depletion type NchMOS transistor, a voltage applied across a gate and source and across substrate and source is a sufficiently large negative voltage of −0.4V, and it is therefore possible to put power control NchMOS transistor NT3 into a cut-off state suppressing leakage current. Further, the low level applied to the gate and substrate of power control NchMOS transistor NT4 is 0V, so that the source potential of NT4, namely the drain potential of power control NchMOS transistor NT3 is stable at approximately 0.4V. Therefore, as shown in Embodiment 3, in the case of a configuration using only power control NchMOS transistor NT2, a voltage of 1.4V is applied across the gate and drain of NT2, but in the case of a configuration using both NchMOS transistors of power control NchMOS transistors NT3 and NT4, a voltage applied across the gate and drain of power control NchMOS transistors NT3 and NT4 is kept low at 1.0V or less. This mean that configuration is possible having the same gate and drain withstand voltage as the MOS transistor constituting the CMOS logic circuit.

Next, on resistance of power control NchMOS transistors NT3 and NT4 at the time of operation is compared with a related art example. In the related art example, the substrates of power control NchMOS transistors NT3 and NT4 are connected to low potential side power supply line $V_{SS}$, but in this embodiment, as the gates and substrates of power control NchMOS transistors NT3 and NT4 are connected together, when 1.0V is applied across the gate and source, approximately 0.7V is applied across the substrate and source. A forward bias is therefore applied to power control NchMOS transistors NT3 and NT4, the threshold voltages of power control NchMOS transistors NT3 and NT4 is further lowered, and it becomes easy for current to flow.

Figure 14:
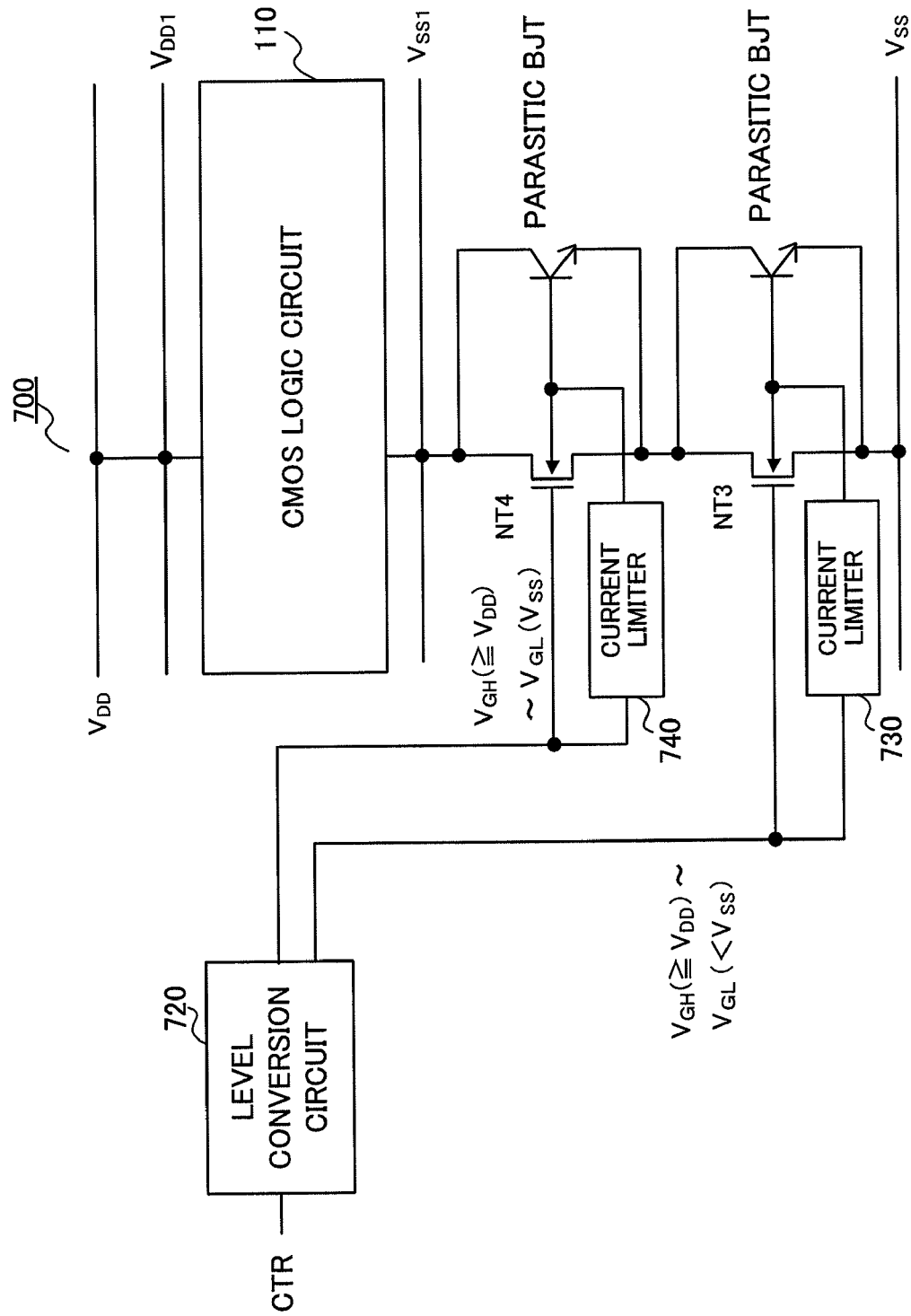
FIG. 14 shows an equivalence circuit for a power control NchMOS transistor according to Embodiment 7.

FIG. 14 shows an equivalence circuit for power control NchMOS transistors NT3 and NT4.

As shown in FIG. 14, the structure is such that a parasitic BJT is added in parallel with the current control NchMOS transistors NT3 and NT4, so that the total on resistance of the power control transistors is further lowered as a result of the on resistance effects due to the parasitic BJT.

For example, in the case of applying 1.0V to the gates of power control NchMOS transistors NT3 and NT4, when the on resistance of the BJT becomes twice the on resistance of the power control NchMOS transistors NT3 and NT4, the total on resistance of the power control NchMOS transistors NT3 and NT4 and BJT of this embodiment becomes approximately 60% or less of the total on resistance of power control NchMOS transistors NT3 and NT4 of the related art example when gate voltage is taken to be 1.0V, and it is possible to increase the current supply performance to CMOS logic circuit 110 at the time of operation.

Further, if the on resistance is in the order of the same as the related art, it is possible to reduce the surface area of the power control MOS transistors NT3 and NT4 by approximately 60% or less.

Embodiment 8

Embodiment 8 is an example applied to a semiconductor integrated circuit apparatus using serially connected power control PchMOS transistors PT3 and PT4 where the gate and the substrate are electrically connected.

Figure 15:
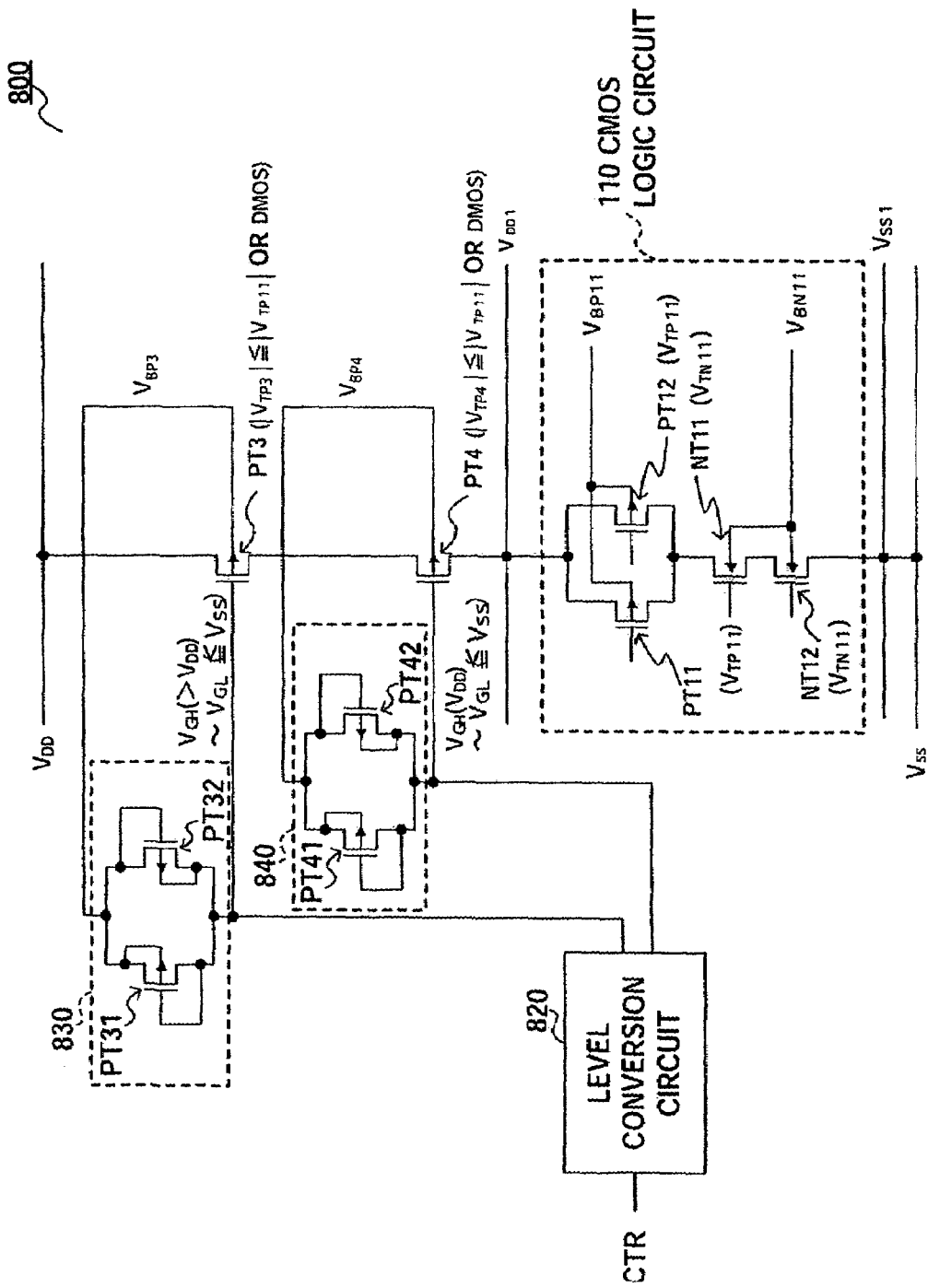
FIG. 15 is a circuit diagram showing a configuration for semiconductor integrated circuit apparatus having a power control function according to Embodiment 8 of the present invention.

FIG. 15 is a circuit diagram showing a configuration for semiconductor integrated circuit apparatus having a power control function according to Embodiment 8 of the present invention. Embodiment 8 is an example applied to a semiconductor integrated circuit apparatus equipped with a CMOS logic circuit, power control PchMOS transistors PT3 and PT4, and a level conversion circuit. Portions with the same configuration as for FIG. 9 are given the same numerals and are not described.

In FIG. 15, semiconductor integrated circuit apparatus 800 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control PchMOS transistors PT3 and PT4 connected in series across high potential side power supply line $V_{DD}$ and first pseudo power supply line $V_{DD1}$, level conversion circuit 820 for converting a signal voltage level applied to a gate of power control PchMOS transistors PT3 and PT4, current limiter 830 arranged across a gate and substrate of power control PchMOS transistor PT3 utilizing a source follower of depletion type PchMOS transistors PT31 and PT32, and current limiter 840 arranged across the gate and substrate of power control PchMOS transistor PT4 utilizing a source follower of depletion type PchMOS transistors PT41 and PT42.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control PchMOS transistor PT3 has a drain connected to the source of power control PchMOS transistor PT4, a source connected to high potential side power supply line $V_{DD}$, and a substrate and gate that are electrically connected. Power control PchMOS transistor PT4 adopts a configuration where a drain is connected to first pseudo power supply line $V_{DD1}$, a source is connected to high potential side power supply line $V_{DD}$, and a substrate and gate are electrically connected. The respective gates and substrates of power control PchMOS transistor PT3 and PT4 may also, for example, be connected via current limiters 830 and 840 utilizing a source follower of a depletion type PchMOS transistor.

The absolute value of the threshold voltage of power control PchMOS transistors PT3 and PT4 is set to be smaller than the absolute value of the second threshold voltage of the plurality of PchMOS transistors PT11 and PT12 constituting CMOS logic circuit 110 or is set to be a depletion type. Further, at the gate of power control PchMOS transistor PT3, a voltage higher than the potential of high potential side power supply line $V_{DD}$ is applied as a high level, a voltage that is the same or lower than the potential of low potential side power supply line $V_{SS}$ is applied as a low level, a voltage that is the same as the potential of high potential side power supply line $V_{DD}$ is applied to the gate of power control PchMOS transistor PT4 as a high level, and a voltage that is the same or lower than the potential of low potential side power supply line $V_{SS}$ is applied as a low level.

A low level applied to a gate of power control PchMOS transistors PT3 and PT4 is decided by the threshold voltage of power control PchMOS transistors PT3 and PT4 and a value set for on resistance, and is by no means limited to be a voltage that is the same or lower than the potential of low potential side power supply line $V_{SS}$, and may also be a voltage higher than the potential of low potential side power supply line $V_{SS}$.

Level conversion circuit 820 receives control input signal CTR, converts a signal voltage level, and outputs a high level signal and a low level signal applied to the gate of power control PchMOS transistors PT3 and PT4.

A description is now given of the operation of semiconductor integrated circuit apparatus 800 of the configuration described above.

For example, it is taken that CMOS logic circuit 110 is configured from an NchMOS transistor of a threshold voltage of 0.2V and a PchMOS transistor of a threshold voltage of −0.2V. Further, the threshold voltage of power control NchMOS transistors PT3 and PT4 is taken to be 0.1V (depletion type). Moreover, low potential side power supply line $V_{SS}$ is taken to be 0V, and high potential side power supply line $V_{DD}$ is taken to be 1.0V. A voltage applied to a gate of power control PchMOS transistor PT3 via level conversion circuit 820 is taken to be a high level of 1.4V, and a low level of 0V that is the same voltage as low potential side power supply line $V_{SS}$. Further, a voltage applied to the gate of power control PchMOS transistor PT4 is taken to be a high level of 1.0V, and a low level of 0V.

Here, as in Embodiment 7, as the voltage applied across the gate and source and across the substrate and source of power control PchMOS transistor PT3 is a sufficiently large positive voltage of 0.4V more than high potential side power supply line $V_{DD}$, leakage current of power control PchMOS transistor PT3 in a standby state is such that it is possible to put power control PchMOS transistor PT3 into a cut-off state suppressing leakage current. Further, the high level applied to the gate and substrate of power control PchMOS transistor PT4 is 1.0V, so that the source potential of power control PchMOS transistor PT4, namely the drain potential of power control PchMOS transistor PT3 is stable at approximately 0.6V. Therefore, as in Embodiment 4, in the case of a configuration using only power control PchMOS transistor PT2, a voltage of 1.4V is applied across the gate and drain of power control PchMOS transistor PT2, but in the case of a configuration using PchMOS transistors of both PT3 and PT4, the voltage applied across the gate and drain of power control PchMOS transistors PT3 and PT4 is kept low at 1.0V or less.

Further, as in Embodiment 7, on resistance of power control PchMOS transistors PT3 and PT4 at the time of operation is such that a forward bias is applied to power control PchMOS transistors PT3 and PT4, the threshold voltage of the power control PchMOS transistors is further higher, and it becomes easy for current to flow.

Moreover, as in Embodiment 7, a structure is adopted where a parasitic BJT is added in parallel with power control PchMOS transistors PT3 and PT4. Total on resistance of the power control transistors is therefore approximately 60% or less due to the effects of on resistance due to the parasitic BJT, and it is possible to increase the current supply performance to CMOS logic circuit 110 at the time of operation.

Further, if the on resistance is in the order of the same as the related art, it is possible to reduce the surface area of the power control MOS transistor by approximately 60% or less.

Embodiment 9

Embodiment 9 is an example applied to a semiconductor integrated circuit apparatus using serially connected power control NchMOS transistors NT5 and NT6 where the gate and the substrate are electrically connected, and taking a single current limiter.

Figure 16:
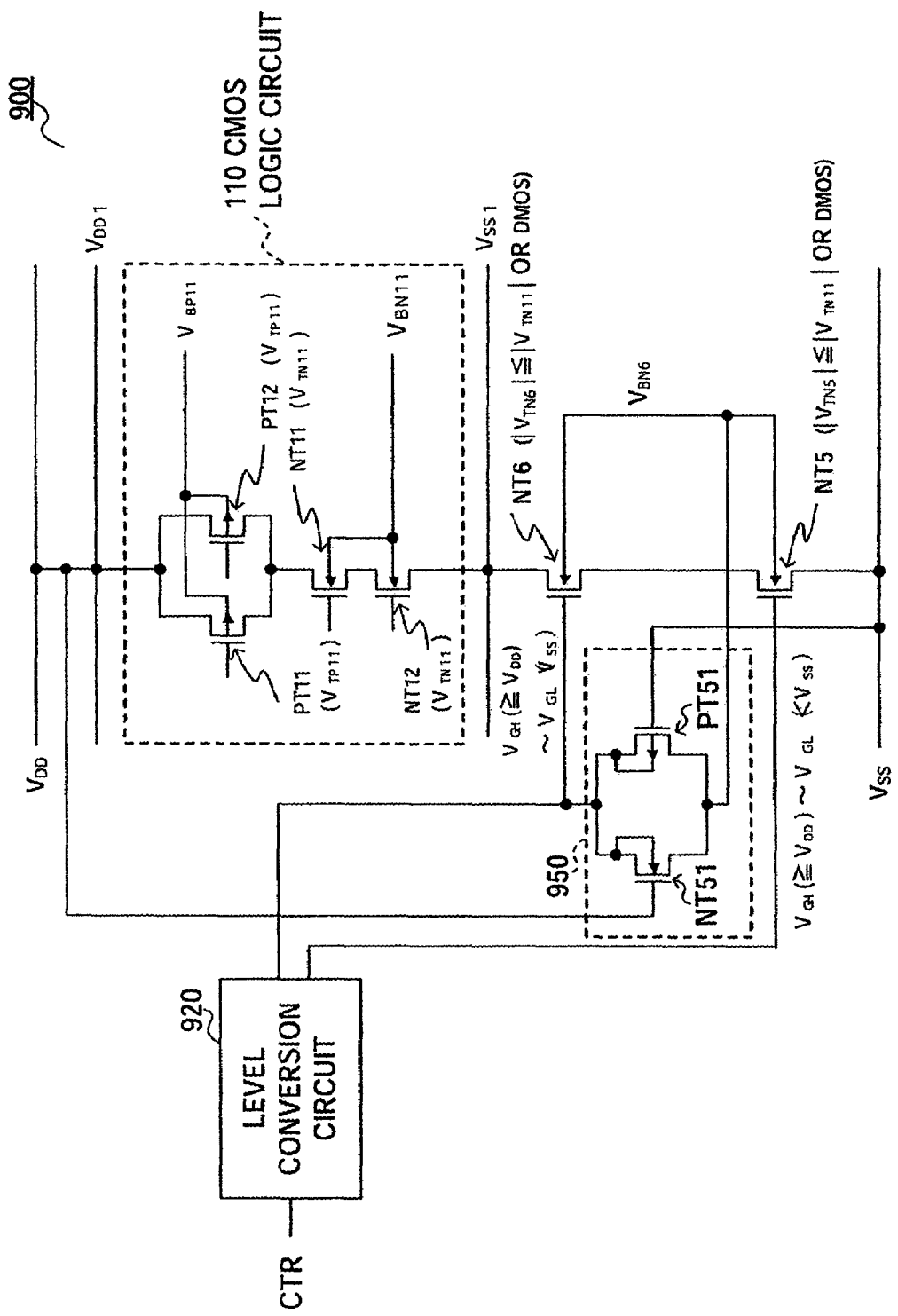
FIG. 16 is a circuit diagram showing a configuration for a semiconductor integrated circuit apparatus having a power control function according to Embodiment 9 of the present invention.

FIG. 16 is a circuit diagram showing a configuration for a semiconductor integrated circuit apparatus having a power control function according to Embodiment 9 of the present invention. This embodiment is an example applied to a semiconductor integrated circuit apparatus equipped with a CMOS logic circuit, power control NchMOS transistors NT5 and NT6, and a level conversion circuit. Portions with the same configuration as for FIG. 13 are given the same numerals and are not described.

In FIG. 16, semiconductor integrated circuit apparatus 900 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control NchMOS transistors NT5 and NT6 connected in series with second pseudo power supply line $V_{SS1}$ and low potential side power supply line $V_{SS}$, level conversion circuit 920 for converting a signal voltage level applied to the gates of power control NchMOS transistors NT5 and NT6, and current limiter 950 utilizing an analog switch arranged across the gate and substrate of power control NchMOS transistor NT5 and power control NchMOS transistor NT6, with sources and drains of NchMOS transistor NT51 where high potential side power supply line $V_{DD}$ is applied to the gate, and PchMOS transistor PT51 where low potential side power supply line $V_{SS}$ is applied to the gate being connected together.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control NchMOS transistor NT5 has a drain connected to the source of power control NchMOS transistor NT6, and a source connected to low potential side power supply line $V_{SS}$. Power control NchMOS transistor NT6 adopts a configuration where a drain is connected to second pseudo power supply line $V_{SS1}$, and the substrate of power control NchMOS transistor NT5 and the substrate of power control NchMOS transistor NT6 are connected to the gate of power control NchMOS transistor NT6. The gate and substrate may, for example, also be connected via a current limiter utilizing an analog switch with the sources and drains of NchMOS transistor NT51 where high potential side power supply line $V_{DD}$ is applied to a gate and PchMOS transistor PT51 where low potential side power supply line $V_{SS}$ is applied to a gate being connected together.

The absolute value of the threshold voltage of power control NchMOS transistors NT5 and NT6 is set to be less than the absolute value of the first threshold voltage of the plurality of NchMOS transistors NT11 and NT12 constituting CMOS logic circuit 110 or the power control NchMOS transistors NT5 and NT6 are set to be depletion types. A voltage lower than the potential of low potential side power supply line $V_{SS}$ is applied as a low level to the gate of power control NchMOS transistor NT5, and a voltage that is the same or higher than the potential of high potential side power supply line $V_{DD}$ is applied as a high level, a voltage that is the same as the potential of low potential side power supply line $V_{SS}$ is applied to the gate of power control NchMOS transistor NT6 as a low level, and a voltage that is the same or higher than the potential of high potential side power supply line $V_{DD}$ is applied as a high level.

A high level applied to a gate of power control NchMOS transistors NT5 and NT6 is decided by the threshold voltage of power control NchMOS transistor NT5 and NT6 and a value set for on resistance, and is by no means limited to be a voltage that is the same or higher than the potential of high potential side power supply $V_{DD}$, and may also be a voltage lower than the potential of high potential side power supply line $V_{DD}$.

Level conversion circuit 920 receives control input signal CTR, converts a signal voltage level, and outputs a high level signal and a low level signal applied to the gate of power control NchMOS transistors NT5 and NT6.

A description is now given of the operation of semiconductor integrated circuit apparatus 900 of the configuration described above.

For example, it is taken that CMOS logic circuit 110 is configured from an NchMOS transistor of a threshold voltage of 0.2V and a PchMOS transistor of a threshold voltage of −0.2V. Further, the threshold voltage of power control NchMOS transistors NT5 and NT6 is taken to be −0.1V (depletion type). Moreover, low potential side power supply line $V_{SS}$ is taken to be 0V, and high potential side power supply line $V_{DD}$ is taken to be 1.0V. A voltage applied to a gate of power control NchMOS transistor NT5 via level conversion circuit 920 is taken to be a low level of −0.5V, and a high level of 1.0V that is the same voltage as the high potential side power supply line $V_{DD}$. Further, a voltage applied to the gate of power control NchMOS transistor NT6 is taken to be a low level of 0V and a high level of 1.0V.

Here, considering the leakage current of a power control NchMOS transistor in a standby state, even if, for example, power control NchMOS transistor NT5 is a depletion type NchMOS transistor, a voltage applied across a gate and source is a sufficiently large negative voltage of −0.5V, and it is therefore possible to put power control NchMOS transistor NT5 into a cut-off state suppressing leakage current. Further, the low level applied to the gate and substrate of power control NchMOS transistor NT6 is 0V, so that the source potential of power control NchMOS transistor NT6, namely the drain potential of power control NchMOS transistor NT5 is stable at approximately 0.4V. Therefore, as shown in Embodiment 3, in the case of a configuration using only power control NchMOS transistor NT2, a voltage of 1.4V is applied across the gate and drain of power control NchMOS transistor NT2, but in the case of a configuration using both NchMOS transistors of power control NchMOS transistors NT5 and NT6, a voltage applied across the gate and drain of power control NchMOS transistors NT5 and NT6 is kept low at 1.0V or less, and a configuration is therefore possible having the same gate and drain withstand voltage as the MOS transistor constituting CMOS logic circuit 110.

Further, on resistance of power control NchMOS transistors NT5 and NT6 at the time of operation is compared with a related art example. In the related art example, the substrates of power control NchMOS transistors NT5 and NT6 are connected to low potential side power supply line $V_{SS}$ but in this embodiment, the substrates of power control NchMOS transistors NT5 and NT6 are connected to the gate of power control NchMOS transistor NT6, so that when 1.0V is applied across the gate and source, approximately 0.7V is applied across the substrate and source. A forward bias is therefore applied to power control NchMOS transistors NT5 and NT6, the threshold voltages of power control NchMOS transistors NT5 and NT6 is further lower, and it becomes easy for current to flow.

Figure 17:
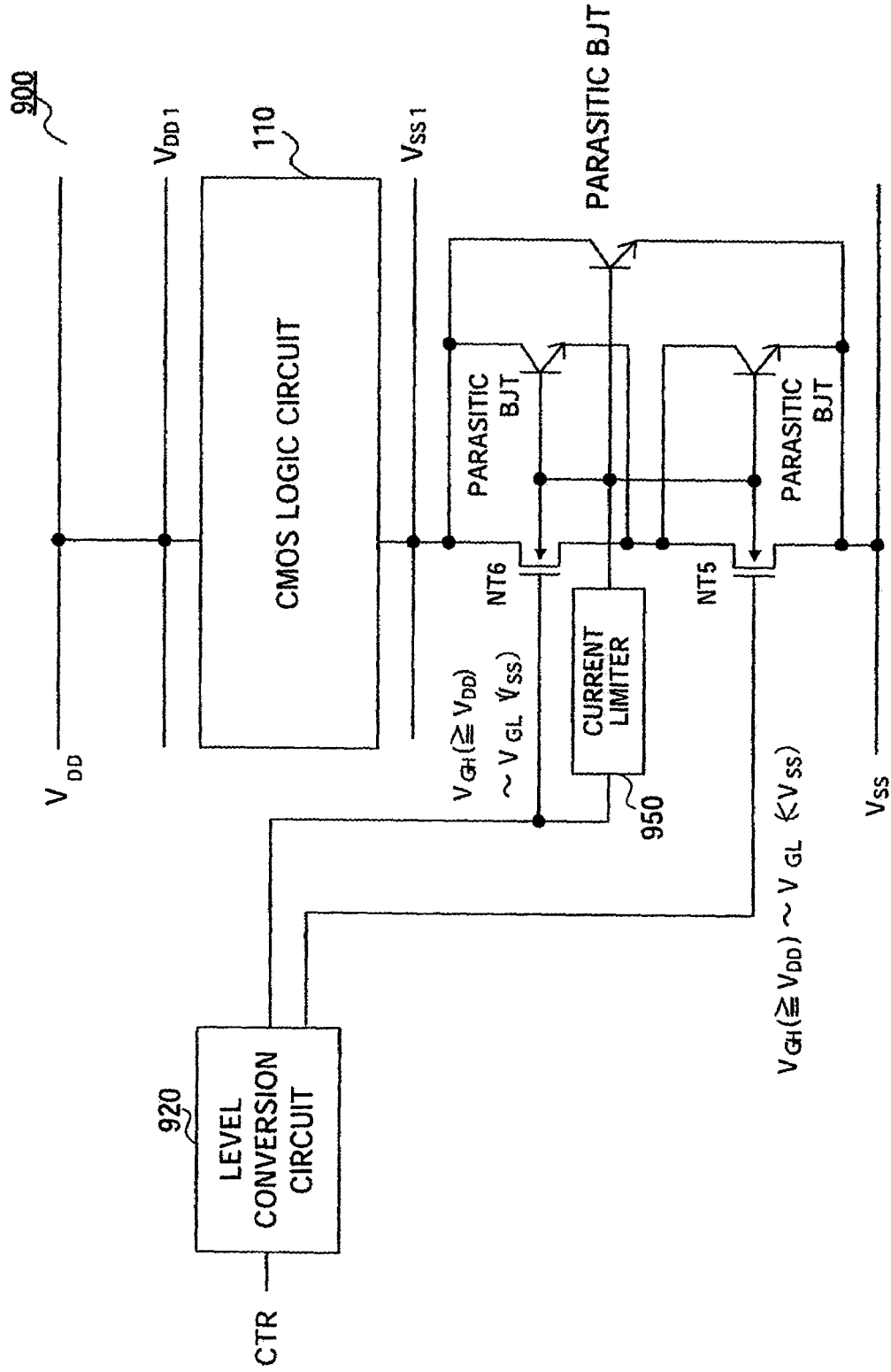
FIG. 17 shows an equivalence circuit for a power control NchMOS transistor according to Embodiment 9.

FIG. 17 shows an equivalence circuit for power control NchMOS transistors NT5 and NT6.

As shown in FIG. 17, a structure is adopted where a parasitic BJT is added in parallel with power control NchMOS transistors NT5 and NT6, and a parasitic BJT is also added across the source of power control NchMOS transistor NT5 and the drain of NT6. Namely, three parasitic BJT's can be made. As a result, it is possible to further lower total on resistance of the power control transistors using the synergy effect of the on resistance due to the parasitic BJT. It is then possible to obtain an effect of further increasing the current supply performance when amplification rate is increased by making base length across the emitter and collector of the parasitic BJT across the source of power control NchMOS transistor NT5 and the drain of power control NchMOS transistor NT6 short.

For example, in the event that the high level of the gate voltage applied to power control NchMOS transistors NT5 and NT6 is taken to be 1.0V that is the same voltage as high potential side power supply line $V_{DD}$, when the on resistance of BJT becomes twice the on resistance of the NchMOS transistor, the total on resistance of power control NchMOS transistors NT5 and NT6 and BJT of this embodiment becomes approximately half or less of the on resistance of NchMOS transistors NT5 and NT6 of the related art at the time the gate voltage is taken to be 1.0V, and it is possible to increase the current supply performance to CMOS logic circuit 110 at the time of operation.

Further, if the on resistance is in the order of the same as the related art, it is possible to reduce the surface area of the power control MOS transistors by approximately half or less.

Embodiment 10

Embodiment 10 is an example applied to a semiconductor integrated circuit apparatus using serially connected power control PchMOS transistors PT5 and PT6 where the gate and the substrate are electrically connected, and taking a single current limiter.

Figure 18:
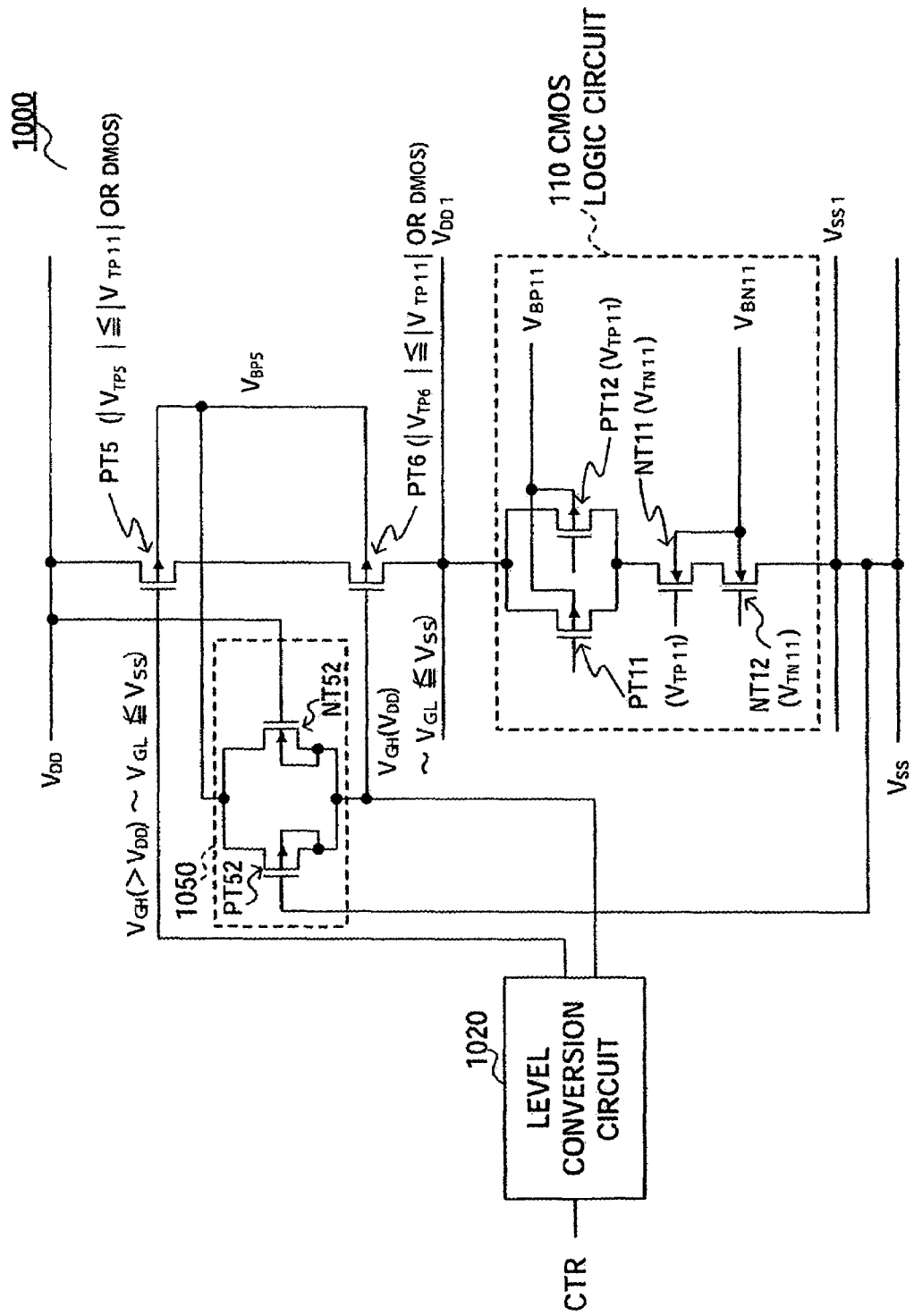
FIG. 18 is a circuit diagram showing a configuration for a semiconductor integrated circuit apparatus having a power control function according to Embodiment 10 of the present invention.

FIG. 18 is a circuit diagram showing a configuration for a semiconductor integrated circuit apparatus having a power control function according to Embodiment 10 of the present invention. This embodiment is an example applied to a semiconductor integrated circuit apparatus equipped with a CMOS logic circuit, power control PchMOS transistors PT5 and PT6 and a level conversion circuit. Portions with the same configuration as for FIG. 15 are given the same numerals and are not described.

In FIG. 18, semiconductor integrated circuit apparatus 1000 is comprised of CMOS logic circuit 110, first pseudo power supply line $V_{DD1}$ connected to a high potential side power supply terminal section of CMOS logic circuit 110, second pseudo power supply line $V_{ss1}$ connected to a low potential side power supply terminal section of CMOS logic circuit 110, power control PchMOS transistors PT5 and PT6 connected in series with high potential side power supply line $V_{DD}$ and first pseudo power supply line $V_{DD1}$, level conversion circuit 1020 for converting a signal voltage level applied to the gates of power control PchMOS transistors PT5 and PT6, and current limiter 1050 utilizing an analog switch arranged across the gate and substrate of power control PchMOS transistor PT5 and power control PchMOS transistor PT6, with sources and drains of NchMOS transistor NT52 where high potential side power supply line $V_{DD}$ is applied to the gate and PchMOS transistor PT52 where low potential side power supply line $V_{SS}$ is applied to the gate being connected together.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control PchMOS transistor PT5 has a drain connected to the source of power control PchMOS transistor PT6, and a source connected to high potential side power supply line $V_{DD}$. Power control PchMOS transistor PT6 adopts a configuration where a drain is connected to first pseudo power supply line $V_{DD1}$, and the substrate of power control PchMOS transistor PT5 and the substrate of power control PchMOS transistor PT6 are connected to the gate of PT6. The gate and substrate may, for example, also be connected via a current limiter utilizing an analog switch with the sources and drains of NchMOS transistor where high potential side power supply line $V_{DD}$ is applied to a gate and PchMOS transistor where low potential side power supply line $V_{SS}$ is applied to a gate being connected together.

The absolute value of the threshold voltage of power control PchMOS transistors PT5 and PT6 is set to be lower than the absolute value of the second threshold voltage of the plurality of PchMOS transistors PT11 and PT12 constituting CMOS logic circuit 110 or the power control PchMOS transistors PT5 and PT6 are set to be depletion types. At the gate of PT5, a voltage higher than the potential of high potential side power supply line $V_{DD}$ is applied as a high level, a voltage that is the same or lower than the potential of low potential side power supply line $V_{SS}$ is applied as a low level, a voltage that is the same as the potential of high potential side power supply line $V_{DD}$ is applied to the gate of PT6 as a high level, and a voltage that is the same or lower than the potential of low potential side power supply line $V_{SS}$ is applied as a low level.

A low level applied to gates of power control PchMOS transistors PT5 and PT6 is decided by the threshold voltage of power control PchMOS transistors PT5 and PT6 and a value set for on resistance, and is by no means limited to be a voltage that is the same or lower than the potential of low potential side power supply line $V_{SS}$, and may also be a voltage higher than the potential of low potential side power supply line $V_{SS}$.

Level conversion circuit 1020 receives control input signal CTR, converts a signal voltage level, and outputs a high level signal and a low level signal applied to the gates of power control PchMOS transistors PT5 and PT6.

A description is now given of the operation of semiconductor integrated circuit apparatus 1000 of the configuration described above.

For example, it is taken that CMOS logic circuit 110 is configured from an NchMOS transistor of a threshold voltage of 0.2V and a PchMOS transistor of a threshold voltage of −0.2V. Further, the threshold voltage of power control NchMOS transistors PT5 and PT6 is made to be 0.1V (depletion type). Moreover, low potential side power supply line $V_{SS}$ is taken to be 0V, and high potential side power supply line $V_{DD}$ is taken to be 1.0V. A voltage applied to a gate of power control PchMOS transistor PT5 via level conversion circuit 1020 is taken to be a high level of, for example, 1.5V, and a low level of 0V that is the same voltage as the low potential side power supply line $V_{SS}$. Further, a voltage applied to the gate of power control PchMOS transistor PT6 is taken to be a high level of 1.0V, and a low level of 0V.

Here, as in Embodiment 9, the voltage applied across the gate and source of power control PchMOS transistor PT5 is a sufficiently large positive voltage of 0.5V more than high potential side power supply line $V_{DD}$, so that leakage current of power control PchMOS transistor PT5 in a standby state is such that it is possible to put power control PchMOS transistor PT5 into a cut off state suppressing leakage current. Further, the high level applied to the gate and substrate of power control PchMOS transistor PT6 is 1.0V, so that the source potential of power control PchMOS transistor PT6, namely the drain potential of power control PchMOS transistor PT5 is stable at approximately 0.6V. Therefore, as shown in Embodiment 4, in the case of a configuration using only power control PchMOS transistor PT2, a voltage of 1.4V is applied across the gate and drain of power control PchMOS transistor PT2, but in the case of a configuration using PchMOS transistors of both power control PchMOS transistors PT5 and PT6, the voltage applied across the gate and drain of power control PchMOS transistors PT5 and PT6 is kept low at 1.0V or less.

Further, as in Embodiment 9, on resistance of power control PchMOS transistors PT5 and PT6 at the time of operation is such that a forward bias is applied to power control PchMOS transistors PT5 and PT6, the threshold voltage of the PchMOS transistors is further higher, and it becomes easy for current to flow.

Moreover, as in Embodiment 9, a structure is adopted where a parasitic BJT is added in parallel with power control PchMOS transistors PT5 and PT6, and a parasitic BJT is added across the source of power control PchMOS transistor PT5 and the drain of power control PchMOS transistor PT6. It is therefore possible to lower total on resistance of the power control transistors to approximately half or less as a result of the effects of on resistance due to the parasitic BJT, and it is possible to increase the current supply performance to CMOS logic circuit 110 at the time of operation.

Further, if the on resistance is in the order of the same as the related art, it is possible to reduce the surface area of the power control MOS transistors by approximately half or less.

Embodiment 11

Embodiment 11 is an example applied to a semiconductor integrated circuit apparatus using serially connected power control NchMOS transistors NT7 and NT8 where the gate and the substrate are electrically connected, and taking a single current limiter. Further, the gate of the MOS transistor constituting the current limiter is fixed at low potential side power supply line $V_{SS}$.

Figure 19:
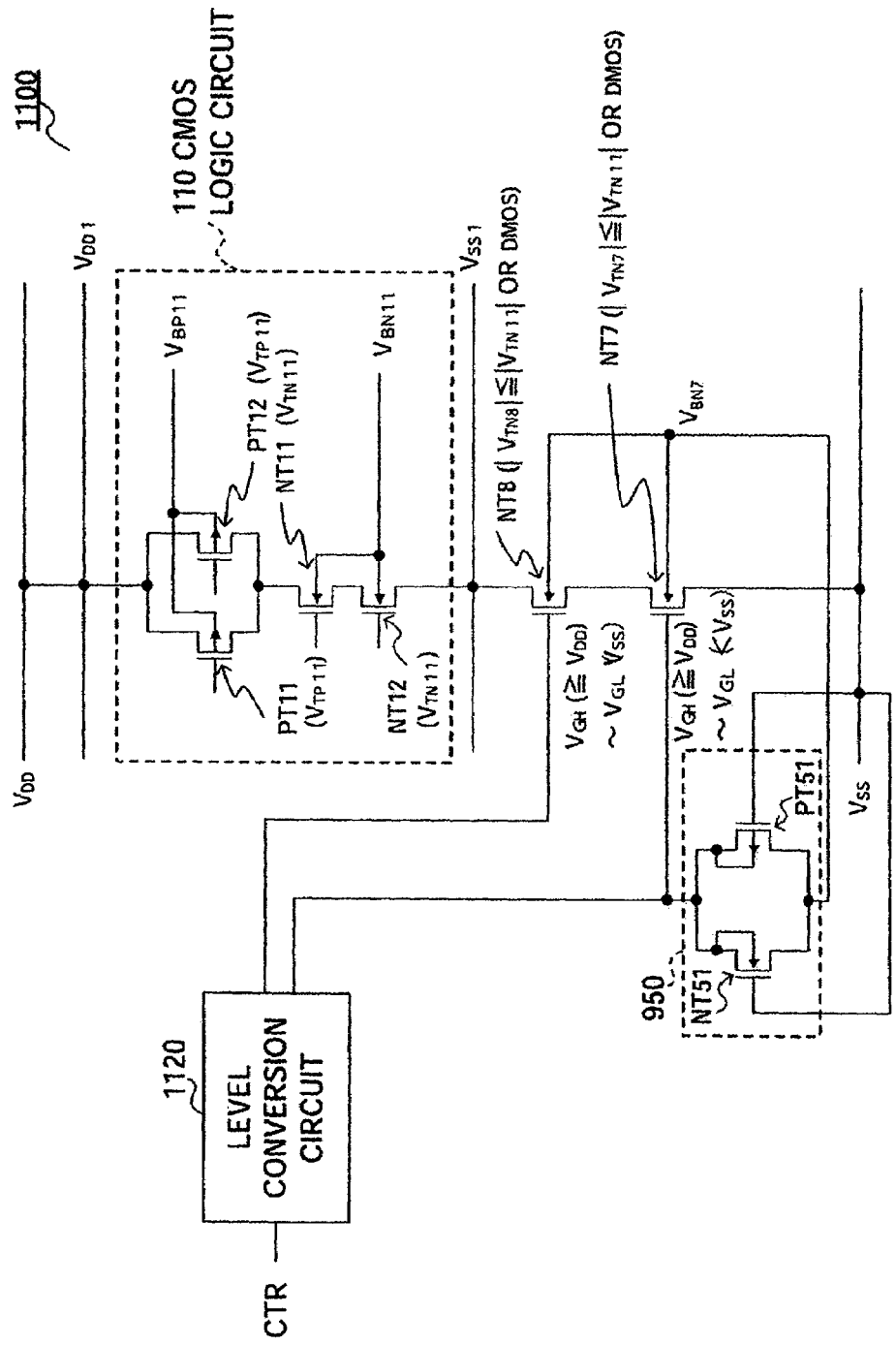
FIG. 19 is a circuit diagram showing a configuration for a semiconductor integrated circuit apparatus having a power control function according to Embodiment 11 of the present invention.

FIG. 19 is a circuit diagram showing a configuration for a semiconductor integrated circuit apparatus having a power control function according to Embodiment 11 of the present invention. This embodiment is an example applied to a semiconductor integrated circuit apparatus equipped with a CMOS logic circuit, power control NchMOS transistors NT7 and NT8, and a level conversion circuit. Portions with the same configuration as for FIG. 16 are given the same numerals and are not described.

In FIG. 19, semiconductor integrated circuit apparatus 1100 is comprised of CMOS logic circuit 110, first pseudo power supply line $V_{DD1}$ connected to a high potential side power supply terminal section of CMOS logic circuit 110, second pseudo power supply line $V_{SS1}$ connected to a low potential side power supply terminal section of CMOS logic circuit 110, power control NchMOS transistors NT7 and NT8 connected in series with second pseudo power supply line $V_{SS1}$ and low potential side power supply line $V_{SS}$, level conversion circuit 1120 for converting a signal voltage level applied to the gates of power control NchMOS transistors NT7 and NT8, and current limiter 950 utilizing an analog switch arranged across the gate and substrate of power control NchMOS transistor NT7 and power control NchMOS transistor NT8, with sources and drains of NchMOS transistor NT51 where low potential side power supply line $V_{SS}$ is applied to the gate and PchMOS transistor PT51 being connected together.

This embodiment is such that the connection of the power supply line to current limiter 950 is different to that of Embodiment 9. Namely, current limiter 950 of semiconductor integrated circuit apparatus 900 of FIG. 16 has high potential side power supply line $V_{DD}$ connected to the gate of NchMOS transistor NT51 constituting current limiter 950, and has low potential side power supply line $V_{SS}$ connected to the gate of PchMOS transistor PT51, but current limiter 950 of semiconductor integrated circuit 1100 of this embodiment has the gate of NchMOS transistor NT51 and the gate of PchMOS transistor PT51 both connected to low potential side power supply line $V_{SS}$.

As in Embodiment 1, CMOS logic circuit 110 is comprised of a plurality of NchMOS transistors NT11 and NT12 having a first threshold voltage and a plurality of PchMOS transistors PT11 and PT12, having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control NchMOS transistor NT7 has a drain connected to the source of power control NchMOS transistor NT8, and a source connected to low potential side power supply line $V_{SS}$. Power control NchMOS transistor NT8 adopts a configuration where a drain is connected to second pseudo power supply line $V_{SS1}$, and the substrate of power control NchMOS transistor NT7 and the substrate of power control NchMOS transistor NT8 are connected to the gate of NT7. The gate and substrate may, for example, also be connected via current limiter 950 utilizing an analog switch with the sources and drains of an NchMOS transistor and a PchMOS transistor where low potential side power supply line $V_{SS}$ is applied to a gate being connected together.

The absolute value of the threshold voltage of power control NchMOS transistors NT7 and NT8 is set to be less than the absolute value of the first threshold voltage of the plurality of NchMOS transistors NT11 and NT12 constituting CMOS logic circuit 110 or the power control NchMOS transistors NT7 and NT8 are set to be a depletion type. A voltage lower than the potential of low potential side power supply line $V_{SS}$ is applied as a low level to the gate of power control NchMOS transistor NT7, and a voltage that is the same or higher than the potential of high potential side power supply line $V_{DD}$ is applied as a high level, a voltage that is the same as the potential of low potential side power supply line $V_{SS}$ is applied to the gate of power control NchMOS transistor NT8 as a low level, and a voltage that is the same or higher than the potential of high potential side power supply line $V_{DD}$ is applied as a high level.

A high level applied to gates of power control NchMOS transistors NT7 and NT8 is decided by the threshold voltage of power control NchMOS transistors NT7 and NT8 and a value set for on resistance, and is by no means limited to be a voltage that is the same or higher than the potential of high potential side power supply line $V_{DD}$, and may also be a voltage lower than the potential of high potential side power supply line $V_{DD}$.

Level conversion circuit 1120 receives control input signal CTR, converts a signal voltage level, and outputs a high level signal and a low level signal applied to the gates of power control NchMOS transistors NT7 and NT8.

A description is now given of the operation of semiconductor integrated circuit apparatus 1100 of the configuration described above.

For example, it is taken that CMOS logic circuit 1100 is configured from an NchMOS transistor of a threshold voltage of 0.2V and a PchMOS transistor of a threshold voltage of −0.2V. Further, the threshold voltage of power control NchMOS transistors NT7 and NT8 is taken to be −0.1V (depletion type). Moreover, low potential side power supply line $V_{SS}$ is taken to be 0V, and high potential side power supply line $V_{DD}$ is taken to be 1.0V. A voltage applied to a gate of power control NchMOS transistor NT7 via level conversion circuit 1120 is taken to be a low level of −0.4V, and a high level of 1.0V that is the same voltage as high potential side power supply line $V_{DD}$. Further, a voltage applied to the gate of power control NchMOS transistor NT8 is taken to be a low level of 0V and a high level of 1.0V.

Here, considering the leakage current of a power control NchMOS transistor in a standby state, even if, for example, power control NchMOS transistor NT7 is a depletion type NchMOS transistor, a voltage applied across a gate and source and across substrate and source is a sufficiently large negative voltage of −0.4V, and it is therefore possible to put power control NchMOS transistor NT7 into a cut-off state suppressing leakage current. Further, the low level applied to the gate and substrate of power control NchMOS transistor NT8 is 0V, so that the source potential of power control NchMOS transistor NT8, namely the drain potential of power control NchMOS transistor NT7 is stable at approximately 0.3V. Therefore, as shown in Embodiment 3, in the case of a configuration using only power control NchMOS transistor NT2, a voltage of 1.4V is applied across the gate and drain of power control NchMOS transistor NT2, but in the case of a configuration using both NchMOS transistors of power control NchMOS transistors NT7 and NT8, a voltage applied across the gate and drain of power control NchMOS transistors NT7 and NT8 is kept low at 1.0V or less, and a configuration is therefore possible having the same gate and drain withstand voltage as the MOS transistor constituting CMOS logic circuit 110.

Next, on resistance of power control NchMOS transistors NT7 and NT8 at the time of operation is compared with a related art example. In the related art example, the substrates of power control NchMOS transistors NT7 and NT8 are connected to low potential side power supply line $V_{SS}$ but in this embodiment, the substrates of power control NchMOS transistors NT7 and NT8 are connected to the gate of power control NchMOS transistor NT7, so that when 1.0V is applied across the gate and source, approximately 0.7V is applied across the substrate and source. A forward bias is therefore applied to power control NchMOS transistors NT7 and NT8, the threshold voltages of power control NchMOS transistors NT7 and NT8 is further lowered, and it becomes easy for current to flow.

Figure 20:
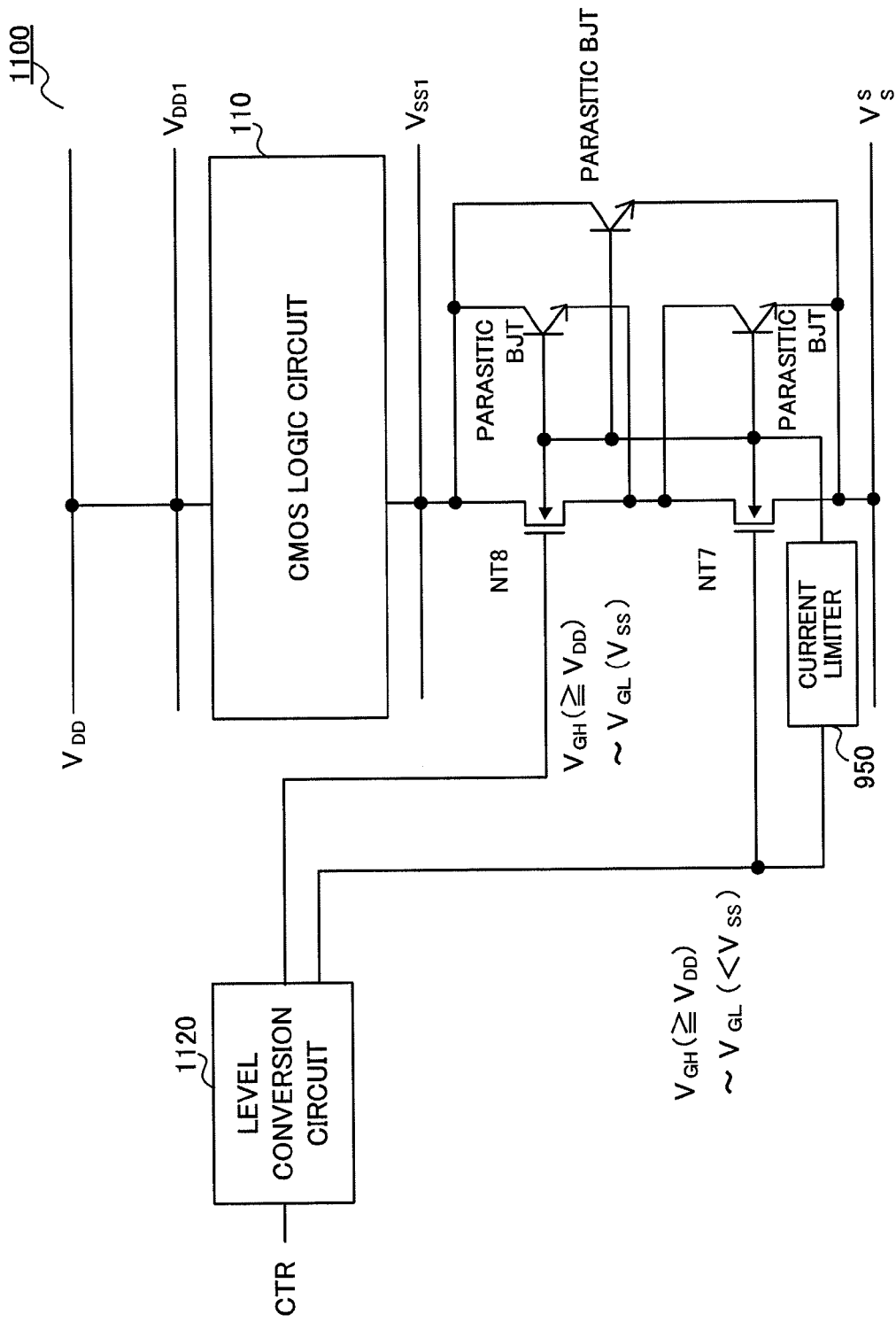
FIG. 20 shows an equivalence circuit for a power control NchMOS transistor according to Embodiment 11.

FIG. 20 shows an equivalence circuit for power control NchMOS transistors NT7 and NT8.

As shown in FIG. 20, a structure is adopted where a parasitic BJT is added in parallel with power control NchMOS transistors NT7 and NT8, and a parasitic BJT is also added across the source of power control NchMOS transistor NT7 and the drain of NT8. Namely, three parasitic BJT's can be made. As a result, it is possible to further lower total on resistance of the power control transistors using the synergy effect of the on resistance due to the parasitic BJT. It is then possible to obtain a substantial increase in the amplification rate by making base length across the emitter and collector of the parasitic BJT across the source of power control NchMOS transistor NT7 and the drain of power control NchMOS transistor NT8 short.

For example, when the high level of the gate voltage applied to power control NchMOS transistors NT7 and NT8 is taken to be 1.0V that is the same voltage as high potential side power supply line $V_{DD}$, if the on resistance of BJT becomes twice the on resistance of the NchMOS transistor, the total on resistance of power control NchMOS transistors NT7 and NT8 and BJT of this embodiment becomes approximately half or less of the on resistance of NchMOS transistors NT7 and NT8 of the related art at the time the gate voltage is taken to be 1.0V, and it is possible to increase the current supply performance to CMOS logic circuit 110 at the time of operation.

Further, if the on resistance is in the order of the same as the related art, it is possible to reduce the surface area of the power control MOS transistors by approximately half or less.

In this embodiment, the gates of NchMOS transistor NT51 and PchMOS transistor PT51 of current limiter 950 constituting an analog switch are fixed to low potential side power supply line $V_{SS}$, namely to a low level. This is so as not to burden the gate of NchMOS transistor NT51 with a high withstand voltage.

Embodiment 12

Embodiment 12 is an example applied to a semiconductor integrated circuit apparatus using serially connected power control PchMOS transistors PT7 and PT8 where the gate and the substrate are electrically connected, and taking a single current limiter. Further, the gate of the MOS transistor constituting the current limiter is fixed at high potential side power supply line $V_{DD}$.

Figure 21:
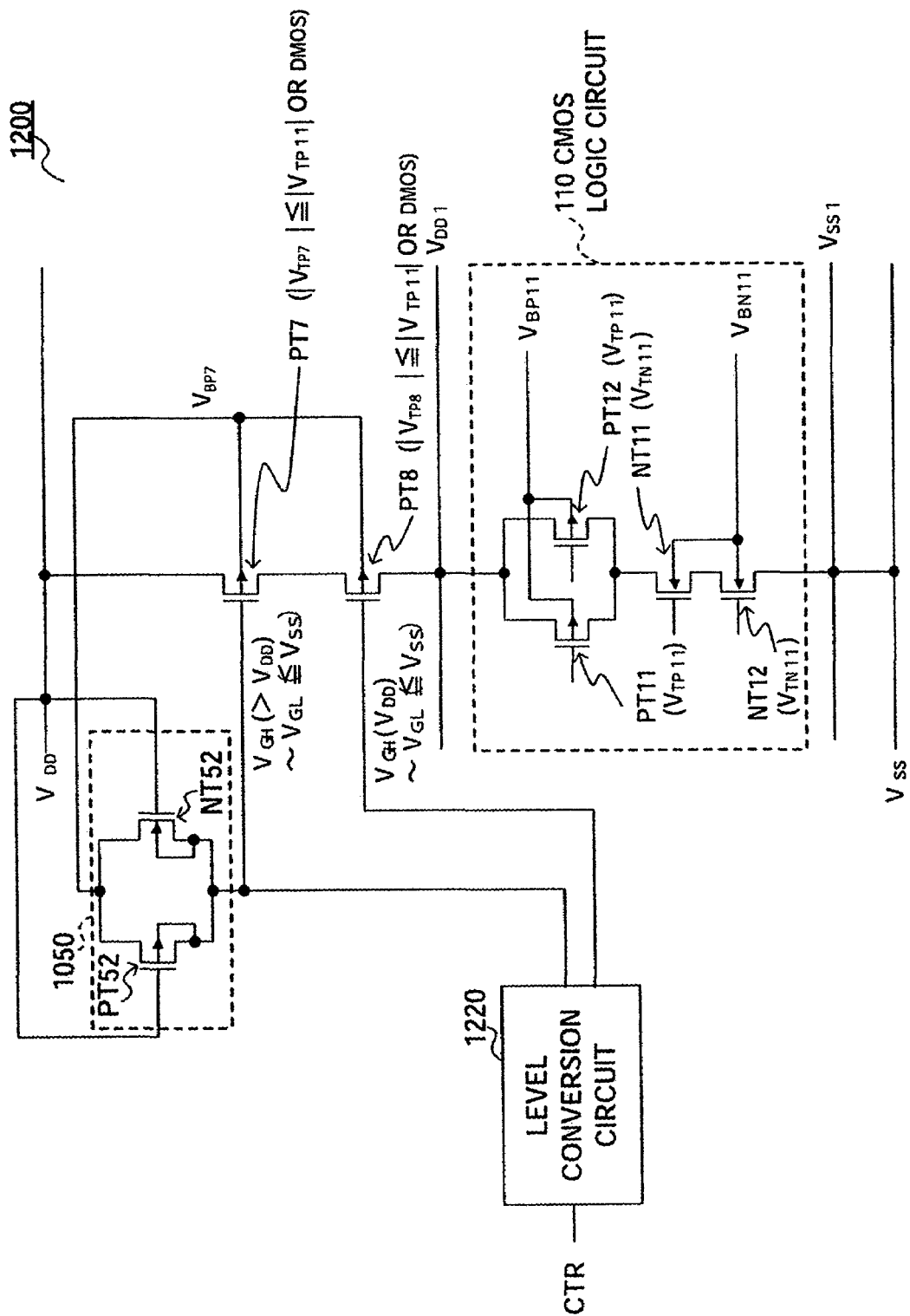
FIG. 21 is a circuit diagram showing a configuration for a semiconductor integrated circuit apparatus having a power control function according to Embodiment 12 of the present invention.

FIG. 21 is a circuit diagram showing a configuration for a semiconductor integrated circuit apparatus having a power control function according to Embodiment 12 of the present invention. This embodiment is an example applied to a semiconductor integrated circuit apparatus equipped with a CMOS logic circuit, power control PchMOS transistors PT7 and PT8 and a level conversion circuit. Portions with the same configuration as for FIG. 18 are given the same numerals and are not described.

In FIG. 21, semiconductor integrated circuit apparatus 1200 is comprised of CMOS logic circuit 110, first pseudo power supply line $V_{DD1}$ connected to a high potential side power supply terminal section of CMOS logic circuit 110, second pseudo power supply line $V_{ss1}$ connected to a low potential side power supply terminal section of CMOS logic circuit 110, power control PchMOS transistors PT7 and PT8 connected in series with high potential side power supply line $V_{DD}$ and first pseudo power supply line $V_{DD1}$, level conversion circuit 1220 for converting a signal voltage level applied to the gates of power control PchMOS transistors PT7 and PT8, and current limiter 1050 utilizing an analog switch arranged across the gate and substrate of power control PchMOS transistor PT7 and power control PchMOS transistor PT8, with sources and drains of NchMOS transistor NT52 where high potential side power supply line $V_{DD}$ is applied to its gate and PchMOS transistor PT52 being connected together.

As in Embodiment 1, CMOS logic circuit 110 is comprised of a plurality of NchMOS transistors NT11 and NT12 having a first threshold voltage and a plurality of PchMOS transistors PT11 and PT12 having a second threshold voltage. The high potential side power supply terminal section of CMOS logic circuit 110 is connected to first pseudo power supply line $V_{DD1}$, and the low potential side power supply terminal section of CMOS logic circuit 110 is connected to second pseudo power supply line $V_{SS1}$.

Power control PchMOS transistor PT7 has a drain connected to the source of power control PchMOS transistor PT8, and a source connected to high potential side power supply line $V_{DD}$. Power control PchMOS transistor PT8 adopts a configuration where a drain is connected to first pseudo power supply line $V_{DD1}$, and the substrate of power control PchMOS transistor PT7 and the substrate of power control PchMOS transistor PT8 are connected to the gate of PT7. The gate and substrate may, for example, also be connected via current limiter 1050 utilizing an analog switch with the sources and drains of NchMOS transistor and PchMOS transistor where high potential side power supply line $V_{DD}$ is applied to a gate being connected together.

The absolute value of the threshold voltage of power control PchMOS transistors PT7 and PT8 is set to be less than the absolute value of the second threshold voltage of the plurality of PchMOS transistors PT11 and PT12 constituting CMOS logic circuit 110 or power control PchMOS transistors PT7 and PT8 are set to be depletion types. At the gate of power control PchMOS transistor PT7, a voltage higher than the potential of high potential side power supply line $V_{DD}$ is applied as a high level, a voltage that is the same or lower than the potential of low potential side power supply line $V_{SS}$ is applied as a low level, a voltage that is the same as the potential of high potential side power supply line $V_{DD}$ is applied to the gate of power control PchMOS transistor PT8 as a high level, and a voltage that is the same or lower than the potential of low potential side power supply line $V_{SS}$ is applied as a low level.

A low level applied to a gate of power control PchMOS transistors PT7 and PT8 is decided by the threshold voltage of power control PchMOS transistors PT7 and PT8 and a value set for on resistance, and is by no means limited to be a voltage that is the same or lower than the potential of low potential side power supply $V_{SS}$, and may also be a voltage higher than the potential of low potential side power supply line $V_{SS}$.

Level conversion circuit 1220 receives control input signal CTR, converts a signal voltage level, and outputs a high level signal and a low level signal applied to the gate of power control PchMOS transistors PT7 and PT8.

A description is now given of the operation of semiconductor integrated circuit apparatus 1200 of the configuration described above.

It is taken that CMOS logic circuit 110 is configured from an NchMOS transistor of a threshold voltage of 0.2V and a PchMOS transistor of a threshold voltage of −0.2V. Further, the threshold voltage of power control NchMOS transistors PT7 and PT8 is taken to be 0.1V (a depletion type). Moreover, low potential side power supply line $V_{SS}$ is taken to be 0V, and high potential side power supply line $V_{DD}$ is taken to be 1.0V. A voltage applied to a gate of power control PchMOS transistor PT7 via level conversion circuit is taken to be a high level of 1.4V, and a low level of 0V that is the same voltage as the low potential side power supply line $V_{SS}$. Further, a voltage applied to the gate of power control PchMOS transistor PT8 is taken to be a high level of 1.0V, and a low level of 0V.

Here, as in Embodiment 11, the voltage applied across the gate and source and across the substrate and source of power control PchMOS transistor PT7 is a sufficiently large positive voltage of 0.4V more than high potential side power supply line $V_{DD}$, so that leakage current of power control PchMOS transistor PT7 in a standby state is such that it is possible to put power control PchMOS transistor PT7 into a cut-off state suppressing leakage current. Further, the high level applied to the gate and substrate of power control PchMOS transistor PT8 is 1.0V, so that the source potential of power control PchMOS transistor PT8, namely the drain potential of power control PchMOS transistor PT7 is stable at approximately 0.7V. Therefore, as shown in Embodiment 4, in the case of a configuration using only power control PchMOS transistor PT2, a voltage of 1.4V is applied across the gate and drain of power control PchMOS transistor PT2, but in the case of a configuration using PchMOS transistors of both power control PchMOS transistors PT7 and PT8, the voltage applied across the gate and drain of power control PchMOS transistor PT7 and PT8 is kept low at 1.0V or less.

Further, as in Embodiment 11, on resistance of power control PchMOS transistors PT7 and PT8 at the time of operation is such that a forward bias is applied to power control PchMOS transistors PT7 and PT8, the threshold voltage of the power control PchMOS transistors is further higher, and it becomes easy for current to flow.

Further, as in Embodiment 11, a structure is adopted where a parasitic BJT is added in parallel with power control PchMOS transistors PT7 and PT8, and a parasitic BJT is added across the source of power control PchMOS transistor PT6 and the drain of PT8. It is therefore possible to lower total on resistance of the power control transistors to approximately half or less as a result of the effects of on resistance due to the parasitic BJT, and it is possible to increase the current supply performance to CMOS logic circuit at the time of operation.

Further, if the on resistance is in the order of the same as the related art, it is possible to reduce the surface area of the power control MOS transistors by approximately half or less.

In each of the embodiments described above, examples are given where power control MOS transistors are applied to overall CMOS logic circuits. However, it is also possible to apply each of the aforementioned power control MOS transistors to the necessary logic or transistors of the internal logic of the CMOS logic circuit. This example will be described in the following using Embodiments 13 to 17.

Embodiment 13

In Embodiment 13, the power control NchMOS transistor NT1 described in Embodiment 1 is connected to only circuits for critical path portions of the logic circuits.

Figure 22:
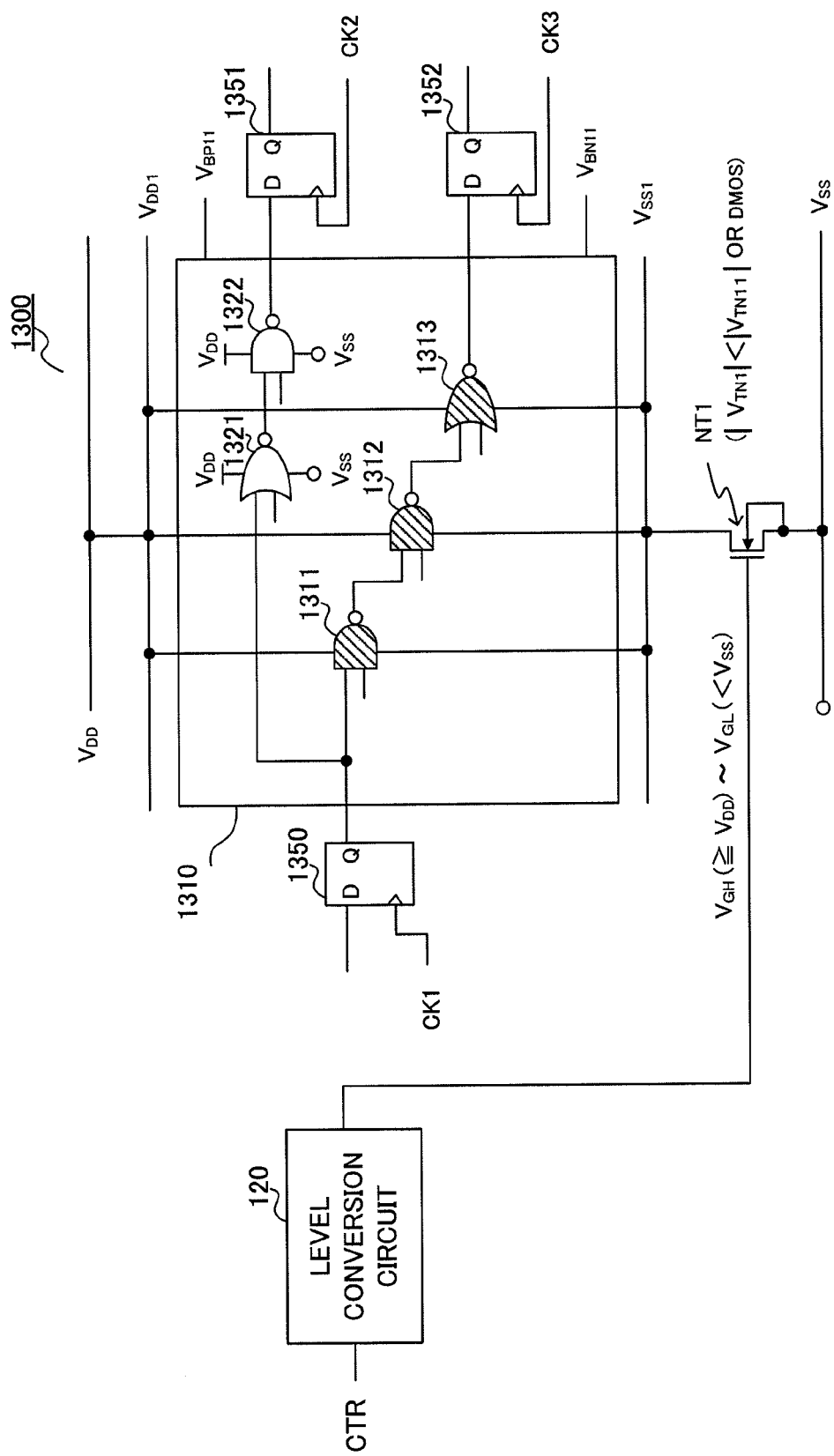
FIG. 22 is a circuit diagram showing a configuration for a semiconductor integrated circuit apparatus having a power control function according to Embodiment 13 of the present invention.

FIG. 22 is a circuit diagram showing a configuration for a semiconductor integrated circuit apparatus having a power control function according to Embodiment 13 of the present invention. Portions with the same configuration as for FIG. 6 are given the same numerals and are not described.

In FIG. 22, semiconductor integrated circuit apparatus 1300 is comprised of CMOS logic circuit 1310, first pseudo power supply line $V_{DD1}$ connected to high potential side power supply terminal sections of only circuits 1311 to 1313 (refer to hatched sections) of CMOS logic circuit 1310, second pseudo power supply line $V_{ss1}$ connected to low potential side power supply terminal sections of only circuits 1311 to 1313 of critical path sections of CMOS logic circuit 1310, power control NchMOS transistor NT1 connected across second pseudo power supply line $V_{SS1}$ and low potential side power supply line $V_{SS}$, and level conversion circuit 120 for converting a signal voltage level applied to a gate of power control NchMOS transistor NT1. Further, latch circuits 1350 to 1352 are connected to CMOS logic circuit 1310, and input and output timing of the signal is adjusted.

CMOS logic circuit 1310 is comprised of circuits 1311 to 1313 (refer to hatched sections) of the critical path portion, and circuits 1321 and 1322 where the critical path does not present a problem. Functionally, these circuits are NAND circuits, AND circuits, NOR circuits, and OR circuits, etc.

Absolute values of the threshold voltages of the MOS transistors constituting circuits 1311 to 1313 for critical path portions where timing is severe in CMOS logic circuit 1310 are set to be smaller values than the absolute values for the threshold voltages of MOS transistors constituting circuits 1321 and 1322 of portions that are not for a critical path.

According to this embodiment, at the time of standby, it is possible to cut off power supply leakage current of circuits 1311 to 1313 of critical path portions generating power supply leakage current. Leakage current at the time of standby of power control NchMOS transistor NT1 and on resistance at the time of operation are the same as for Embodiment 1 and are not described. When the power supply of only circuits 1311 to 1313 of the critical path portion is cut off, the circuit load becomes light, and CMOS logic circuit 1310 does not operate in an erroneous manner even if the on resistance of power control NchMOS transistor NT1 becomes rather high. This provides the advantage capable of setting the surface area of power control NchMOS transistor NT1 small. Further, two methods are adaptively adopted, whereby power supply is controlled by the whole of the logic circuit block, and power supply is controlled only for circuits within the logic circuit block where threshold voltage is made small and a high-speed operation is desired (with a tendency for leakage current to increase), but this embodiment may also be applied to the latter case.

Similarly, it is possible to connect power control PchMOS transistor PT1 described in Embodiment 2 of FIG. 7 to circuits 1311 to 1313 of critical path portions, of CMOS logic circuit 1310, and obtain the same results.

A case has been described where power control NchMOS transistor NT1 is connected to only circuits 1311 to 1313 of critical path portions of CMOS logic circuit 1310 but this is by no means limited to application to circuits for critical path portions, and connection and non-connection to whichever circuits or transistors is arbitrary. The same also applies for Embodiments 14 to 18 below.

Embodiment 14

In Embodiment 14, as in the case of Embodiment 13, power control NchMOS transistor NT2 described in Embodiment 3 is connected to only circuits 1311 to 1313 for critical path portions of the logic circuits.

Figure 23:
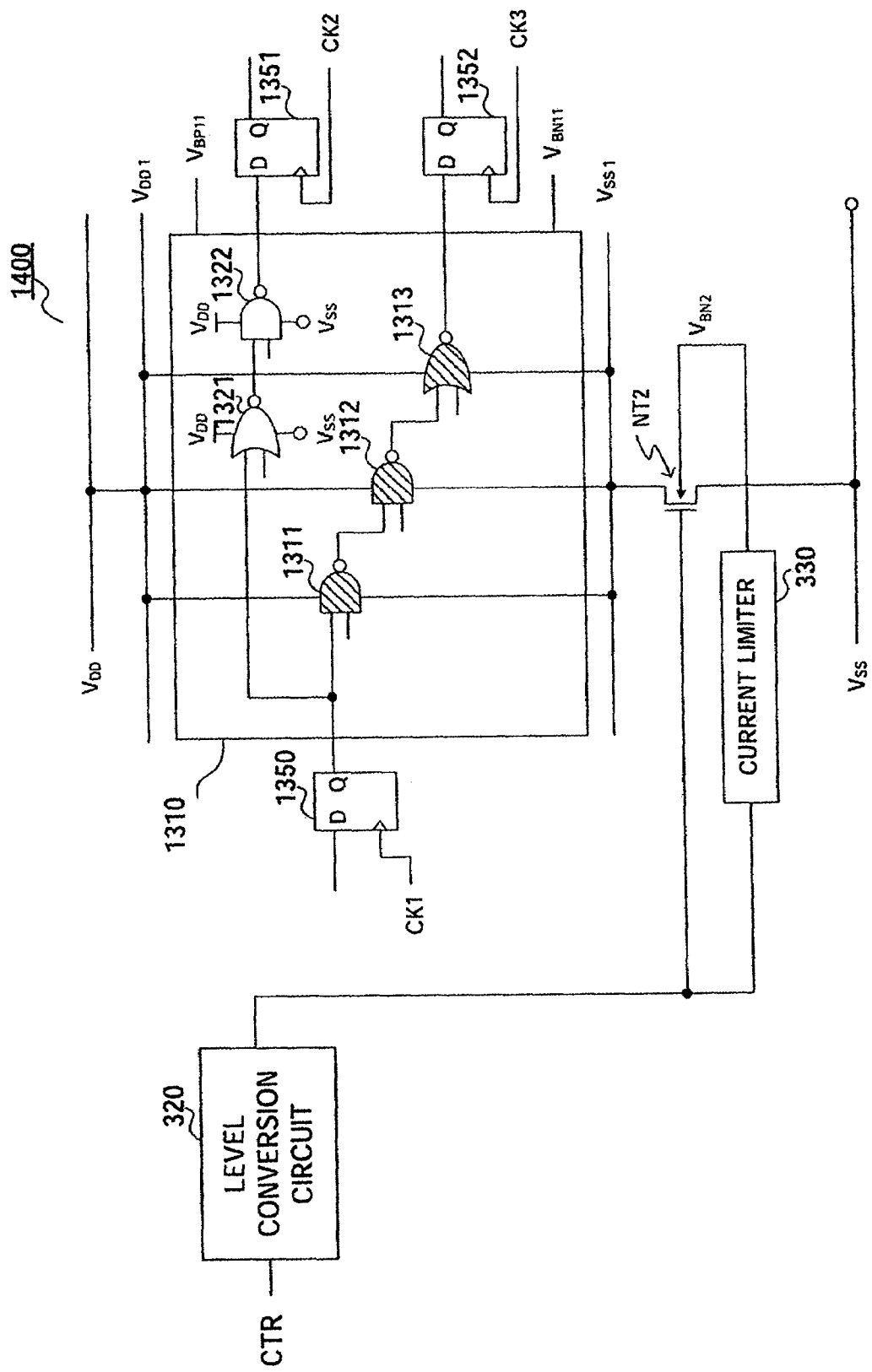
FIG. 23 is a circuit diagram showing a configuration for a semiconductor integrated circuit apparatus having a power control function according to Embodiment 14 of the present invention.

FIG. 23 is a circuit diagram showing a configuration for a semiconductor integrated circuit apparatus having a power control function according to Embodiment 14 of the present invention. Portions with the same configuration as for FIG. 6 and FIG. 22 are given the same numerals and are not described.

Absolute values of the threshold voltages of the MOS transistors constituting circuits 1311 to 1313 for critical path portions where timing is severe in CMOS logic circuit 1310 of semiconductor integrated circuit apparatus 1400 are set to be smaller values than the absolute values for the threshold voltages of the MOS transistors constituting circuits 1321 and 1322 of portions that are not for a critical path.

According to this embodiment, at the time of standby, it is possible to cut off power supply leakage current of circuits of critical path portions generating power supply leakage current. Leakage current at the time of standby of power control NchMOS transistor NT2 and on resistance at the time of operation are the same as for Embodiment 3 and are not described. When the power supply is of only circuits 1311 to 1313 of the critical path portion is cut off, the circuit load becomes light, and CMOS logic circuit 1310 does not operate in an erroneous manner even if the on resistance of power control NchMOS transistor NT2 becomes rather high. This provides the advantage capable of setting the surface area of power control NchMOS transistor NT2 small. Further, this is also appropriate for application where power supply is controlled for only circuits within the logic circuit block where the threshold voltage is made small and a high-speed operation is desired.

Similarly, it is also possible to connect power control PchMOS transistor PT2 described in Embodiment 4 to only circuits 1311 to 1313 of critical path portions, of CMOS logic circuit 1310.

Embodiment 15

In Embodiment 15, only circuits 1311 to 1313 for critical path portions of the logic circuits are connected to the power control NchMOS transistors NT3 and NT4 described in Embodiment 7.

Figure 24:
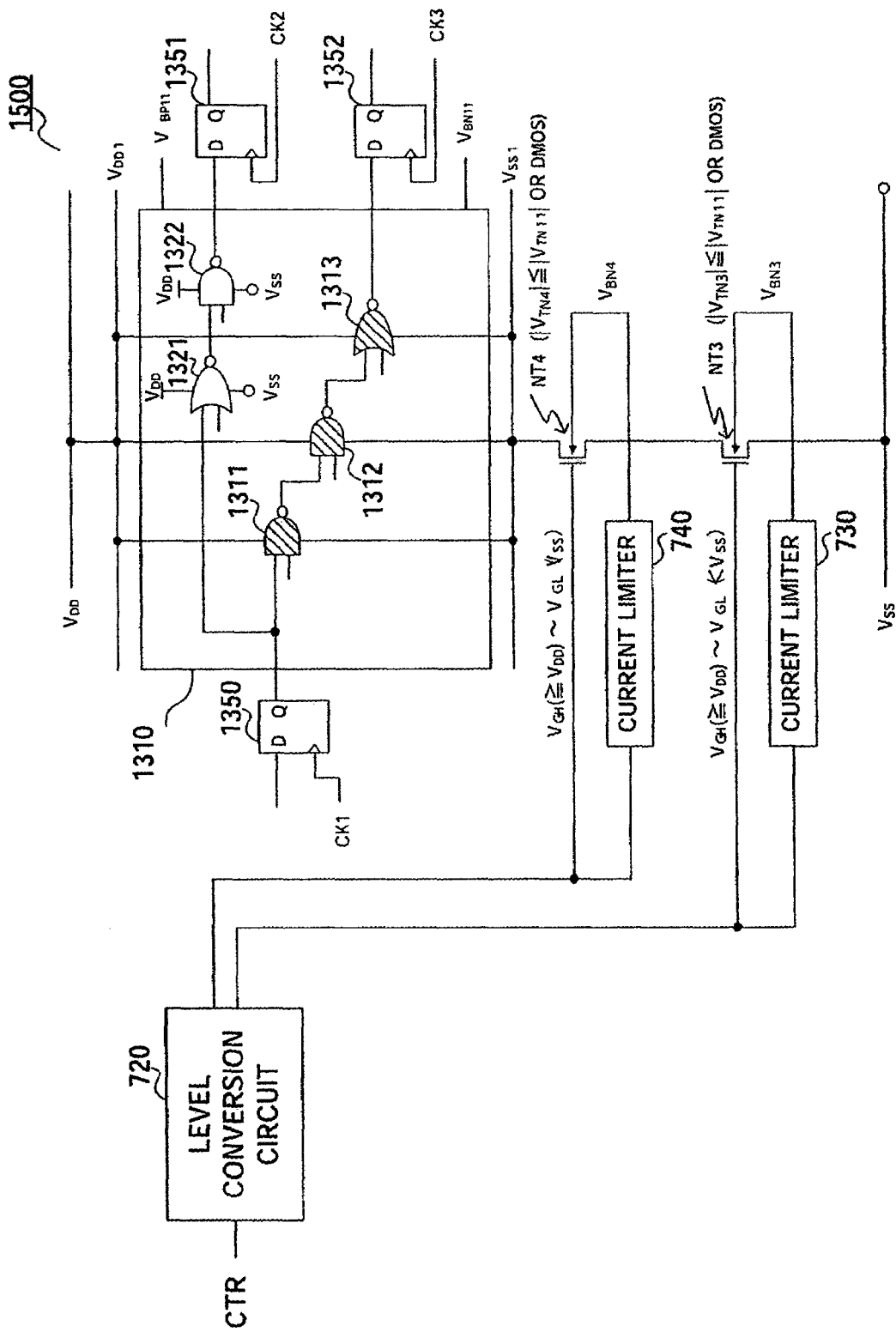
FIG. 24 is a circuit diagram showing a configuration for a semiconductor integrated circuit apparatus having a power control function according to Embodiment 15 of the present invention.

FIG. 24 is a circuit diagram showing a configuration for a semiconductor integrated circuit apparatus having a power control function according to Embodiment 15 of the present invention. Portions with the same configuration as for FIG. 13 and FIG. 23 are given the same numerals and are not described.

Absolute values of the threshold voltages of the MOS transistors constituting circuits 1311 to 1313 for critical path portions where timing is severe in CMOS logic circuit 1310 of semiconductor integrated circuit apparatus 1500 are set to be smaller values than the absolute values for the threshold voltages of the MOS transistors constituting circuits 1321 and 1322 of portions that are not for a critical path.

According to this embodiment, at the time of standby, it is possible to cut off power supply leakage current of circuits 1311 to 1313 of critical path portions generating power supply leakage current. Leakage current at the time of standby of power control NchMOS transistors NT3 and NT4 and on resistance at the time of operation are the same as for Embodiment 7 and are not described. When the power supply of only circuits 1311 to 1313 of the critical path portion is cut off, the circuit load becomes light, and CMOS logic circuit 1310 does not operate in an erroneous manner even if the on resistance of power control NchMOS transistors NT3 and NT4 becomes rather high. This provides the advantage capable of setting the surface area of power control NchMOS transistors NT3 and NT4 small.

Similarly, it is also possible to connect power control PchMOS transistors PT3 and PT4 described in Embodiment 8 to only circuits 1311 to 1313 of critical path portions, of CMOS logic circuit 1310.

Embodiment 16

In Embodiment 16, only circuits 1311 to 1313 for critical path portions of the logic circuits are connected to power control NchMOS transistors NT5 and NT6 described in Embodiment 9.

Figure 25:
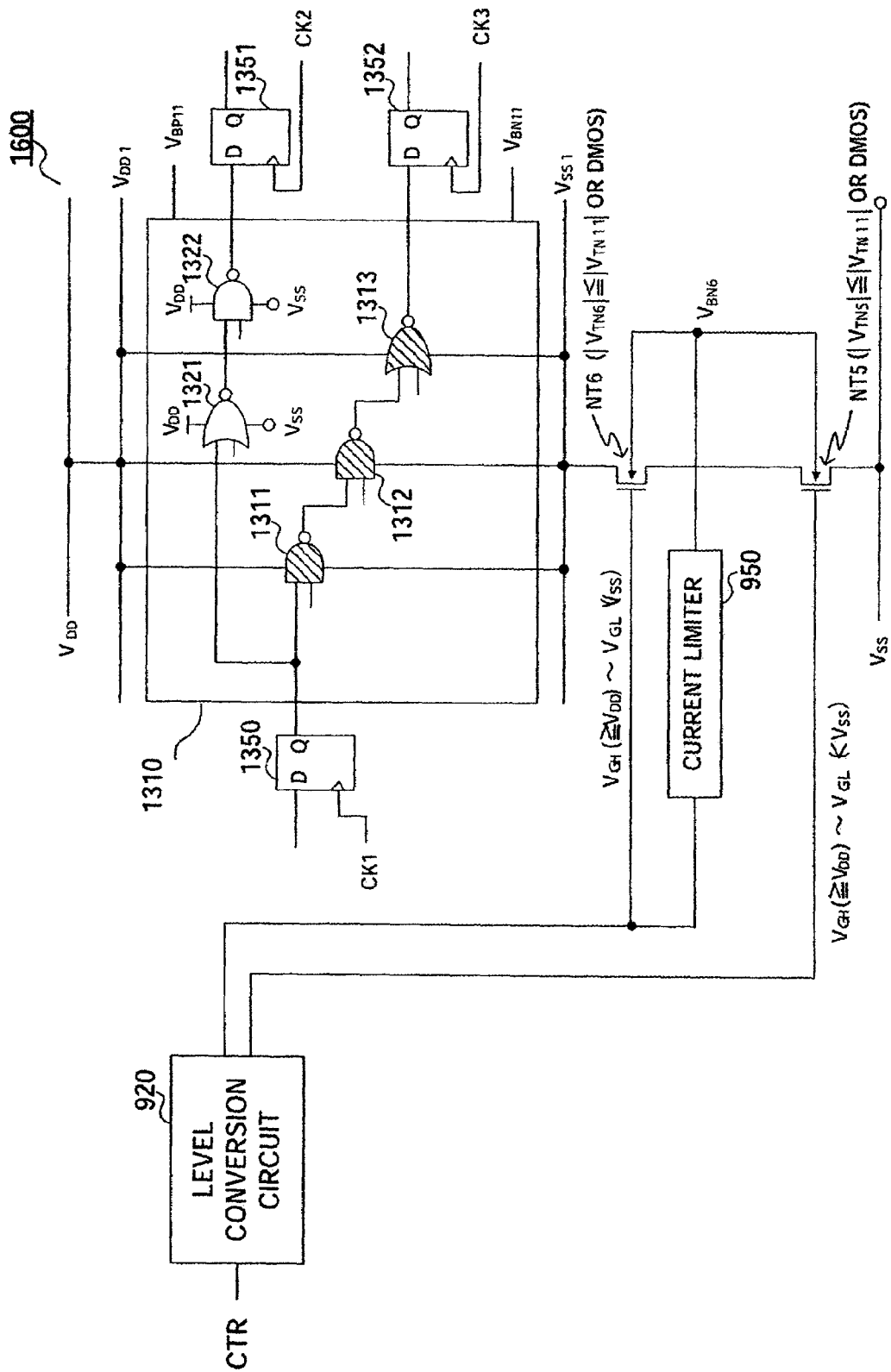
FIG. 25 is a circuit diagram showing a configuration for a semiconductor integrated circuit apparatus having a power control function according to Embodiment 16 of the present invention.

FIG. 25 is a circuit diagram showing a configuration for semiconductor integrated circuit apparatus having a power control function according to Embodiment 16 of the present invention. Portions with the same configuration as for FIG. 16 and FIG. 23 are given the same numerals and are not described.

Absolute values of the threshold voltages of the MOS transistors constituting circuits for critical path portions where timing is severe in the CMOS logic circuit 1310 of semiconductor integrated circuit apparatus 1600 are set to be smaller values than the absolute values for the threshold voltages of the MOS transistors constituting circuits of portions that are not for a critical path.

According to this embodiment, at the time of standby, it is possible to cut off power supply leakage current of circuits 1311 to 1313 of critical path portions generating power supply leakage current. Leakage current at the time of standby of NT5 and NT6, and on resistance at the time of operation are the same as for Embodiment 9 and are not described. When the power supply of only circuits 1311 to 1313 of the critical path portion is cut off, the circuit load becomes light, and CMOS logic circuit 1310 does not operate in an erroneous manner even if the on resistance of power control NchMOS transistors NT5 and NT6 becomes rather high. This provides the advantage capable of setting the surface area of power control NchMOS transistors NT5 and NT6 small.

Similarly, it is also possible to connect power control PchMOS transistors PT5 and PT6 described in Embodiment 10 to only circuits 1311 to 1313 of critical path portions, of CMOS logic circuit 1310.

Embodiment 17

In Embodiment 17, only circuits 1311 to 1313 for critical path portions of the logic circuits are connected to power control NchMOS transistors NT7 and NT8 described in Embodiment 11.

Figure 26:
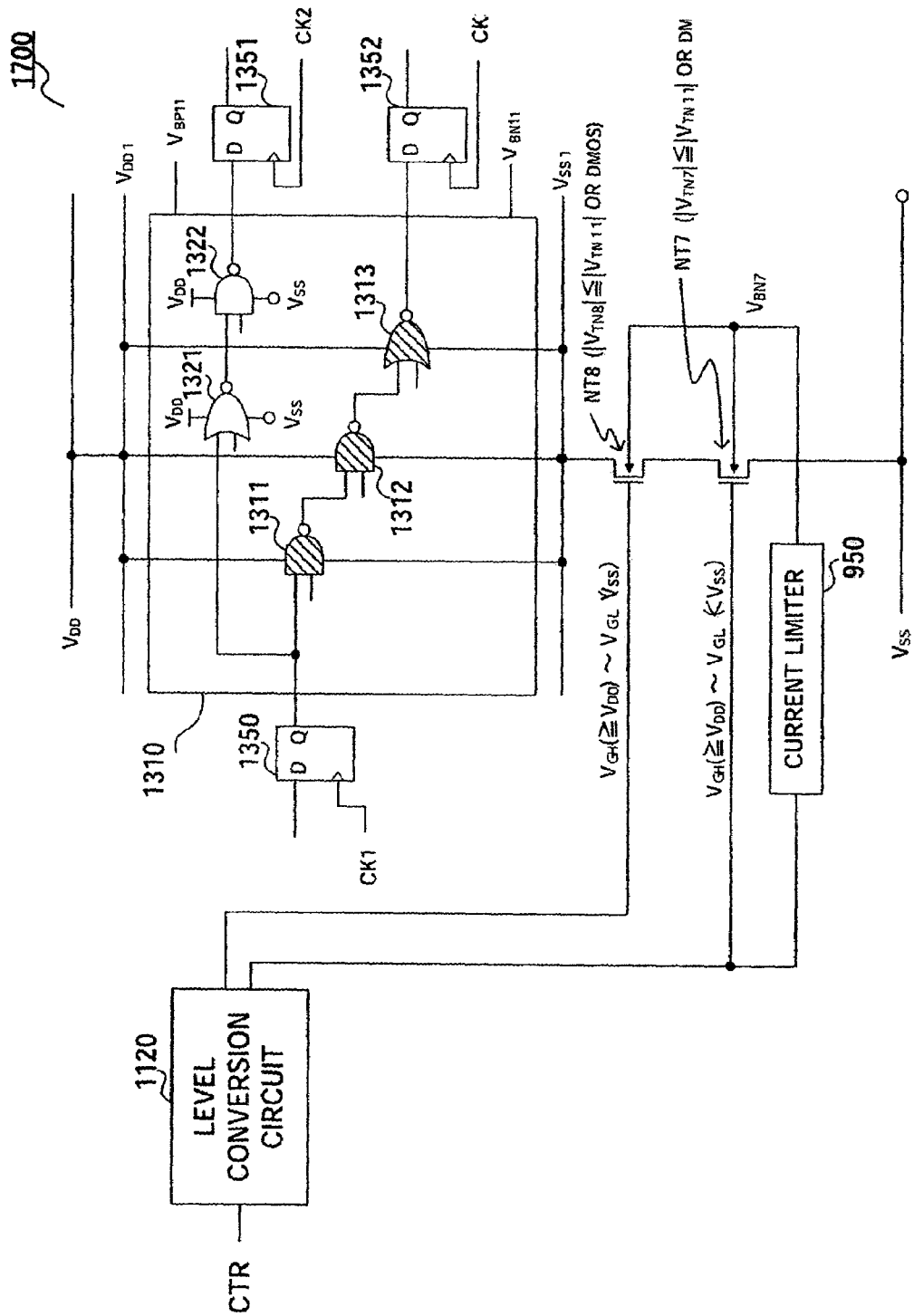
FIG. 26 is a circuit diagram showing a configuration for a semiconductor integrated circuit apparatus having a power control function according to Embodiment 17 of the present invention.

FIG. 26 is a circuit diagram showing a configuration for a semiconductor integrated circuit apparatus having a power control function according to Embodiment 17 of the present invention. Portions with the same configuration as for FIG. 19 and FIG. 23 are given the same numerals and are not described.

Absolute values of the threshold voltages of the MOS transistors constituting circuits 1311 to 1313 for critical path portions where timing is severe in CMOS logic circuit 1310 of semiconductor integrated circuit apparatus 1700 are set to be smaller values than the absolute values for the threshold voltages of the MOS transistors constituting circuits 1321 and 1322 of portions that are not for a critical path.

In Embodiment 15, at the time of standby, it is possible to cut off power supply leakage current of circuits 1311 to 1313 of critical path portions generating power supply leakage current. Leakage current at the time of standby of NT7 and NT8 and on resistance at the time of operation are the same as for Embodiment 11 and are not described. When the power supply of only circuits 1311 to 1313 of the critical path portion is cut off, the circuit load becomes light, so that CMOS logic circuit 1310 does not operate in an erroneous manner even if the on resistance of power control NchMOS transistors NT7 and NT8 becomes rather high. This provides the advantage capable of setting the surface area of power control NchMOS transistors NT7 and NT8 small.

Similarly, it is also possible to connect power control PchMOS transistors PT7 and PT8 described in Embodiment 12 to only circuits 1311 to 1313 of critical path portions, of the CMOS logic circuit.

Further, the substrates of the PchMOS transistors constituting the CMOS logic circuit in Embodiment 1 to Embodiment 17 may be common and made to be $V_{BP11}$, and similarly the substrates of the NchMOS transistors may be common and made to be $V_{BN11}$. It is then possible to reduce power consumption at the time of normal operation, namely when the power control MOS transistor is on, by controlling the substrate voltage of the CMOS logic circuit and adjusting the threshold voltage of the MOS transistor. Further, it is then possible to make the threshold voltage of the MOS transistor high by controlling the substrate voltage of the CMOS logic circuit at the time of carrying out IDDQ (quiescent power supply current) testing of the CMOS logic circuit that is item 1 of an LSI load test. As a result, original power supply leakage current of the CMOS logic circuit becomes low and leakage current due to defect failure occurring in the structure can be precisely measured.

Embodiment 18

Figure 27:
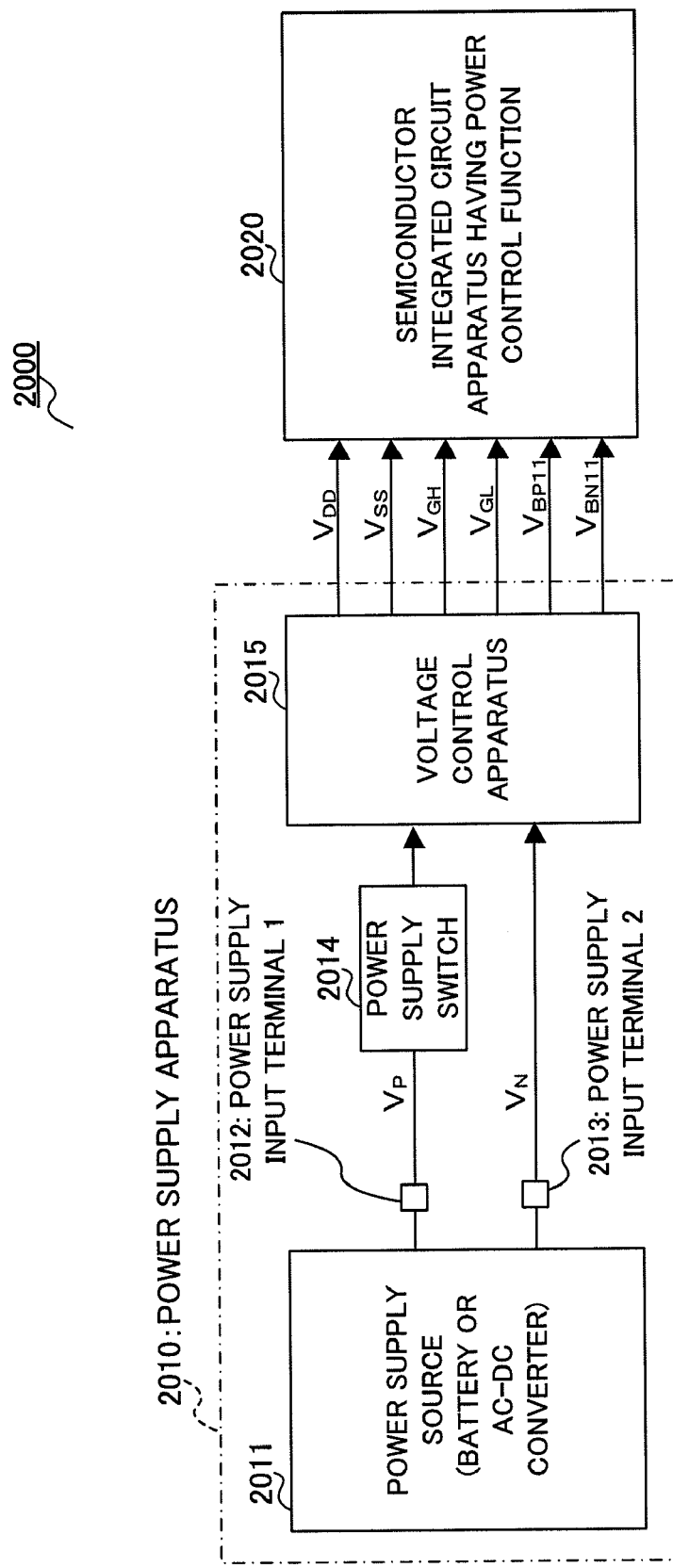
FIG. 27 is a block view showing a configuration of an electronic apparatus having a power control function according to Embodiment 18 of the present invention.

FIG. 27 is a block view showing a configuration of an electronic apparatus having a power control function according to Embodiment 18 of the present invention.

In FIG. 27, electronic apparatus 2000 is comprised of power supply apparatus 2010, and semiconductor integrated circuit apparatus 2020 having a power control function.

Semiconductor integrated circuit apparatus 2020 having a power control function may be applied to any of semiconductor integrated circuit apparatuses 100 to 1700 having the power control functions described in each of Embodiment 1 to Embodiment 17.

Power supply apparatus 2010 is comprised of power supply source 2011 composed of a battery and AC-DC converter etc., power supply input terminals 2012 and 2013 for inputting a power supply voltage generated by power supply source 2011, power supply switch 2014 for switching the power supply voltage on and off, and voltage control apparatus 2015 for converting or generating the power supply voltage of power supply source 2011 to a voltage required by semiconductor integrated circuit apparatus 2020 having a power control function and supplying the voltage.

Electronic apparatus 2000 using a battery as power supply source is extremely effective as portable equipment used over a long period of time.

It is also anticipated that the effect of consuming less power will be sufficient even for electronic apparatus employing an AC-DC converter as power supply source.

The preferred embodiments of the present invention described above are merely given as example, and by no means limit the scope of the present invention.

Further, in the embodiments the name "semiconductor integrated circuit apparatus" is used for ease of description but naturally this may also be "threshold voltage control circuit apparatus", "semiconductor integrated circuit", or "logic circuit" etc.

Moreover, the type, number, and method of connecting each circuit section constituting the semiconductor integrated circuit apparatus such as, for example, level conversion circuits etc. are by no means limited to the embodiments described above.

Each of the embodiments can be carried out for each of a plurality of circuit blocks the substrate may be electrically divided up into.

Further, implementation is possible not only for MOS transistors configured on a normal silicon substrate, but also for semiconductor integrated circuits configured using MOS transistors of an SOI (Silicon On Insulator) structure.

For example, when power control NchMOS transistors NT2 to NT8 and power control PchMOS transistors PT2 to PT8 are formed on a silicon substrate of an SOI structure rather than just the MOS transistors being constructed on a normal silicon substrate, there is the advantage that latch up does not occur. Implementation is also possible for a semiconductor integrated circuit where all of the MOS transistors are formed on an SOI structure silicon substrate.

In the above, according to the present invention, it is possible to substantially reduce on resistance from that of the related art while suppressing leakage current at the time of cut-off of a power control MOS transistor. Therefore, not only is current supplied to CMOS logic circuit 110 in a stable manner, but also it is possible to reduce the size of power control MOS transistor NT1, and it is possible to effectively reduce power consumed by the semiconductor integrated circuit and electronic apparatus and reduce chip size of the semiconductor integrated circuit.

The semiconductor integrated circuit apparatus and electronic apparatus controlling the threshold voltage of a transistor according to the present invention is capable of carrying out power control using power control MOS transistors capable of substantially lower on resistance from that of the related art. This means that current supplied to the logic circuit can be made stable and chip size can be reduced. This is extremely effective as means for implementing both reduction of power consumed by the semiconductor integrated circuit and electronic apparatus and miniaturization of chip size of the semiconductor integrated circuit at the same time.

The present invention is not limited to the above described embodiments, and various variations and modifications may be possible without departing from the scope of the present invention.

This application is based on the Japanese Patent Application No. 2006-025124 filed on Feb. 1, 2006, entire content of which is expressly incorporated by reference herein.

What is claimed is:

1. A semiconductor integrated circuit apparatus, comprising:
    a logic circuit having a plurality of NchMIS transistors and a plurality of PchMIS transistors;
    a first pseudo power supply line connected to a high potential side power supply terminal section of the logic circuit;
    a second pseudo power supply line connected to a low potential side power supply terminal section of the logic circuit; and
    a first NchMIS transistor formed on a silicon substrate of a silicon-on-insulator structure, wherein:
        the second pseudo power supply line is connected to a drain of the first NchMIS transistor;

a low potential side power supply line is connected to a source of the first NchMIS transistor;

a gate of the first NchMIS transistor and the substrate are connected through a current limiter;

an absolute value of a threshold voltage of the first NchMIS transistor does not exceed an absolute value of a threshold voltage of the MIS transistors of the logic circuit, or the first NchMIS transistor is a depletion type; and a low level of a signal applied to the gate of the first NchMIS transistor is lower than a potential of the low potential side power supply line.

2. The semiconductor integrated circuit apparatus according to claim 1, wherein the current limiter comprises a bi-directional source follower.

3. The semiconductor integrated circuit apparatus according to claim 1, wherein the current limiter comprises an analogue switch.

4. An electronic apparatus comprising a semiconductor integrated circuit apparatus having a power supply apparatus and a power control function of the power supply apparatus, wherein the semiconductor integrated circuit apparatus comprises a semiconductor integrated circuit apparatus according to claim 1.

5. A semiconductor integrated circuit apparatus, comprising:

a logic circuit having a plurality of NchMIS transistors and a plurality of PchMIS transistors;

a first pseudo power supply line coupled to a high potential side power supply terminal section of the logic circuit;

a second pseudo power supply line coupled to a low potential side power supply terminal section of the logic circuit; and a first PchMIS transistor formed on a silicon substrate of a silicon-on-insulator structure, wherein:

the first pseudo power supply line is connected to a drain of the first PchMIS transistor;

a high potential side power supply line is connected to a source of the first PchMIS transistor;

a gate of the first PchMIS transistor and the substrate are connected through a current limiter;

an absolute value of a threshold voltage of the first PchMIS transistor does not exceed an absolute value of a threshold voltage of the MIS transistors of the logic circuit, or the first PchMIS transistor is a depletion type; and a high level of a signal applied to the gate of the first PchMIS transistor is higher than a potential of the high potential side power supply line.

6. The semiconductor integrated circuit apparatus according to claim 5, wherein the current limiter comprises a bi-directional source follower.

7. The semiconductor integrated circuit apparatus according to claim 5, wherein the current limiter comprises an analogue switch.

8. A semiconductor integrated circuit apparatus, comprising:

a logic circuit having a plurality of NchMIS transistors and a plurality of PchMIS transistors;

a first pseudo power supply line coupled to a high potential side power supply terminal section of the logic circuit;

a second pseudo power supply line coupled to a low potential side power supply terminal section of the logic circuit;

a first NchMIS transistor which has a threshold voltage which does not exceed an absolute value of a threshold voltage of the MIS transistors of the logic circuit or which is a depletion type; and a second NchMIS transistor which has a threshold voltage which does not exceed the absolute value of the threshold voltage of the MIS transistors of the logic circuit or which is the depletion type, wherein:

a source of the second NchMIS transistor is connected to a drain of the first NchMIS transistor;

the second pseudo power supply line is connected to a drain of the second NchMIS transistor;

a low potential side power supply line is connected to a source of the first NchMIS transistor; and a substrate of the first NchMIS transistor and a substrate of the second NchMIS transistor are coupled to a gate of the second NchMIS transistor.

9. The semiconductor integrated circuit apparatus according to claim 8, wherein the substrate of the first NchMIS transistor and the substrate of the second NchMIS transistor are connected to the gate of the second NchMIS transistor through a current limiter.

10. A semiconductor integrated circuit apparatus, comprising:

a logic circuit having a plurality of NchMIS transistors and a plurality of PchMIS transistors;

a first pseudo power supply line connected to a high potential side power supply terminal section of the logic circuit;

a second pseudo power supply line connected to a low potential side power supply terminal section of the logic circuit;

a first NchMIS transistor which has a threshold voltage which does not exceed an absolute value of a threshold voltage of the MIS transistors of the logic circuit or which is a depletion type; and a second NchMIS transistor which has a threshold voltage which does not exceed the absolute value of the threshold voltage of the MIS transistors of the logic circuit or which is the depletion type, wherein:

a source of the second NchMIS transistor is connected to a drain of the first NchMIS transistor;

the second pseudo power supply line is connected to a drain of the second NchMIS transistor;

a low potential side power supply line is connected to a source of the first NchMIS transistor; and a substrate of the first NchMIS transistor and a substrate of the second NchMIS transistor are coupled to a gate of the first NchMIS transistor.

11. The semiconductor integrated circuit apparatus according to claim 10, wherein the substrate of the first NchMIS transistor and the substrate of the second NchMIS transistor are connected to the gate of the first NchMIS transistor through a current limiter.

12. A semiconductor integrated circuit apparatus, comprising:

a logic circuit having a plurality of NchMIS transistors and a plurality of PchMIS transistors;

a first pseudo power supply line connected to a high potential side power supply terminal section of the logic circuit;

a second pseudo power supply line connected to a low potential side power supply terminal section of the logic circuit;

a first PchMIS transistor which has a threshold voltage which does not exceed an absolute value of a threshold voltage of the MIS transistors of the logic circuit or which is a depletion type; and a second PchMIS transistor which has a threshold voltage which does not exceed the absolute value of the threshold voltage of the MIS transistors of the logic circuit or which is the depletion type, wherein
- a source of the second PchMIS transistor is connected to a drain of the first PchMIS transistor;
- the first pseudo power supply line is connected to a drain of the second PchMIS transistor;
- a high potential side power supply line is connected to a source of the first PchMIS transistor; and
- a substrate of the first PchMIS transistor and a substrate of the second PchMIS transistor are coupled to a gate of the second PchMIS transistor.

13. The semiconductor integrated circuit apparatus according to claim 12, wherein the substrate of the first PchMIS transistor and the substrate of the second PchMIS transistor are connected to the gate of the second PchMIS transistor through a current limiter.

14. A semiconductor integrated circuit apparatus, comprising:
- a logic circuit having a plurality of NchMIS transistors and a plurality of PchMIS transistors;
- a first pseudo power supply line connected to a high potential side power supply terminal section of the logic circuit;
- a second pseudo power supply line connected to a low potential side power supply terminal section of the logic circuit;
- a first PchMIS transistor which has a threshold voltage which does not exceed an absolute value of a threshold voltage of the MIS transistors of the logic circuit or which is a depletion type; and
- a second PchMIS transistor which has a threshold voltage which does not exceed the absolute value of the threshold voltage of the MIS transistors of the logic circuit or which is the depletion type, wherein:
    - a source of the second PchMIS transistor is connected to a drain of the first PchMIS transistor;
    - the first pseudo power supply line is connected to a drain of the second PchMIS transistor;
    - a high potential side power supply line is connected to a source of the first PchMIS transistor; and
    - a substrate of the first PchMIS transistor and a substrate of the second PchMIS transistor are coupled to a gate of the first PchMIS transistor.

15. The semiconductor integrated circuit apparatus according to claim 14, wherein the substrate of the first PchMIS transistor and the substrate of the second PchMIS transistor are connected to the gate of the first PchMIS transistor through a current limiter.

* * * * *